(12) United States Patent
Sato et al.

(10) Patent No.: US 6,576,392 B1
(45) Date of Patent: Jun. 10, 2003

(54) POSITIVE PHOTORESIST COMPOSITION

(75) Inventors: Kenichiro Sato, Shizuoka (JP);
Kunihiko Kodama, Shizuoka (JP);
Toshiaki Aoai, Shizuoka (JP);
Hidekazu Ohashi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/456,827

(22) Filed: Dec. 6, 1999

(30) Foreign Application Priority Data

| Dec. 7, 1996 | (JP) | ............................................ 10-347193 |
| Feb. 8, 1999 | (JP) | ............................................ 11-030209 |
| Aug. 26, 1999 | (JP) | ............................................ 11-240600 |

(51) Int. Cl.$^7$ ............................ G03C 1/73; G03F 7/039
(52) U.S. Cl. ............................ 430/270.1; 430/287.1; 430/281.1; 430/326; 430/905; 430/910; 430/914
(58) Field of Search ............................ 430/270.1, 287.1, 430/281.1, 326, 905, 910, 914

(56) References Cited

U.S. PATENT DOCUMENTS

| 6,017,677 A | * | 1/2000 | Maemoto et al. | ......... 430/270.1 |
| 6,017,683 A | * | 1/2000 | Endo et al. | ................. 430/326 |
| 6,103,447 A | * | 8/2000 | Chen et al. | ............... 430/270.1 |

FOREIGN PATENT DOCUMENTS

| EP | 0856773 A1 | * | 8/1998 |
| JP | 63-26653 | * | 2/1988 |
| JP | 08248561 | * | 9/1996 |
| JP | 10-221852 | * | 8/1998 |
| JP | 11202483 | * | 7/1999 |

OTHER PUBLICATIONS

Chemical Abstract 109:101905—English Abstract for Japanese Document JP63–26653 Published on Feb. 4, 1988.*
Chemical Abstract 129:223253—English Abstract for Japanese Document JP 10–221852 Published on Aug. 21, 1998.*
Ohfuji Et Al, *Characterization of Chemically Amplified Resists With "Acid Amplifier" for 193 nm Lithography*, Journal of Photopolymer Science & Technology, vol. 10, No. 4 (1997) p. 551–558, Apr. 1997.*
Maemoto. Chemical Abstract #131:151745—English Abstract of JP 11202483 Published Jul. 30, 1999.*
Ohfuji Et Al "Lithography Performance of ArF Chemically Amplified Resists Using Acid Amplifier", Polymeric Materials: Science & Engineering (1999), 81, p. 64, Aug. 1999.*
Ichimura "Acid Proliferation Reactions & Their Application" Polymeric Materials: Science & Engineering (1997), 77, p. 434–435, Sep. 1997.*
Arimitsu Et Al "Trioxane Derivative as an Acid Amplifier Exhibiting a Non–Linear Organic Reaction" Chemistry Letters (1998), 8, p. 823–824, Nov. 1998.*
Ichimura Chemical Abstract #126: 24861—English Abstract of JP08248561 Published on Sep. 27, 1996.*
Ichimura JPO Abstract #JP408248561A—English Abstract of JP 08248561 Published on Sep. 27, 1996.*

* cited by examiner

*Primary Examiner*—Janet Baxter
*Assistant Examiner*—Sin J. Lee
(74) *Attorney, Agent, or Firm*—Sughrue Mion, PLLC

(57) ABSTRACT

A positive photoresist composition comprising a photo-acid gererator and a specific resin. The resin contains repeating units each having a group represented by formula (I):

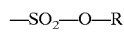

—$SO_2$—O—R wherein R represents an optionally substituted alkyl, cycloalkyl, or alkenyl group and comes to have an increased rate of dissolution in an alkaline developing solution by the action of an acid, or contains alkali-soluble groups protected by partial structures containing an alicyclic hydrocarbon and represented by at least one of formulae (pI) to (pVI) defined in the specification and which decomposes by the action of an acid to have enhanced solubility in an alkali. The latter is used in combination with a compound which decomposes by the action of an acid to generate a sulfonic acid.

5 Claims, No Drawings

POSITIVE PHOTORESIST COMPOSITION

FIELD OF THE INVENTION

The present invention relates to positive photoresist compositions for use in ultramicrolithographic processes such as the production of ULSIs and high-capacity microchips and in other photofabrication processes. More particularly, this invention relates to a positive photoresist composition excellent in sensitivity and defocus latitude depended on line pitch, and to a positive photoresist composition capable of forming an ultrafine pattern with a light having a wavelength falling within the far ultraviolet region, including an excimer laser light, and especially with a light having a wavelength of 250 nm or shorter.

BACKGROUND OF THE INVENTION

The degree of integration in integrated circuits is increasing more and more in recent years, and it has become necessary to form an ultrafine pattern having a line width of 0.5 µm or smaller in the production of semiconductor substrates for ULSIs and the like. With this trend, the exposure light wavelengths of light sources for use in photolithography are increasingly becoming shorter so as to meet the above requirement, and the use of excimer laser lights having shorter wavelengths among far ultraviolet rays (e.g., XeCl, KrF, and ArF excimer laser) has now come to be investigated.

For use in lithographic pattern formation in the above wavelength region are chemical amplification type resists.

In general, the chemical amplification type resists are roughly divided into three groups, i.e., 2-component systems, 2.5-component systems, and 3-component systems. The 2-component systems comprise a combination of a compound which generates an acid upon photodecomposition (hereinafter, referred to as a photo-acid generator) and a binder resin. This binder resin has, within its molecule, groups which decompose by the action of an acid to enhance the solubility of the resin in an alkaline developing solution (the groups being referred to also as acid-decomposable groups). The 2.5-component systems comprise such a 2-component system which further contains a low-molecular compound having an acid-decomposable group. The 3-component systems comprise a photo-acid generator, an alkali-soluble resin, and the above low-molecular compound.

Although the chemical amplification type resists are suitable for use as photoresists for irradiation with ultraviolet or far ultraviolet rays, they need to meet property requirements for use with a particular light source among ultraviolet and far ultraviolet light sources. For example, a resist composition has been proposed which contains a polymer obtained by incorporating acetal or ketal groups as protective groups into a hydroxystyrene polymer and showing reduced light absorption especially in the case of using 248-nm KrF excimer laser light. Examples thereof are given in, e.g., JP-A-2-141636 (the term "JP-A" as used herein means an "unexamined published Japanese patent application"), JP-A-2-19847, JP-A-4-219757, and JP-A-5-281745. Furthermore, a similar composition in which a t-butoxycarbonyloxy or p-tetrahydropyranyloxy group is used as an acid-decomposable group is proposed in, e.g., JP-A-2-209977, JP-A-3-206458, and JP-A-2-19847.

Although these prior art compositions are suitable for irradiation with 248-nm KrF excimer laser light, they show insufficient sensitivity when an ArF excimer laser is used as a light source because they essentially have still too high an absorbance. These compositions further have drawbacks accompanying the low sensitivity, such as deteriorations in resolution, focus latitude, pattern profile, etc. Those prior art compositions hence still necessitate improvements in many points.

Consequently, resins having an alicyclic hydrocarbon structure incorporated therein for imparting dry-etching resistance have been proposed for use in a photoresist composition for an ArF light source. However, this type of system has exceedingly high hydrophobicity as an adverse influence of the incorporation of an alicyclic hydrocarbon structure. As a result, the resist containing this resin has drawbacks, for example, that the resist is difficult to develop with an aqueous tetramethylammonium hydroxide (hereinafter referred to as TMAH) solution, which has conventionally been used extensively as a resist developing solution, and the resist may peel off the substrate during development.

Measures have been investigated in coping with such a hydrophobized resist. Among these is to incorporate an organic solvent such as isopropyl alcohol into a developing solution. Although such measures give some degree of results, several problems still remain unsolved, e.g., the fear of resist film swelling and process troublesomeness.

With respect to an approach based on resist improvement, many attempts have been made to compensate for various hydrophobic alicyclic hydrocarbon structures by incorporating hydrophilic groups.

Another photoresist composition for an ArF light source has been proposed, which comprises a combination of a (meth)acrylic resin even more reduced in absorption than partially hydroxylated styrene resins and a compound generating an acid upon light irradiation. This type of composition is disclosed in, e.g., JP-A-7-199467 and JP-A-7-252324. In particular, JP-A-6-289615 discloses a resin containing acrylic acid units each having an organic group having a tertiary carbon atom and bonded to one of the oxygen atoms of the carboxyl group through an ester bond.

JP-A-7-234511 discloses an acid-decomposable resin containing repeating units derived from an acrylic or fumaric ester. However, the resist composition disclosed therein is insufficient in pattern profile, adhesion to substrates, etc. Thus, none of the prior art photoresist compositions proposed so far for use with an ArF light source has satisfactory performances.

Furthermore, resins in which an alicyclic hydrocarbon structure has been incorporated for the purpose of imparting dry-etching resistance have been proposed.

In JP-A-9-73173, JP-A-9-90637, and JP-A-10-161313 is described a resist material containing an acid-responsive compound which contains both alkali-soluble groups each protected by a structure containing an alicyclic group and structural units which are made alkali-soluble upon elimination of the protective groups by the action of an acid.

Although various resins having acid-decomposable groups have been investigated for use in chemical amplification type photoresists as described above, there has been room for improvement.

For example, recent devices tend to contain various patterns and resists are hence required to have various performances. One of these is defocus latitude depended on line pitch. A device has an area where lines are densely disposed and a pattern area where lines are separated by spaces wider than the lines, and further has isolated lines. It is, therefore, important to resolve various lines with high reproducibility. However, to reproduce such various lines is not always easy because of optical factors, and how to attain the desired reproduction based on an improvement in resist has remained unclear.

As described above, the resins containing acid-decomposable groups which are used in photoresists for exposure to far ultraviolet rays generally contain alicyclic hydrocarbon groups in the molecule besides the acid-decomposable groups. Because of this, these resins are hydrophobic and have problems attributable thereto. Although investigations have been made on various means such as the above-described ones for mitigating these problems, the techniques described above are still insufficient in many points (especially developability), and further improvements are desired.

On the other hand, JP-A-8-248561 discloses a photoreactive composition comprising a photo-acid generator and an acid-multiplying agent which generates an acid by the action of the acid generated by the photo-acid generator. Furthermore, *SPIE.*, Vol.3049, pp.76–82 discloses a chemical amplification type resist for 193-nm lithography which comprises an acid generator, a partially protected alicyclic polymer, and an acid-multiplying agent.

However, the above-described techniques for which a light source emitting a far ultraviolet short-wavelength light, e.g., an ArF excimer laser (193 nm), is used still have room for improvement in developability. Specifically, there have been problems of the occurrence of development defects and the generation of a scum (development residue). In addition, there has been room for improvement with respect to the problem of poor line width reproducibility, i.e., the problem that the line width varies with pattern formation.

SUMMARY OF THE INVENTION

Accordingly, a first object of the present invention is to eliminate the problems of techniques for improving the performances inherent in the above-described microphotofabrication in which a far ultraviolet light, especially KrF or ArF excimer laser light, is used. Specifically, the first object is to provide a positive photoresist composition having high sensitivity, reduced in the generation of a development residue, and having excellent defocus latitude depended on line pitch (dense vias).

A second object of the present invention is to eliminate the problems of techniques for improving the performances inherent in the above-described microphotofabrication in which a far ultraviolet light, especially ArF excimer laser light, is used. Specifically, the second object is to provide a positive photoresist composition which is free from the problems of development defect occurrence and scum generation during development. A further object of the present invention is to provide a positive photoresist composition for far ultraviolet exposure which has excellent reproductivity of line width.

The present inventors made intensive investigations on constituent materials for chemical amplification type positive resist fluids. As a result, they have found that the first object of the present invention is accomplished by using a specific acid-decomposable resin. The present invention has been achieved based on this finding.

Namely, the first object is accomplished with the following constitution (first aspect).

(1) A positive photoresist composition comprising a compound which generates an acid upon irradiation with actinic rays or a radiation and a resin which contains repeating units each having a group represented by general formula (I):

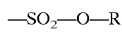

(wherein R represents an optionally substituted alkyl, cycloalkyl, or alkenyl group) and comes to have an increased rate of dissolution in an alkaline developing solution by the action of an acid.

The present inventors made intensive investigations on constituent materials for chemical amplification type positive resist compositions. As a result, they have found that the second object of the present invention is accomplished by using a specific acid-decomposable resin and specific additives. The present invention has been achieved based on this finding.

Namely, the second object is accomplished with the following constitutions (second aspect).

(2) A positive photoresist composition for far ultraviolet exposure which comprises a compound which generates an acid upon irradiation with actinic rays or a radiation, a resin which contains alkali-soluble groups protected by partial structures containing an alicyclic hydrocarbon and represented by at least one of the following general formulae (pI) to (pVI) and which decomposes by the action of an acid to have enhanced solubility in an alkali, and a compound which decomposes by the action of an acid to generate a sulfonic acid:

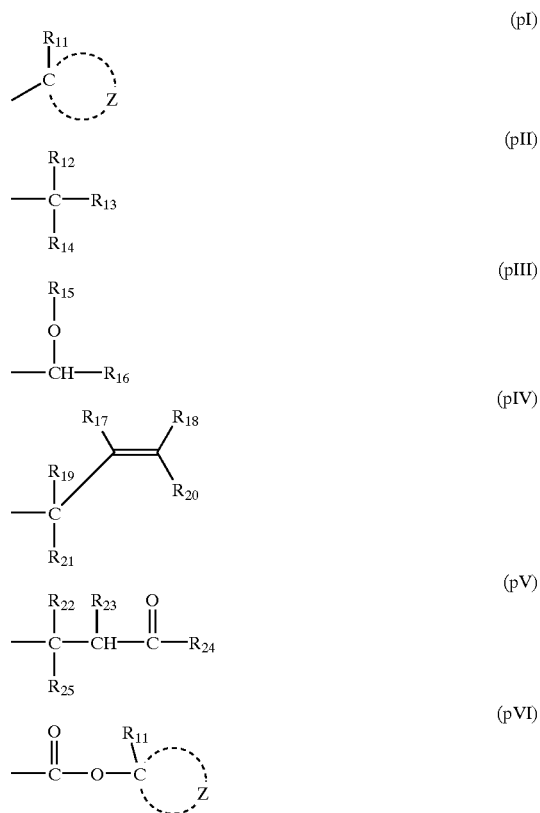

wherein $R_{11}$ represents a methyl, ethyl, n-propyl, isopropyl, n-butyl, isobutyl, or sec-butyl group; Z represents a group of atoms necessary for forming an alicyclic hydrocarbon group in cooperation with the carbon atom;

$R_{12}$ to $R_{16}$, each independently represents a linear or branched alkyl group having 1 to 4 carbon atoms or an alicyclic hydrocarbon group, provided that at least one of $R_{12}$ to $R_{14}$ or either of $R_{15}$ and $R_{16}$ represents an alicyclic hydrocarbon group;

$R_{17}$ to $R_{21}$, each independently represents a hydrogen atom, a linear or branched alkyl group having 1 to 4 carbon atoms, or an alicyclic hydrocarbon group, provided that at least one of $R_{17}$ to $R_{21}$, represents an alicyclic hydrocarbon group and either of $R_{19}$ and $R_{21}$, represents a linear or branched alkyl group having 1 to 4 carbon atoms or an alicyclic hydrocarbon group; and $R_{22}$ to $R_{25}$ each independently represents a linear or branched alkyl group having 1 to 4 carbon atoms or an alicyclic hydrocarbon group, provided that at least one of $R_{22}$ to $R_{25}$ represents an alicyclic hydrocarbon group.

(3) The positive photoresist composition for far ultraviolet exposure as described in (2) above which contains a fluorine and/or silicon surfactant.

DETAILED DESCRIPTION OF THE INVENTION

The compounds used in the present invention will be explained below in detail.

Resin which contains repeating units having group represented by general formula (I) and comes to have increased rate of dissolution in alkaline developing solution by the action of acid (referred to also as acid-decomposable resin):

The acid-decomposable resin for use in the present invention is characterized by containing repeating units each having at least one group represented by —$SO_2$—O—R.

Examples of the alkyl group represented by R in general formula (I) include linear or branched alkyl groups, which may have one or more substituents. The linear or branched alkyl groups are preferably those having 1 to 12 carbon atoms, more preferably those having 1 to 10 carbon atoms. The most preferred examples thereof include methyl, ethyl, propyl, isopropyl, n-butyl, isobutyl, sec-butyl, pentyl, neopentyl, hexyl, heptyl, octyl, nonyl, and decyl.

Examples of the cycloalkyl group include those which have 3 to 30 carbon atoms and may contain one or more heteroatoms such as oxygen and nitrogen atoms. Specific examples thereof include cyclopropyl, cyclopentyl, cyclohexyl, adamantyl, norbornyl, bornyl, tricyclodecanyl, dicyclopentenyl, norbornane-epoxy, menthyl, isomenthyl, neomenthyl, tetracyclododecanyl, steroid residues, tetrahydropyranyl, and morpholino.

Examples of the alkenyl group include those which have 2 to 6 carbon atoms and may have one or more substituents. Specific examples thereof include vinyl, propenyl, allyl, butenyl, pentenyl, hexenyl, cyclopentenyl, cyclohexenyl, 3-oxocyclohexenyl, 3-oxocyclopentenyl, and 3-oxoindenyl. Of these alkenyl groups, the cyclic groups each may contain one or more oxygen atoms.

Examples of the substituents for the alkyl, cycloalkyl, and alkenyl groups described above include carboxyl, acyloxy groups, cyano, alkyl groups, substituted alkyl groups, aryl groups, halogen atoms, hydroxyl, alkoxy groups, acetylamido, alkoxycarbonyl groups, and acyl groups. Examples of the alkyl groups include lower alkyl groups such as methyl, ethyl, propyl, isopropyl, butyl, cyclopropyl, cyclobutyl, and cyclopentyl. Examples of the substituents of the substituted alkyl groups include hydroxyl, halogen atoms, and alkoxy groups. Examples of the alkoxy groups or of the alkoxy groups of the alkoxycarbonyl groups include those having 1 to 4 carbon atoms, such as methoxy, ethoxy, propoxy, and butoxy. Examples of the acyl groups include acetyl and propionyl. Examples of the acyloxy groups include acetoxy. Examples of the halogen atoms include chlorine, bromine, fluorine, and iodine atoms. Examples of the aryl groups include optionally substituted aryl groups having 6 to 10 carbon atoms, such as phenyl, tolyl, and naphthyl.

Preferred examples of the repeating units having a group represented by general formula (I) include repeating units represented by the following general formula (II).

General Formula (II)

In general formula (II), $R_1$ to $R_3$ each independently represents a hydrogen atom, an alkyl group, a halogen atom, a cyano group, or a group represented by —$SO_2$—O—R. Z represents a single bond, an ether group, an ester group, an amide group, an alkylene group, a substituted alkylene group, an arylene group, a substituted arylene group, or a bivalent group composed of two or more of these. R has the same meaning as defined above.

Examples of the alkyl group and the halogen atom both represented by $R_1$ to $R_3$ include the same alkyl groups and halogen atoms as those enumerated hereinabove as examples of R.

Examples of the alkylene group and the substituted alkylene group include groups represented by the following formula.

In the above formula, $R_a$ and $R_b$ may be the same or different and each represents a hydrogen atom, an alkyl group, a substituted alkyl group, a halogen atom, hydroxyl, or an alkoxy group. Preferred examples of the alkyl group include lower alkyl groups such as methyl, ethyl, propyl, isopropyl, and butyl. More preferably, the alkyl group is selected from methyl, ethyl, propyl, and isopropyl. Examples of the substituent(s) of the substituted alkyl group include hydroxyl, halogen atoms, and alkoxy groups. Examples of the alkoxy groups include those having 1 to 4 carbon atoms, such as methoxy, ethoxy, propoxy, and butoxy. Examples of the halogen atoms include chlorine, bromine, fluorine, and iodine atoms. Furthermore, r represents an integer of 1 to 10.

Examples of the arylene group and of the arylene group of the substituted arylene group include those having 6 to 10 carbon atoms, such as phenylene, tolylene, and naphthylene. Examples of the substituent(s) of the substituted arylene group include carboxyl, acyloxy groups, cyano, alkyl groups, substituted alkyl groups, halogen atoms, hydroxyl, alkoxy groups, acetylamido, alkoxycarbonyl groups, and acyl groups. Examples of the alkyl groups include lower alkyl groups such as methyl, ethyl, propyl, isopropyl, butyl, cyclopropyl, cyclobutyl, and cyclopentyl. Examples of the substituents of the substituted alkyl groups include hydroxyl, halogen atoms, and alkoxy groups. Examples of the alkoxy groups include those having 1 to 4 carbon atoms, such as methoxy, ethoxy, propoxy, and butoxy. Examples of the acyloxy groups include acetoxy. Examples of the halogen atoms include chlorine, bromine, fluorine, and iodine atoms.

Specific examples of monomers corresponding to the repeating units having a group represented by general formula (I) are shown below. However, the contents of the present invention should not be construed as being limited by these examples.

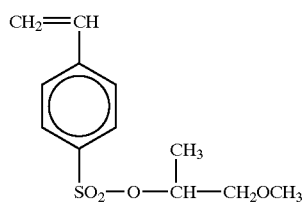

(1)

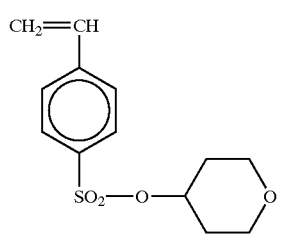

(2)

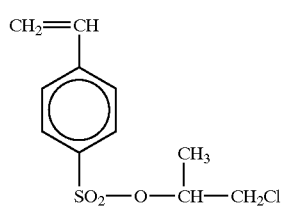

(3)

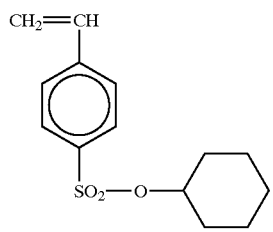

(4)

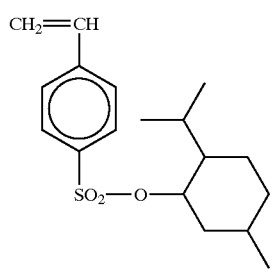

(5)

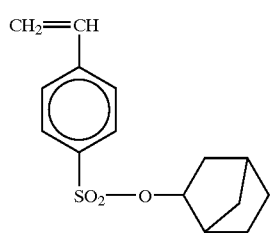

(6)

-continued

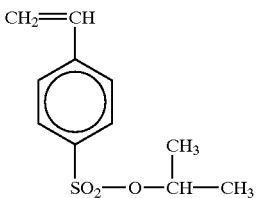

(7)

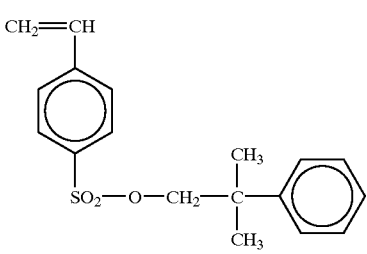

(8)

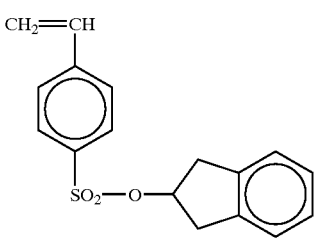

(9)

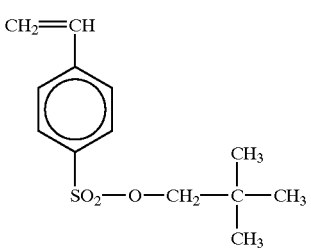

(10)

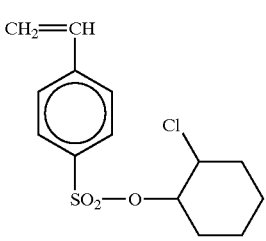

(11)

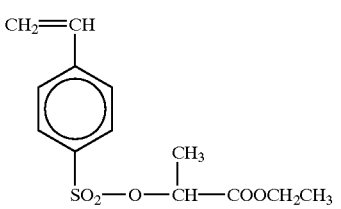

(12)

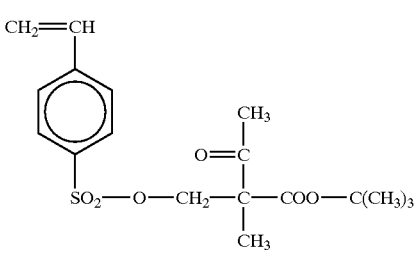

(13)

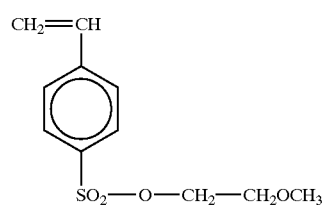 (14)
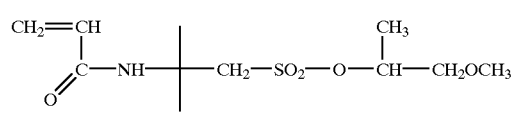 (15)
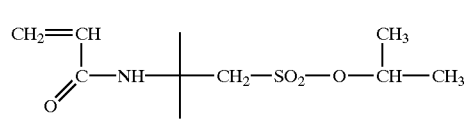 (16)
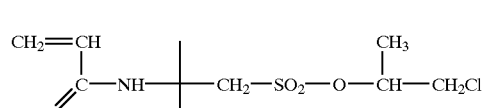 (17)
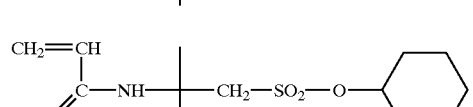 (18)
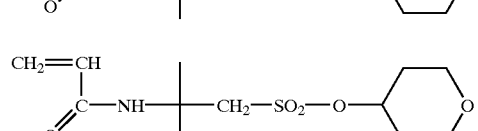 (19)
 (20)
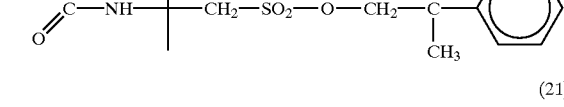 (21)
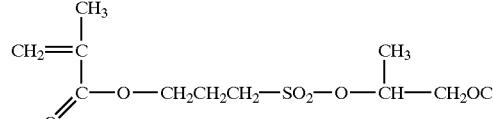 (22)
 (23)
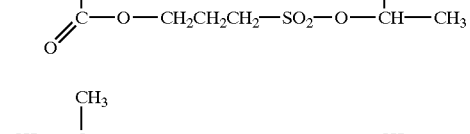 (24)
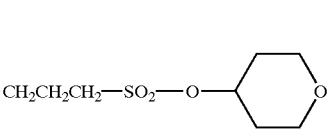 (25)
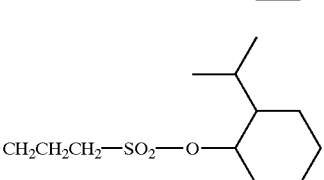 (26)
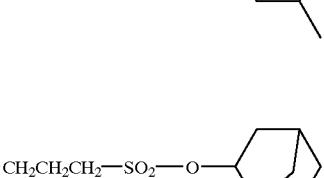 (27)
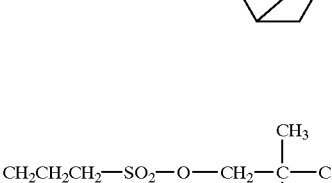 (28)
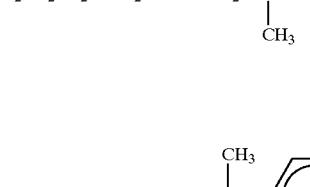 (29)
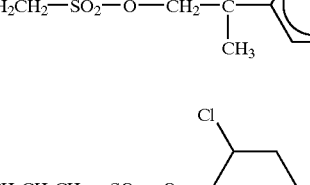 (30)
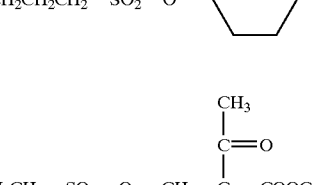 (31)
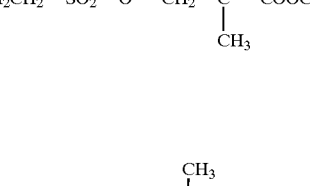 (32)
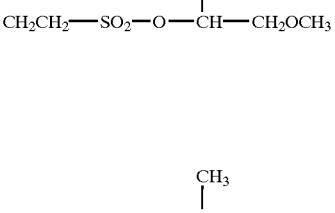 (33)

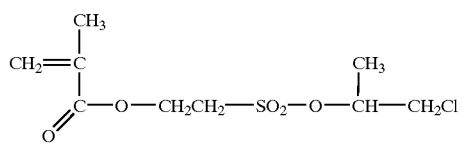
(34)
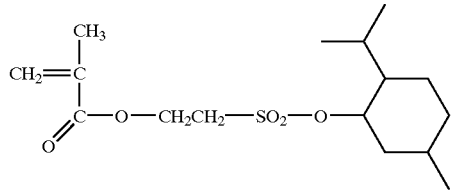
(35)
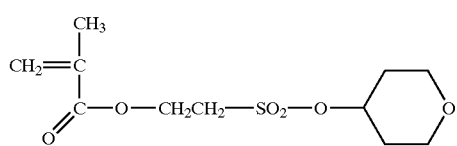
(36)
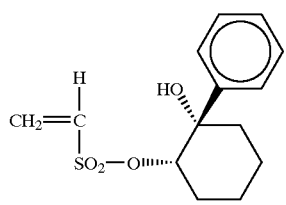
(37)
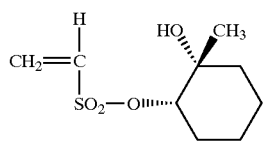
(38)
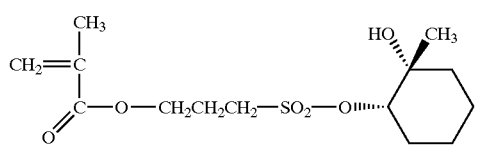
(39)
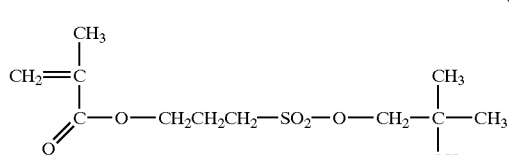
(40)
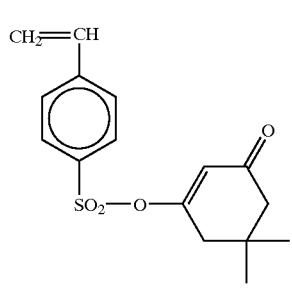
(41)
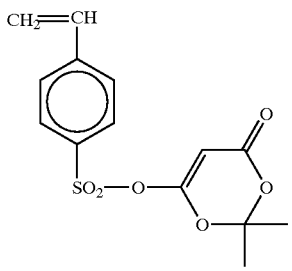
(42)
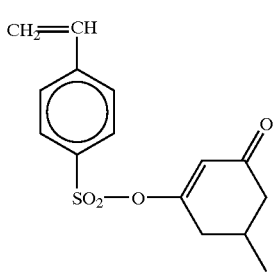
(43)
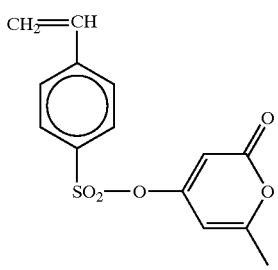
(44)
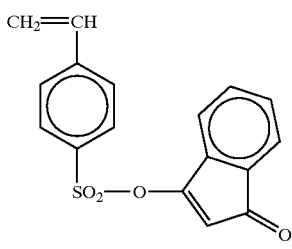
(45)
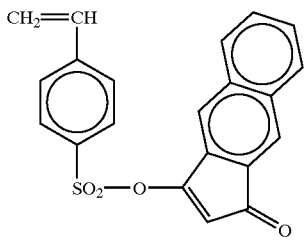
(46)
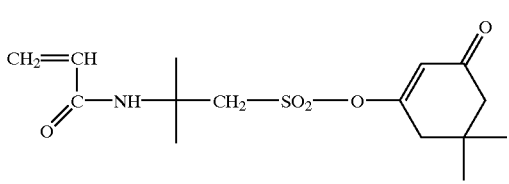
(47)

(48) 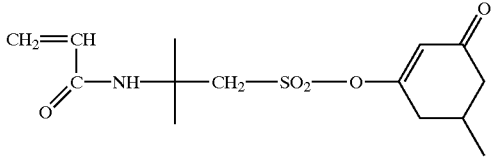

(49) 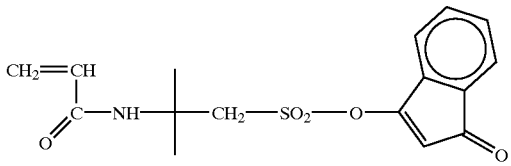

(50) 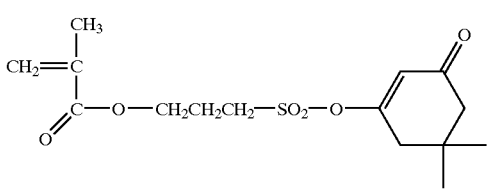

(51) 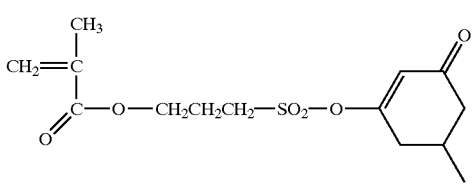

(52) 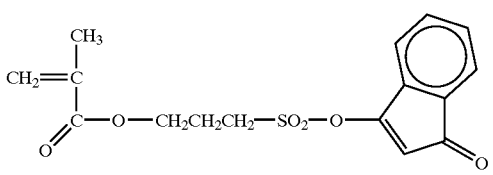

(53) 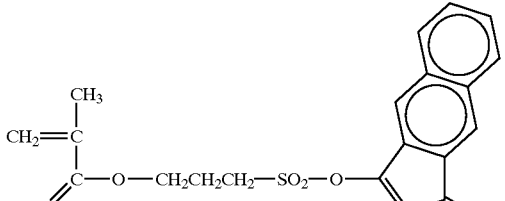

(54) 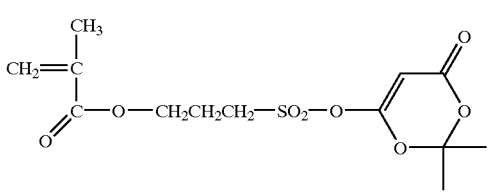

(55) 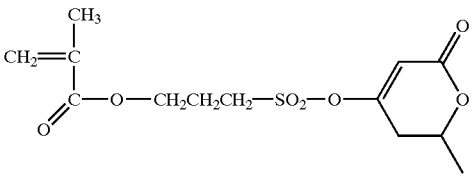

The acid-decomposable resin according to the present invention contains groups which decompose by the action of an acid (referred to also as acid-decomposable groups).

Examples of the groups decomposing by the action of an acid include groups represented by —COOA⁰ and groups represented by —O—B⁰. Examples of groups containing these groups include groups represented by —R⁰—COOA⁰ or —Ar—O—B⁰.

In the above formulae, A⁰ represents —C($R^{01}$) ($R^{02}$) ($R^{03}$) —Si ($R^{01}$) ($R^{02}$) ($R^{03}$), —C($R^{04}$) ($R^{05}$)—O—$R^{06}$, or a lactone group. B⁰ represents —A⁰ or —CO—O—A⁰.

$R^{01}$, $R^{02}$, $R^{03}$, $R^{04}$, and $R^{05}$ may be the same or different and each represents a hydrogen atom, an alkyl group, a cycloalkyl group, an alkenyl group, an aralkyl group, or an aryl group, and $R^{06}$ represents an alkyl group, a cycloalkyl group, or an aryl group. However, at least two of $R^{01}$ to $R^{03}$ are not hydrogen atoms; and two of $R^{01}$ to $R^{03}$ may be bonded to each other to form a ring, and two of $R^{04}$ to $R^{06}$ may be bonded to each other to form a ring. R⁰ represents a single bond or an optionally substituted, aliphatic or aromatic hydrocarbon group having a valence of 2 or higher, and —Ar— represents an optionally substituted, mono- or polycyclic aromatic group having a valence of 2 or higher.

Preferred examples of the alkyl group include those having 1 to 4 carbon atoms, such as methyl, ethyl, propyl, n-butyl, sec-butyl, and t-butyl. Preferred examples of the cycloalkyl group include those having 3 to 10 carbon atoms, such as cyclopropyl, cyclobutyl, cyclohexyl, and adamantyl. Preferred examples of the alkenyl group include those having 2 to 4 carbon atoms, such as vinyl, propenyl, allyl, and butenyl. Preferred examples of the aryl group include those having 6 to 14 carbon atoms, such as phenyl, xylyl, toluyl, cumenyl, naphthyl, and anthracenyl. Examples of the cycloalkyl group include those having 3 to 30 carbon atoms, such as cyclopropyl, cyclopentyl, cyclohexyl, adamantyl, norbornyl, bornyl, tricyclodecanyl, dicyclopentenyl, norbornane-epoxy, menthyl, isomenthyl, neomenthyl, tetracyclododecanyl, and steroid residues. Examples of the aralkyl group include optionally substituted aralkyl groups having 7 to 20 carbon atoms, such as benzyl, phenethyl, and cumyl.

Examples of the substituents include hydroxyl, halogen atoms (fluorine, chlorine, bromine, and iodine), nitro, cyano, the aforementioned alkyl groups, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cyanamyl, and valeryl, acyloxy groups such as butyryloxy, the aforementioned alkenyl groups, alkenyloxy groups such as vinyloxy, propenyloxy, allyloxy, and butenyloxy, the aforementioned aryl groups, aryloxy groups such as phenoxy, and aryloxycarbonyl groups such as benzoyloxy.

Examples of the lactone group include groups of the following structures.

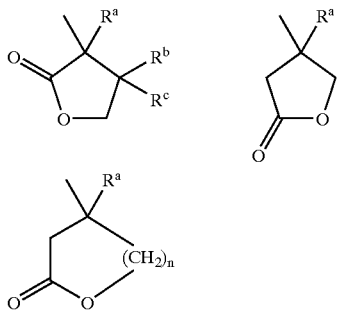

In the above formulae, $R^a$, $R^b$, and $R^c$ each independently represents a hydrogen atom or an alkyl group having 1 to 4 carbon atoms, and n represents an integer of 2 to 4.

In the case where an ArF excimer laser is used as a light source for exposure, the groups decomposing by the action of an acid are preferably ones represented by —C(=C)—$X_1$,—$R_0$. In this formula, examples of $R_0$ include tertiary alkyl groups such as t-butyl and t-amyl, isobornyl, 1-alkoxyethyl groups such as 1-ethoxyethyl, 1-butoxyethyl, 1-isobutoxyethyl, and 1-cyclohexyloxyethyl, alkoxymethyl groups such as 1-methoxymethyl and 1-ethoxymethyl, tetrahydropyranyl, tetrahydrofuranyl, trialkylsilyl groups, 3-oxocyclohexyl, and the aforementioned lactone groups. $X_1$ represents an oxygen atom or a sulfur atom, and is preferably an oxygen atom.

The resin containing at least groups represented by general formula (I) and acid-decomposable groups needs to have a structure suitably selected according to the exposure light to be used.

In the case where the exposure light is KrF excimer laser light having a wavelength of 248 nm, the resin preferably contains repeating units having a benzene ring, such as styrene-derived repeating units, as major repeating units.

In the case where the exposure light is ArF excimer laser light having a wavelength of 193 nm, repeating units having a benzene ring cannot be used. In this case, the resin is preferably one containing alicyclic structures, as major repeating units, in the backbone or side chains thereof.

The acid-decomposable resin suitable for use in the case where the exposure light is KrF excimer laser light having a wavelength of 248 nm will be explained below.

The base resin having, in side chains thereof, repeating units represented by general formula (I) and groups decomposing by the action of an acid is an alkali-soluble resin which has —OH or —COOH groups, preferably —$R^0$—COOH or —$A_r$—OH groups, in side chains thereof.

Such alkali-soluble resins have an alkali dissolution rate, as measured with 0.26.1 N tetramethylammonium hydroxide (TMAH) at 23° C., of preferably 170 A/sec or higher, more preferably 330 A/sec or higher (wherein A means angstrom).

Preferred from the standpoint of attaining a rectangular profile are alkali-soluble resins which highly transmit far ultraviolet and excimer laser lights. Specifically, alkali-soluble resins whose 1 μm-thick films have a transmittance at 248 nm of 35% or higher are preferred.

Especially preferred alkali-soluble resins from these standpoints are poly (o-, m-, or p-hydroxystyrene) copolymers of these hydroxystyrenes, hydrogenated poly (hydroxystyrene)s, halogen- or alkyl-substituted poly (hydroxystyrene)s, partially O-alkylated or O-acylated poly (hydroxystyrene)s, styrene/hydroxystyrene copolymers, α-methylstyrene/hydroxystyrene copolymers, and hydrogenated novolak resins.

The resin having acid-decomposable groups for use in the present invention can be obtained by reacting an alkali-soluble resin with a precursor of acid-decomposable groups or by copolymerizing a monomer giving an alkali-soluble resin and having an acid-decomposable group bonded thereto with any of various monomers, as disclosed in European Patent 254,853, JP-A-2-25850, JP-A-3-223860, JP-A-4-251259, etc.

Specific examples of the acid-decomposable resin suitable for use in the case where the exposure light is KrF excimer laser light having a wave length of 248 nm are shown below. However, the resin for use in the present invention should not be construed as being limited to these examples.

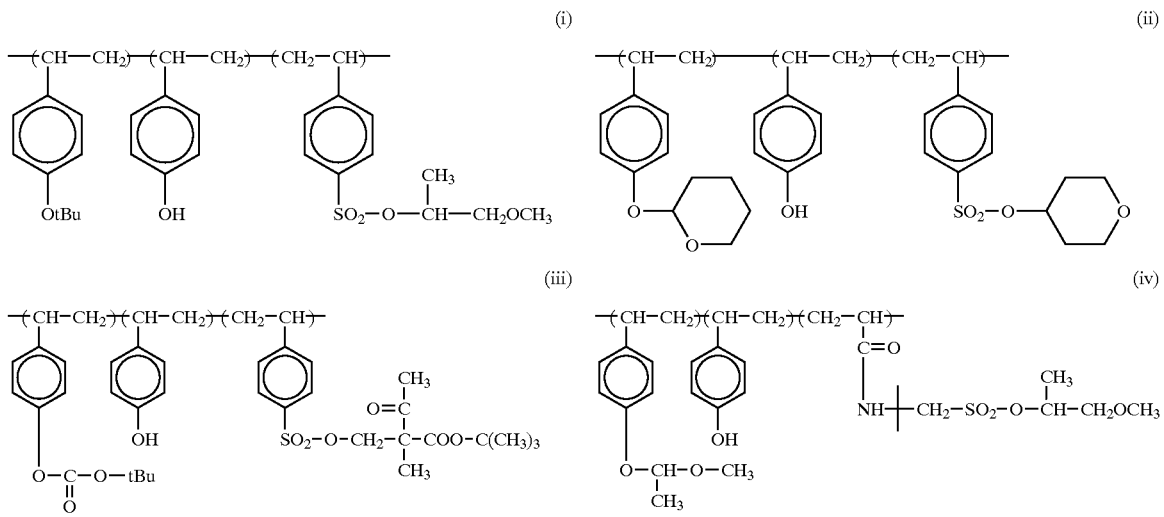

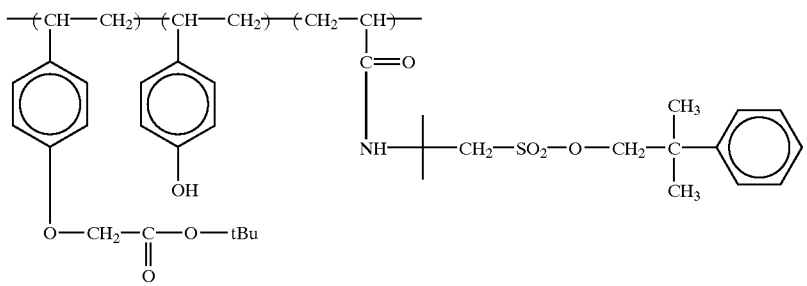
(v)
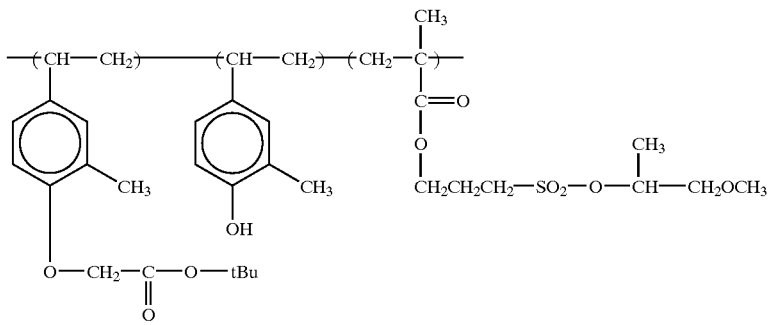
(vi)
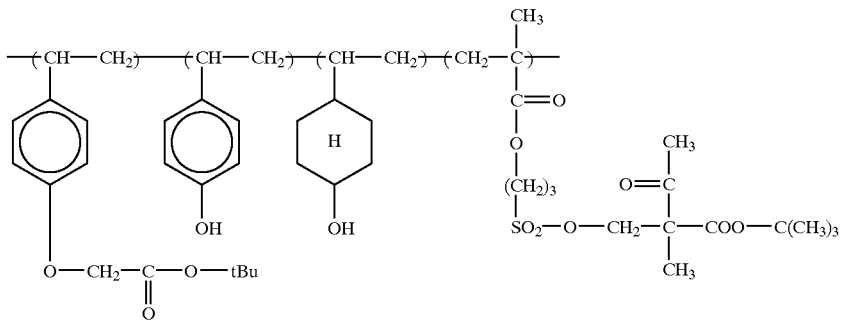
(vii)
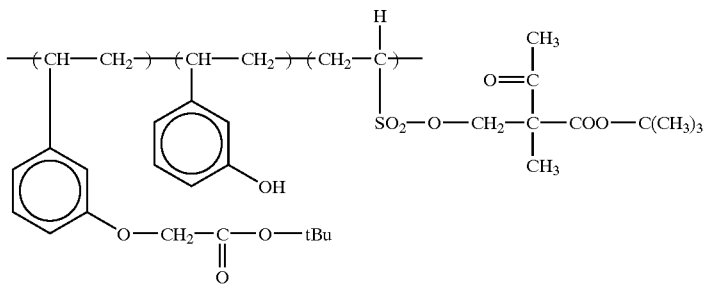
(viii)
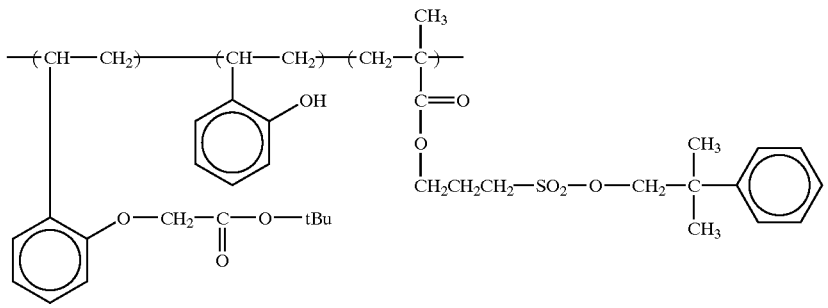
(ix)

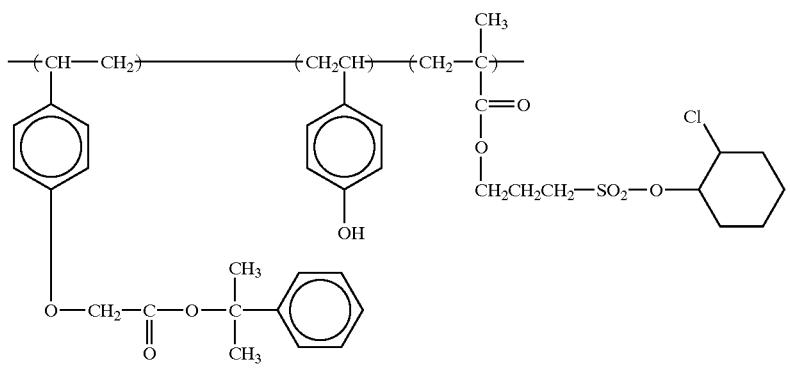
(x)
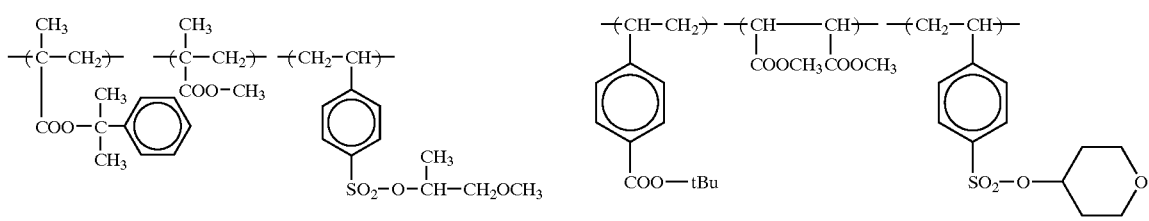
(xi) (xii)
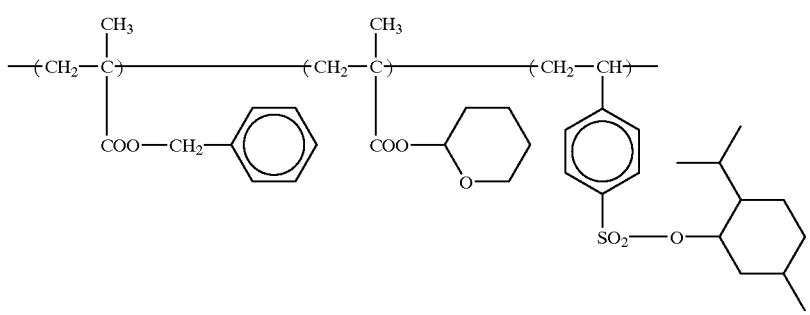
(xiii)
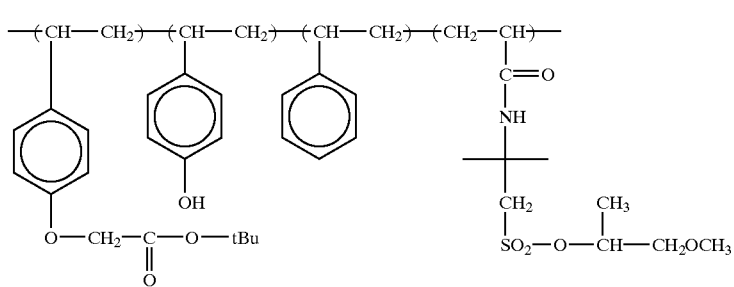
(xiv)
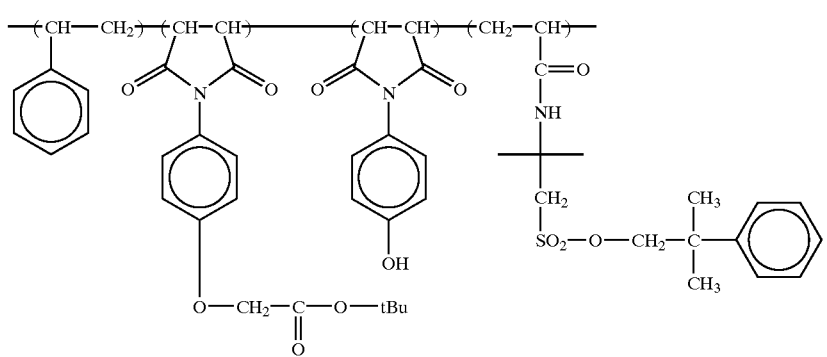
(xv)

-continued
(xvi)
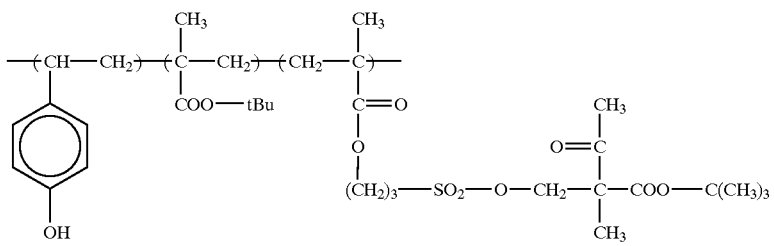
(xvii)
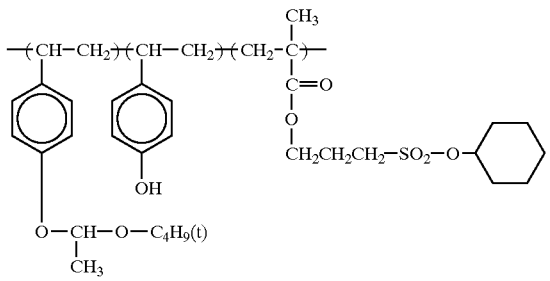
(xviii)
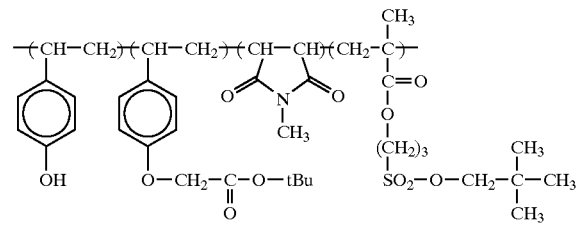
(xix)
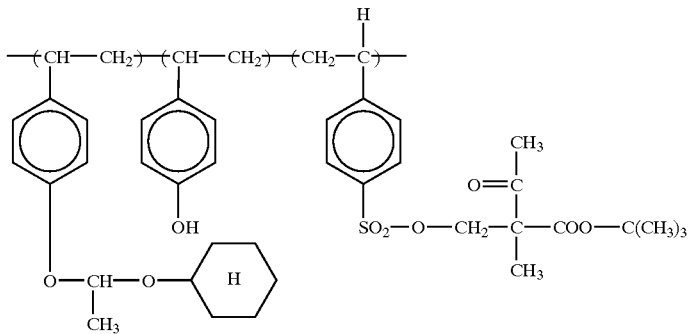
(xx)
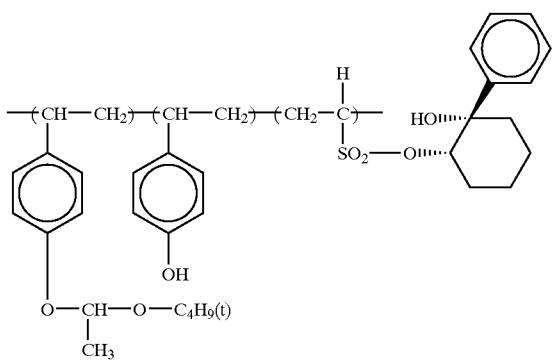
(XXI)
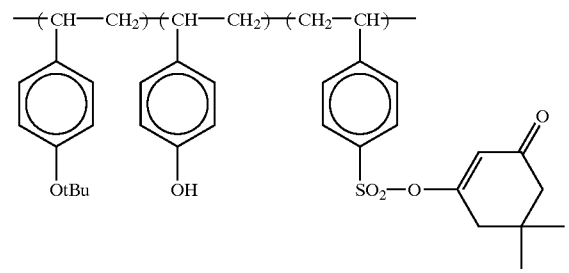
(XXII)
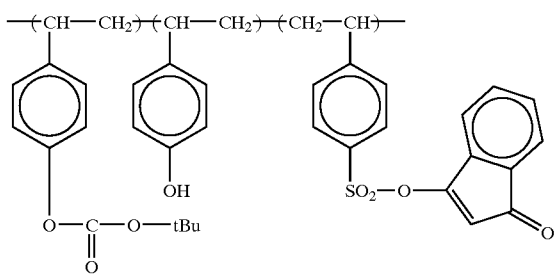
(XXIII)
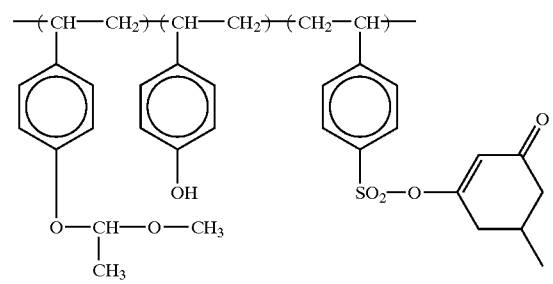

-continued

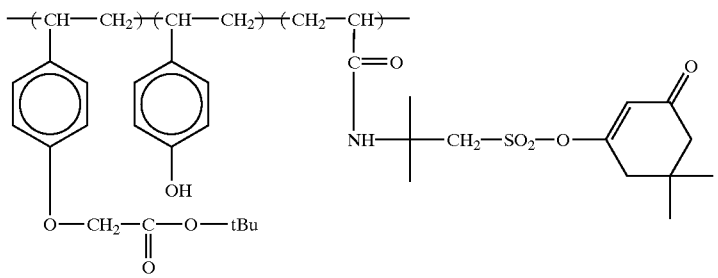
(XXIV)

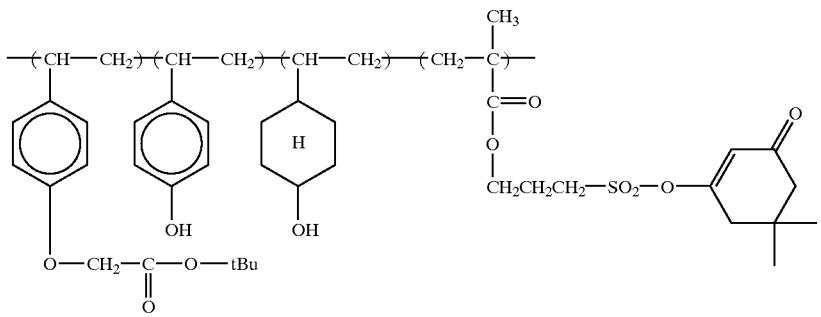
(XXV)

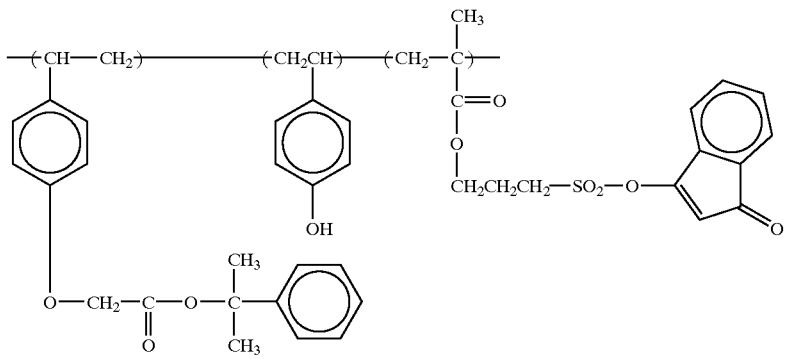
(XXVI)

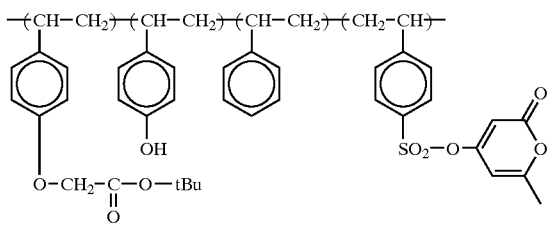
(XXVII)

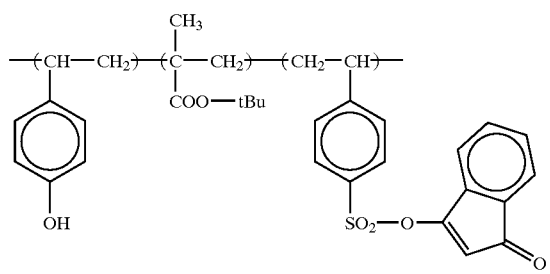
(XXVIII)

In the case where the exposure light is ArF excimer laser light having a wavelength of 193 nm, the resin is preferably one which contains, in the backbone or side chains thereof, major repeating units each containing not a benzene ring but an alicyclic structure.

The alicyclic structures may be monocyclic or polycyclic. Examples thereof include groups having, for example, a mono-, bi-, tri-, or tetracyclic structure having 5 or more carbon atoms. These alicyclic structures have preferably 6 to 30 carbon atoms, more preferably 7 to 25 carbon atoms. These alicyclic hydrocarbon groups may have one or more substituents. Examples of such alicyclic structures include cyclopentane, cyclohexane, cycloheptane, cyclooctane, cyclodecane, cyclododecane, and the following structures.

(1)

(2)

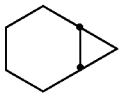
(3)

-continued
(4)
(5)
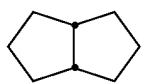
(6)
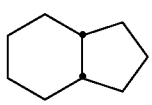
(7)
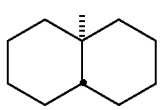
(8)
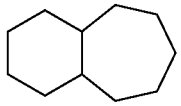
(9)
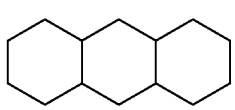
(10)
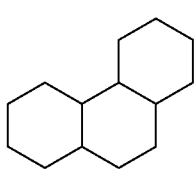
(11)
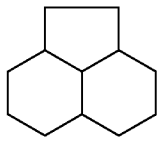
(12)
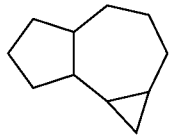
(13)
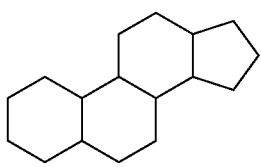
(14)
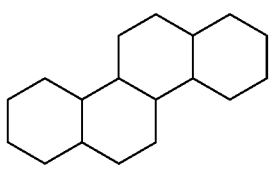
-continued
(15)
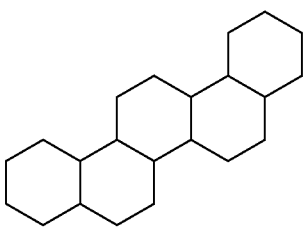
(16)
(17)
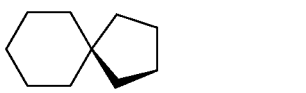
(18)
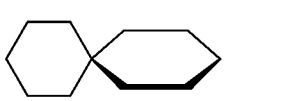
(19)
(20)
(21)
(22)
(23)
(24)
(25)
(26)
(27)
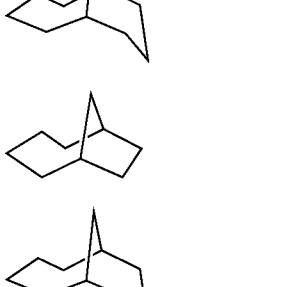

-continued

(28) 

(29) 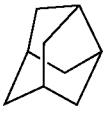

(30) 

(31) 

(32) 

(33) 

(34) 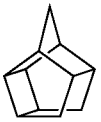

(35) 

-continued

(40) 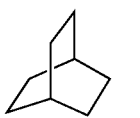

(41) 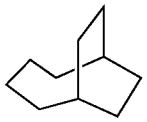

(42) 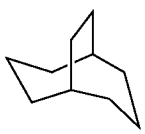

(43) 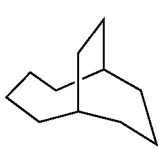

(44) 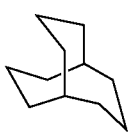

(45) 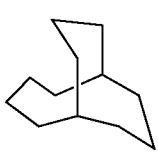

(46) 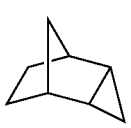

(47) 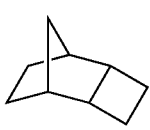

(36) 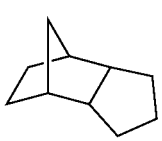

(37) 

(38) 

(39) 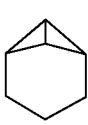

Preferred of these are cyclopentane, cyclohexane, (5) (6), (7), (9), (10), (13), (14), (15), (23), (28), (36), (37), (42), and (47).

Examples of the substituents for these alicyclic structures include alkyl groups, substituted alkyl groups, halogen atoms, hydroxyl, alkoxy groups, carboxyl, and alkoxycarbonyl groups. Preferred examples of the alkyl groups include lower alkyl groups such as methyl, ethyl, propyl, isopropyl, and butyl, and a more preferred alkyl substituent is one selected from the group consisting of methyl, ethyl, propyl, and isopropyl. Examples of the substituents of the substituted alkyl groups include hydroxyl, halogen atoms, and alkoxy groups. Examples of the alkoxy groups include those having 1 to 4 carbon atoms, such as methoxy, ethoxy, propoxy, and butoxy.

Preferred examples of the above acid-decomposable resin include the following ① to ③.

① A resin which contains a repeating unit having a group represented by general formula (I) and a repeating unit containing an alicyclic structure in a side chain thereof, and a repeating unit having an acid-decomposable group.

② A resin which contains a repeating unit having a group represented by general formula (I) and a repeating unit having an acid-decomposable group and containing an alicyclic structure in a side chain thereof.

③ A resin which contains a repeating unit having a group represented by general formula (I) and a repeating unit having both an alicyclic structure in side chains thereof and an acid-decomposable group.

Resin example ① is preferably a polymer represented by the following general formula (Ia).

General Formula (Ia)

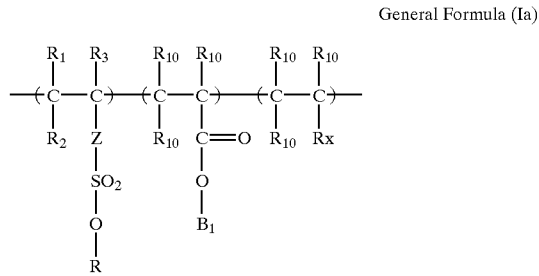

In general formula (Ia), $R_1$ to $R_3$, R, and Z respectively have the same meanings as in general formula (I) or (II). $B_1$ represents a univalent alicyclic group. Rx represents an acid-decomposable group. $R^{10}$'s may be the same or different and each represents a hydrogen atom or an optionally substituted, linear or branched alkyl group having 1 to 4 carbon atoms. Examples of the univalent alicyclic group represented by $B_1$ include univalent residues of the alicyclic structures shown above.

Examples of the acid-decomposable group represented by Rx include the aforementioned acid-decomposable groups.

Resin example ② is preferably a polymer represented by the following general formula (Ib).

General Formula (Ib)

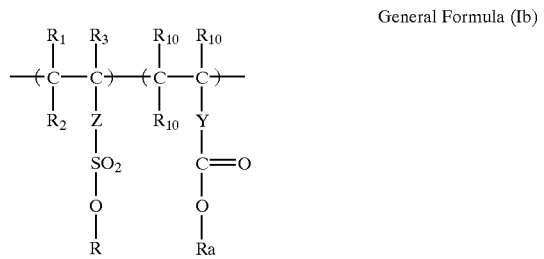

In general formula (Ib) $R_1$ to $R_3$, R, and Z respectively have the same meanings as in general formula (I) or (II). $R_{10}$'s may be the same or different and each represents a hydrogen atom or an optionally substituted, linear or branched alkyl group having 1 to 4 carbon atoms. Y represents one member or a combination of two or more members selected from the group consisting of a single bond, an alkylene group, a substituted alkylene group, an ether group, a thioether group, a carbonyl group, and an ester group.

Ra represents at least one group selected from groups represented by the following formulae (RaI) to (RaVI).

(RaI)

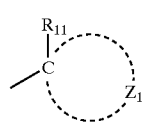

(RaII)

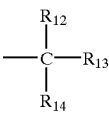

(RaIII)

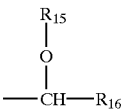

(RaIV)

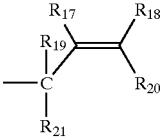

(RaV)

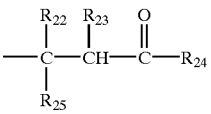

(RaVI)

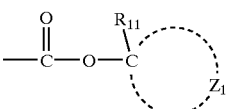

In formulae (RaI) to (RaVI), $R_{11}$ represents methyl, ethyl, n-propyl, isopropyl, n-butyl, isobutyl, or sec-butyl, and $Z_1$ represents a group of atoms necessary for forming an alicyclic group in cooperation with the carbon atom.

$R_{12}$ to $R_{16}$ each independently represents a linear or branched alkyl group having 1 to 4 carbon atoms or an alicyclic group, provided that at least one of $R_{12}$ to $R_{14}$ or either of $R_{15}$ and $R_{16}$ represents an alicyclic group.

$R_{17}$ to $R_{21}$ each independently represents a hydrogen atom, a linear or branched alkyl group having 1 to 4 carbon atoms, or an alicyclic group, provided that at least one of $R_{17}$ to $R_{21}$ represents an alicyclic group and either of $R_{19}$ and $R_{21}$ represents a linear or branched alkyl group having 1 to 4 carbon atoms or an alicyclic group.

$R_{22}$ to $R_{25}$ each independently represents a linear or branched alkyl group having 1 to 4 carbon atoms or an alicyclic group, provided that at least one of $R_{22}$ to $R_{25}$ represents an alicyclic group.

In general formulae (RaI) to (RaVI), the alkyl group represented by $R_{12}$ to $R_{25}$ is a linear or branched alkyl group having 1 to 4 carbon atoms which may be optionally substituted. Examples of the alkyl group include methyl, ethyl, n-propyl, isopropyl, n-butyl, isobutyl, sec-butyl, and t-butyl.

Examples of the substituent(s) for the above alkyl group include alkoxy groups having 1 to 4 carbon atoms, halogen atoms (fluorine, chlorine, bromine, and iodine atoms), acyl groups, acyloxy groups, cyano, hydroxyl, carboxyl, alkoxycarbonyl groups, and nitro.

The alicyclic group represented by $R_{11}$ to $R_{25}$ and the alicyclic group constituted of Z in cooperation with the carbon atom each may be monocyclic or polycyclic. Examples thereof include groups having, for example, a mono-, bi-, tri-, or tetracyclic structure having 5 or more carbon atoms. These alicyclic structures have preferably 6 to 30 carbon atoms, more preferably 7 to 25 carbon atoms. These alicyclic groups may have one or more substituents.

Preferred examples of the above alicyclic structures in general formulae (RaI) to (RaVI) include adamantyl, noradamantyl, decalin residues, tricyclodecanyl, tetracyclododecanyl, norbornyl, cedrol residues, cyclohexyl, cycloheptyl, cyclooctyl, cyclodecanyl, and cyclododecanyl. More preferred of these are adamantyl, decalin residues, norbornyl, cedrol residues, cyclohexyl, cycloheptyl, cyclooctyl, cyclodecanyl, and cyclododecanyl.

Examples of the substituents for these alicyclic groups include alkyl groups, substituted alkyl groups, halogen atoms, hydroxyl, alkoxy groups, carboxyl, and alkoxycarbonyl groups. Preferred examples of the alkyl groups include lower alkyl groups such as methyl, ethyl, propyl, isopropyl, and butyl, and a more preferred alkyl substituent is one selected from the group consisting of methyl, ethyl, propyl, and isopropyl. Examples of the substituents of the substituted alkyl groups include hydroxyl, halogen atoms, and alkoxy groups. Examples of the alkoxy groups include those having 1 to 4 carbon atoms, such as methoxy, ethoxy, propoxy, and butoxy.

Besides the acid-decomposable groups represented by —COORa, repeating units each containing another acid-decomposable group are preferably contained in the polymer represented by general formula (Ib). Examples of these repeating units include repeating units containing an acid-decomposable group Rx contained in the polymer represented by general formula (Ia).

Resin example ③ is preferably a polymer represented by the following general formula (Ic).

General Formula (Ic)

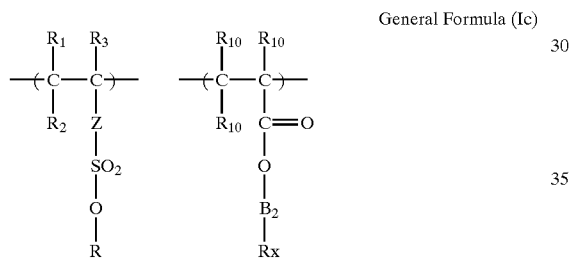

In general formula (Ic), $R_1$ to $R_3$, R, and Z respectively have the same meanings as in general formula (I) or (II). $B_2$ represents either a bivalent alkylene group containing an alicyclic group or a bivalent alicyclic group. Rx represents an acid-decomposable group. $R_{10}$'s may be the same or different and each represents a hydrogen atom or an optionally substituted, linear or branched alkyl group having 1 to 4 carbon atoms. The alicyclic group contained in $B_2$ is one having preferably 6 to 30 carbon atoms, more preferably 7 to 25 carbon atoms, and examples thereof include bivalent groups derived from the aforementioned alicyclic structures. The alkylene group constituting a bivalent group in cooperation with the alicyclic group is an optionally substituted, linear or branched alkylene group having 1 to 4 carbon atoms. Examples of the acid-decomposable group represented by Rx include the aforementioned acid-decomposable groups.

The acid-decomposable resin can be used as a copolymer containing repeating units derived from any of various monomers, besides the repeating units described above, for the purpose of regulating not only dry-etching resistance, developability with standard developing solutions, adhesion to substrates, and resist profile but also properties generally required of resists, such as resolution, heat resistance, and sensitivity.

Examples of such repeating units include those derived from the following monomers, but usable monomers should not be construed as being limited thereto.

The incorporation of such repeating units makes it possible to finely regulate, in particular, (1) solubility in solvents used for coating, (2) film-forming properties (glass transition point), (3) alkali developability, (4) resist loss (hydrophilicity/hydrophobicity; selection of alkali-soluble groups), (5) adhesion in unexposed areas to substrates, and (6) dry-etching resistance.

Examples of such comonomers include compounds having one addition-polymerizable unsaturated bond which are selected from acrylic esters, methacrylic esters, acrylamide and analogues thereof, methacrylamide and analogues thereof, allyl compounds, vinyl ethers, vinyl esters, and the like.

Specific examples thereof include: acrylic esters such as alkyl acrylates wherein the alkyl group preferably has 1 to 10 carbon atoms (e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate);

methacrylic esters such as alkyl methacrylates wherein the alkyl group preferably has 1 to 10 carbon atoms (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate);

acrylamide and analogues thereof such as N-alkylacrylamides (examples of the alkyl group include those having 1 to 10 carbon atoms, such as methyl, ethyl, propyl, butyl, t-butyl, heptyl, octyl, cyclohexyl, and hydroxyethyl), N,N-dialkylacrylamides (examples of each alkyl group include those having 1 to 10 carbon atoms, such as methyl, ethyl, butyl, isobutyl, ethylhexyl, and cyclohexyl), N-hydroxyethyl-N-methylacrylamide, and N-2-acetamidoethyl-N-acetylacrylamide;

methacrylamide and analogues thereof such as N-alkylmethacrylamides (examples of the alkyl group include those having 1 to 10 carbon atoms, such as methyl, ethyl, t-butyl, ethylhexyl, hydroxyethyl, and cyclohexyl), N,N-dialkylmethacrylamides (examples of each alkyl group include ethyl, propyl, and butyl), and N-hydroxyethyl-N-methylmethacrylamide;

allyl compounds such as allyl esters (e.g., allyl acetate, allyl caproate, allyl caprylate, allyl laurate, allyl palmitate, allyl stearate, allyl benzoate, allyl acetoacetate, and allyl lactate) and allyloxyethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, and vinyl cyclohexylcarboxylate;

dialkyl itaconates (e.g., dimethyl itaconate, diethyl itaconate, and dibutyl itaconate); dialkyl fumarates (e.g., dibutyl fumarate) and monoalkyl fumarates; and acrylic acid, methacrylic acid, crotonic acid, itaconic acid, maleic anhydride, maleimide, acrylonitrile, methacrylonitrile, maleonitrile, and the like.

Besides the compounds enumerated above, other addition-polymerizable unsaturated compounds may be used as long as they are copolymerizable with the various repeating units described above.

In the acid-decomposable resin, the molar proportion of repeating units of each kind is suitably determined so as to regulate not only the dry-etching resistance of the resist, developability thereof with standard developing solutions, adhesion thereof to substrates, and resist profile but also properties generally required of resists, such as resolution, heat resistance, and sensitivity.

The content of repeating units each having a group represented by general formula (I) in the acid-decomposable resin is preferably from 0.005 to 40 mol %, more preferably from 0.01 to 30 mol %, most preferably from 0.02 to 20 mol %, based on all repeating monomer units. If the content of repeating units each having a group represented by general formula (I) is lower than 0.005 mol %, the effects of the present invention are difficult to obtain. Contents thereof higher than 40 mol % are undesirable because there is a fear that film reduction may be increased to thereby impair the profile.

In the case where the resin is for use in KrF exposure, the content of repeating units each containing an acid-decomposable group in the acid-decomposable resin is preferably from 3 to 65 mol %, more preferably from 5 to 60 mol %, most preferably from 7 to 55 mol %, based on all repeating monomer units.

In the case where the resin is for use in ArF exposure, the content of repeating units each containing an acid-decomposable group in the acid-decomposable resin is, for example, as follows. When the acid-decomposable resin is classified as resin example ①, the content of those repeating units is preferably from 20 to 70 mol %, more preferably from 25 to 65 mol %, most preferably from 30 to 60 mol %, based on all repeating monomer units. When the acid-decomposable resin is classified as resin example ②, the content of those repeating units is preferably from 10 to 70 mol %, more preferably from 15 to 65 mol %, most preferably from 20 to 60 mol %, based on all repeating monomer units (excluding the Ra-containing moieties, which undergo decomposition with an acid). When the acid-decomposable resin is classified as resin example ③, the content of those repeating units is preferably 20 mol % or higher, more preferably 25 mol % or higher, most preferably 30 mol % or higher, based on all repeating monomer units.

In the case where the resin is for use in ArF exposure, the content of repeating units each containing an alicyclic structure in the acid-decomposable resin is, for example, as follows. When the acid-decomposable resin is classified as resin example ①, the content of those repeating units is preferably from 30 to 70 mol %, more preferably from 35 to 65 mol %, most preferably from 40 to 60 mol %, based on all repeating monomer units. When the acid-decomposable resin is classified as resin example ②, the content of those repeating units is preferably from 30 to 70 mol %, more preferably from 35 to 65 mol %, most preferably from 40 to 60 mol %, based on all repeating monomer units. When the acid-decomposable resin is classified as resin example ③, the content of those repeating units is preferably 40 mol % or higher, more preferably 45 mol % or higher, most preferably 50 mol % or higher, based on all repeating monomer units.

Carboxyl, hydroxyl, cyano, or lactone groups or the like can be incorporated into the acid-decomposable resin for ArF exposure according to the present invention for the purpose of imparting adhesiveness.

The acid-decomposable resin has an acid value of preferably 1.5 meq/g or lower, more preferably 1.2 meq/g or lower, most preferably 1.0 meq/g or lower.

The content of repeating units derived from the aforementioned optional comonomers in the resin also can be suitably determined according to the desired resist performances. In general, however, the content of these optional repeating units is preferably 99 mol % or lower, more preferably 90 mol % or lower, most preferably 80 mol % or lower, based on all essential repeating units.

The molecular weight of the acid-decomposable resin described above is preferably from 1,000 to 1,000,000, more preferably from 1,500 to 500,000, even more preferably from 2,000 to 200,000, most preferably from 2,500 to 100,000, in terms of weight-average molecular weight ($M_w$; calculated for standard polystyrene). The higher the molecular weight of the resin, the more the heat resistance and other properties improve but the more the developability and other properties decrease. The molecular weight of the resin is regulated to a value in the preferred range so as to balance these properties.

The acid-decomposable resin for use in the present invention can be synthesized by an ordinary method (e.g., radical polymerization).

In the positive photoresist composition according to the first aspect of the present invention, the content of the acid-decomposable resin is preferably from 40 to 99.99 wt %, more preferably from 50 to 99.97 wt %, based on all solid components in the resist composition.

The resin used in the composition according to the second aspect of the present invention, which decomposes by the action of an acid to have enhanced solubility in an alkali, will be explained below.

In general formulae (pI) to (pVI), the alkyl group represented by $R_{12}$ to $R_{25}$ is an optionally substituted, linear or branched alkyl group having 1 to 4 carbon atoms. Examples of the alkyl group include methyl, ethyl, n-propyl, isopropyl, n-butyl, isobutyl, sec-butyl, and t-butyl.

Examples of the substituent(s) for the above alkyl group include alkoxy groups having 1 to 4 carbon atoms, halogen atoms (fluorine, chlorine, bromine, and iodine atoms), acyl groups, acyloxy groups, cyano, hydroxyl, carboxy, alkoxycarbonyl groups, and nitro.

The alicyclic hydrocarbon group represented by $R_{11}$ to $R_{25}$ and the alicyclic hydrocarbon group constituted of Z in cooperation with the carbon atom each may be monocyclic or polycyclic. Examples thereof include groups having, for example, a mono-, bi-, tri-, or tetracyclic structure having 5 or more carbon atoms. These alicyclic structures have preferably 6 to 30 carbon atoms, more preferably 7 to 25 carbon atoms. These alicyclic hydrocarbon groups may have one or more substituents.

Examples of the alicyclic structure contained in or constituting the alicyclic hydrocarbon group are shown below.

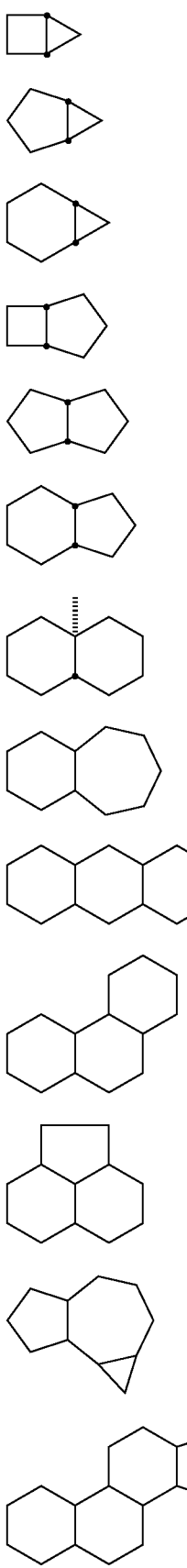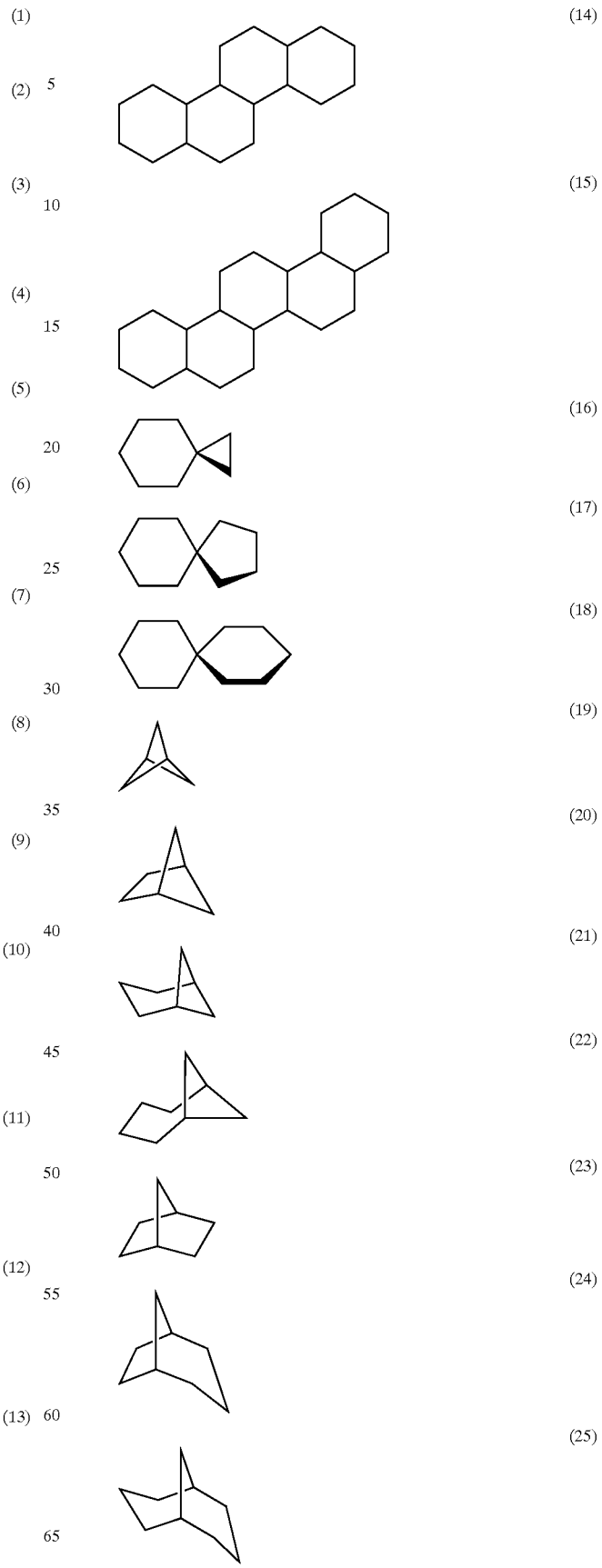

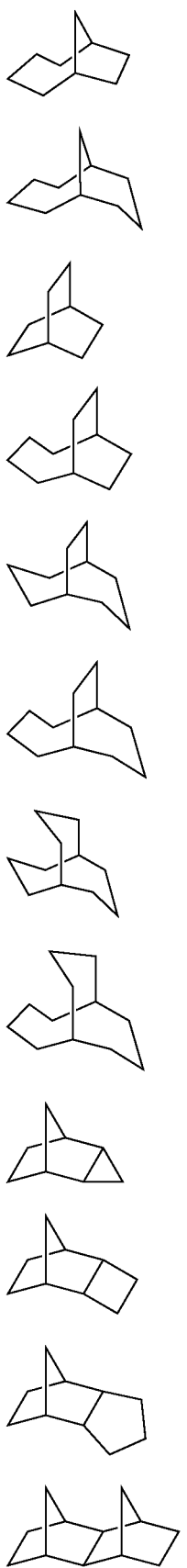
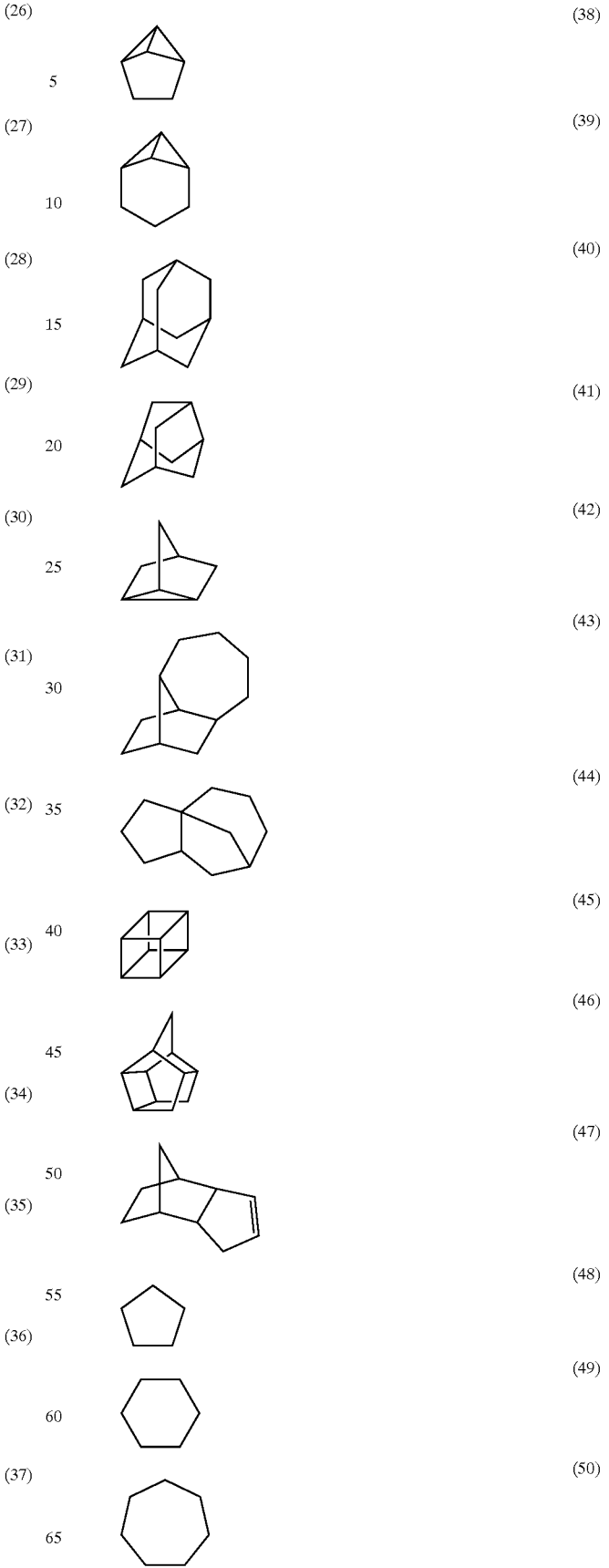

(51)

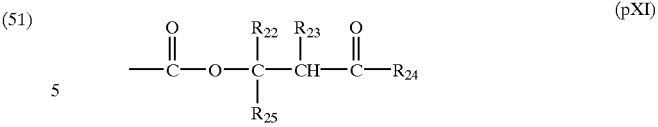
(pXI)

In the present invention, preferred examples of the alicyclic structure include adamantyl, noradamantyl, decalin residues, tricyclodecanyl, tetracyclododecanyl, norbornyl, cedorol residues, cyclohexyl, cycloheptyl, cyclooctyl, cyclodecanyl, and cyclododecanyl. More preferred of these are adamantyl, decalin residues, norbornyl, cedorol residues, cyclohexyl, cycloheptyl, cyclooctyl, cyclodecanyl, and cyclododecanyl.

Examples of the substituents for these alicyclic hydrocarbon groups include alkyl groups, substituted alkyl groups, halogen atoms, hydroxyl, alkoxy groups, carboxyl, and alkoxycarbonyl groups. Preferred examples of the alkyl groups include lower alkyl groups such as methyl, ethyl, propyl, isopropyl, and butyl. More preferred alkyl substituents are selected from methyl, ethyl, propyl, and isopropyl. Examples of the substituents of the substituted alkyl groups include hydroxyl, halogen atoms, and alkoxy groups. Examples of the alkoxy groups include those having 1 to 4 carbon atoms, such as methoxy, ethoxy, propoxy, and butoxy.

Examples of the alkali-soluble groups each protected by a structure represented by any of general formulae (pI) to (pVI) in the above resin include various groups known in this technical field. Specific examples thereof include carboxy, sulfo, phenol, and thiol groups. Preferred of these are carboxy and sulfo.

Preferred examples of the alkali-soluble groups each protected by a structure represented by any of general formulae (pI) to (pVI) in the above resin include groups represented by the following general formulae (pVII) to (pXI).

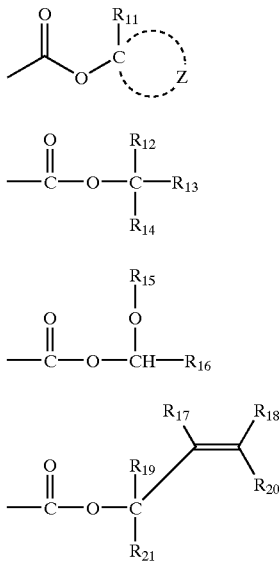

In general formulae (pVII) to (pXI), $R_{11}$ to $R_{25}$ and Z respectively have the same meanings as defined above.

In the above resin, the repeating units each having an alkali-soluble group protected by a structure represented by any of general formulae (pI) to (pVI) preferably are repeating units represented by the following general formula (pA).

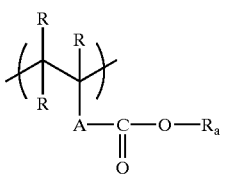

In formula (pA) R's may be the same or different and each represents a hydrogen atom, a halogen atom, or an optionally substituted, linear or branched alkyl group having 1 to 4 carbon atoms; and A represents one member or a combination of two or more members selected from the group consisting of a single bond, an alkylene group, a substituted alkylene group, an ether group, a thioether group, a carbonyl group, an ester group, an amide group, a sulfonamide group, a urethane group, and a urea group.

$R_a$ represents a group represented by any of general formulae (pI) to (pVI).

Specific examples of monomers corresponding to the repeating units represented by general formula (pA) are shown below.

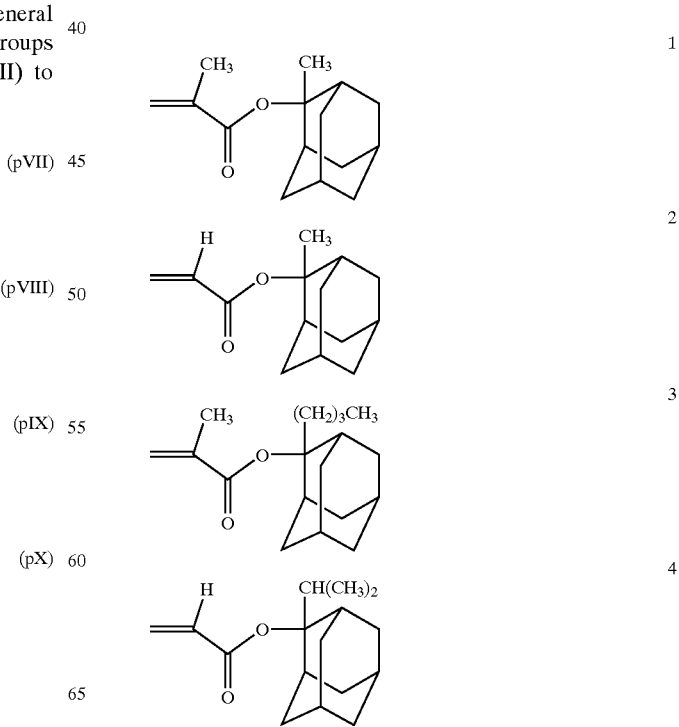

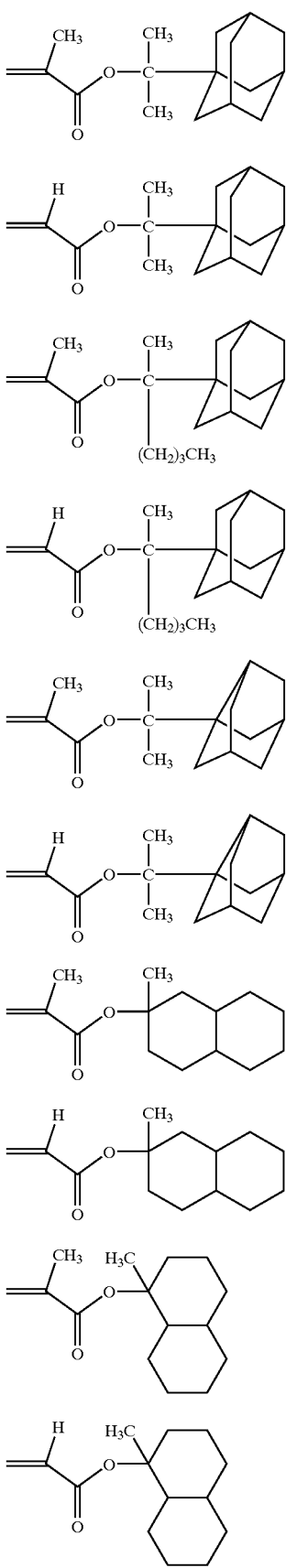
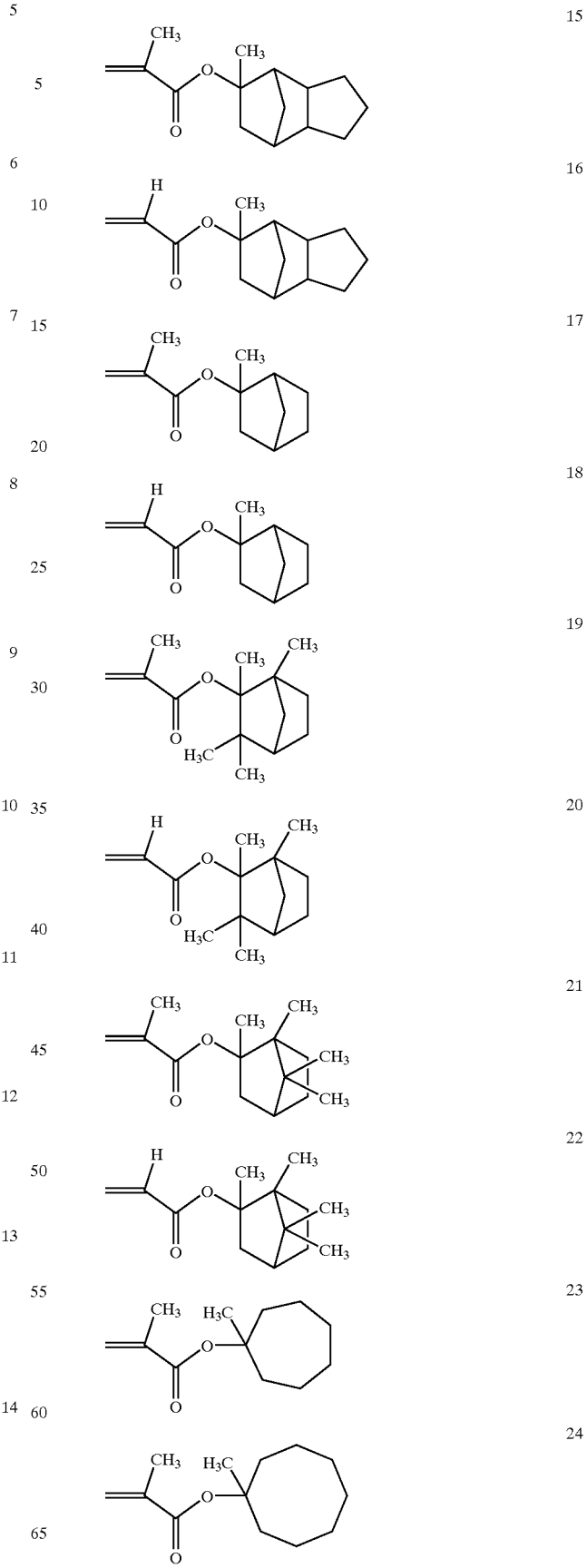

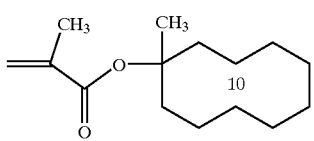
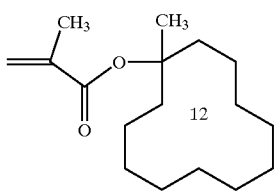
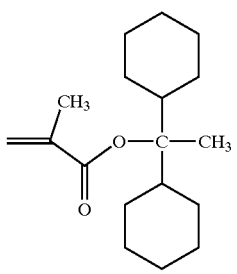
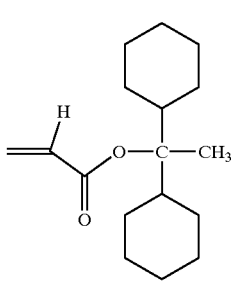
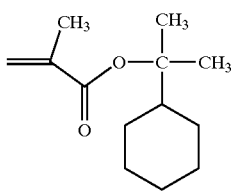
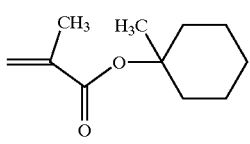
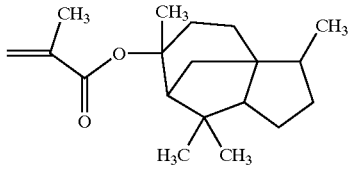
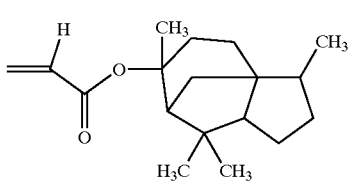
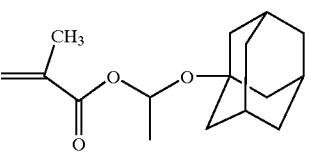
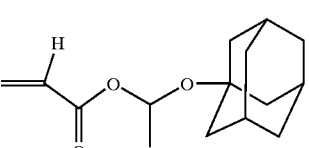
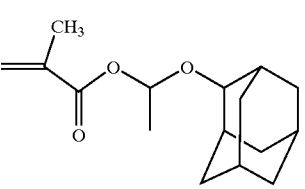
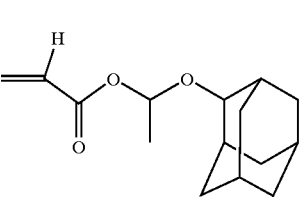
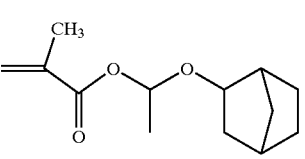
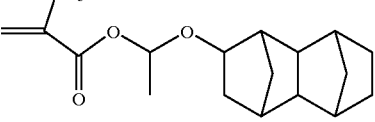
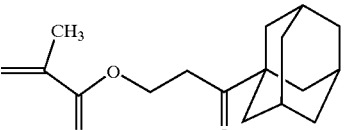
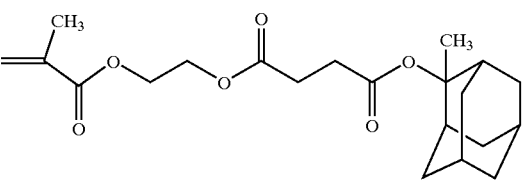
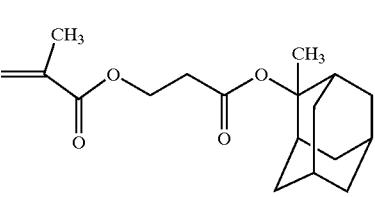
Other repeating units may be contained in the above resin, besides the repeating units each having an alkali-soluble group protected by a structure represented by any of general formulae (pI) to (pVI).

Such optional repeating units are preferably represented by the following general formula (AI).

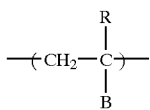

In general formula (AI), R has the same meaning as defined above, and B represents a halogen atom, a cyano group, a group which decomposes by the action of an acid, —C(=O)—Y—A—Rc9, or —COORc11, wherein Y represents an oxygen atom, a sulfur atom, or a bivalent connecting group selected from —NH—, —NHSO$_2$—, and —NHSO$_2$NH—;

Rc9 represents —COOH, —COORc10 (wherein Rc10 has the same meaning as Rc11 or represents any of the lactone structures shown below), —CN, a hydroxyl group, an optionally substituted alkoxy group, —CO—NH—Rc11, —CO—NH—SO$_2$—Rc11, or any of the following lactone structures;

Rc11 represents an optionally substituted alkyl group or an optionally substituted cyclic hydrocarbon group; and A represents one member or a combination of two or more members selected from the group consisting of a single bond, an alkylene group, a substituted alkylene group, an ether group, a thioether group, a carbonyl group, an ester group, an amide group, a sulfonamide group, a urethane group, and a urea group.

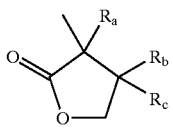

General Formula [III]

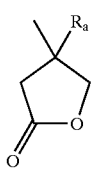

General Formula [IV]

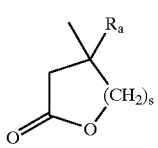

General Formula (V)

In the above formulae, R$_a$, R$_b$, and R$_c$ each independently represents an optionally substituted hydrocarbon group, and s is an integer of 2 or larger.

The group which decomposes by the action of an acid is preferably a group represented by —C(=O)—X$_1$—R$_0$. Examples of R$_0$ include tertiary alkyl groups such as t-butyl and t-amyl, isobornyl, 1-alkoxyethyl groups such as 1-ethoxyethyl, 1-butoxyethyl, 1-isobutoxyethyl, and 1-cyclohexyloxyethyl, alkoxymethyl groups such as 1-methoxymethyl and 1-ethoxymethyl, tetrahydropyranyl, tetrahydrofuranyl, trialkylsilyl groups, and 3-oxocyclohexyl. X$_1$ represents an oxygen atom, a sulfur atom, —NH—, —HNSO$_2$—, or —NHSO$_2$HN—, but is preferably an oxygen atom.

The alkyl group is preferably a linear or branched alkyl group having 1 to 10 carbon atoms, more preferably a linear or branched alkyl group having 1 to 6 carbon atoms. Most preferred examples thereof are methyl, ethyl, propyl, isopropyl, n-butyl, isobutyl, sec-butyl, and t-butyl.

Examples of the cyclic hydrocarbon group include cycloalkyl groups and crosslinked hydrocarbons. Specific examples thereof include cyclopropyl, cyclopentyl, cyclohexyl, adamantyl, bornyl, isobornyl, tricyclodecanyl, dicyclopentenyl, norbornane-epoxy, menthyl, isomenthyl, neomenthyl, and tetracyclododecanyl.

Examples of the alkoxy group include those having 1 to 4 carbon atoms, such as methoxy, ethoxy, propoxy, and butoxy.

Examples of the substituents for the above alkyl, cycloalkyl, and alkoxy groups include hydroxyl, halogen atoms, carboxyl, alkoxy groups, acyl groups, cyano, and acyloxy groups. Examples of the alkoxy groups include those having 1 to 4 carbon atoms, such as methoxy, ethoxy, propoxy, and butoxy. Examples of the acyl groups include formyl and acetyl. Examples of the acyloxy groups include acetoxy.

In general formulae (AI) and (pA), examples of the alkylene group and substituted alkylene group represented by A include groups shown by the following formula.

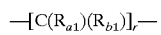

In the above formula, R$_{a1}$ and R$_{b1}$ may be the same or different and each represents a hydrogen atom, an alkyl group, a substituted alkyl group, a halogen atom, hydroxyl, or an alkoxy group. The alkyl group is preferably a lower alkyl group such as methyl, ethyl, propyl, isopropyl, or butyl, and is more preferably a substituent selected from the group consisting of methyl, ethyl, propyl, and isopropyl. Examples of the substituent(s) of the substituted alkyl group include hydroxyl, halogen atoms, and alkoxy groups. Examples of the alkoxy groups include those having 1 to 4 carbon atoms, such as methoxy, ethoxy, propoxy, and butoxy. Furthermore, r represents an integer of 1 to 10.

Examples of the halogen atom include chlorine, bromine, fluorine, and iodine atoms.

Preferred examples of B are acid-decomposable groups and groups represented by —COOLc, wherein Lc represents a lactone group represented by any of general formulae (III) to (V) described above.

As stated above, R$_a$, R$_b$, and R$_c$ each independently represents a hydrogen atom or a hydrocarbon group. Examples of the hydrocarbon group include alkyl groups having 1 to 8 carbon atoms, cycloalkyl groups having 4 to 10 carbon atoms, and aralkyl groups having 7 to 12 carbon atoms. Examples of the alkyl groups include methyl, ethyl, propyl, isopropyl, butyl, and octyl. Examples of the cycloalkyl groups include cyclopentyl, cyclohexyl, and cycloheptyl. Examples of the aralkyl groups include benzyl, phenethyl, and naphthylethyl.

In the case where R$_a$, R$_b$, or R$_c$ is an alkyl, cycloalkyl, or aralkyl group, this group may have one or more substituents. Examples of the substituents include halogen atoms such as chlorine, bromine, and fluorine atoms, —CN, —OH, alkyl groups having 1 to 4 carbon atoms, cycloalkyl groups having 3 to 8 carbon atoms, alkoxy groups having 1 to 4 carbon atoms, acylamino groups such as acetylamino, aralkyl groups such as benzyl and phenethyl, aryloxyalkyl groups such as phenoxyethyl, and silyl groups such as trimethylsilyl and trimethoxysilyl. The substituents should not be construed as being limited to these examples.

From the standpoint of highly satisfactorily attaining the object of the present invention, developability, etc., $R_a$, $R_b$, and $R_c$ in general formulae [III] to [V] preferably each independently represents a hydrogen atom, an optionally substituted alkyl group having 1 to 8 carbon atoms, or an optionally substituted aralkyl group having 7 to 12 carbon atoms. $R_a$, $R_b$, and $R_c$ more preferably each independently represents a hydrogen atom or an optionally substituted alkyl group having 1 to 4 carbon atoms, and most preferably each independently represents a hydrogen atom, methyl, or ethyl.

Symbol s represents an integer of preferably 2 to 6, more preferably 2 to 4, most preferably 2.

In the acid-decomposable resin according to the present invention, the optional comonomer units such as those represented by general formula (AI) preferably contain an acid-decomposable group other than the alkali-soluble groups each protected by a structure represented by any of general formulae (pI) to (pVI). Such acid-decomposable groups which can be contained in the resin are preferably groups represented by —C(=O) —O—$R_0$ described above.

The acid-decomposable resin which can be used in the second aspect may be a copolymer containing repeating units derived from other monomers, besides the repeating units described above, for the purpose of regulating not only dry-etching resistance, developability with standard developing solutions, adhesion to substrates, and resist profile but also properties generally required of resists, such as resolution, heat resistance, and sensitivity.

Examples of such repeating units include those derived from the following monomers, but usable monomers should not be construed as being limited thereto. The incorporation of such repeating units makes it possible to finely regulate, in particular, (1) solubility in solvents used for coating, (2) film-forming properties (glass transition point), (3) alkali developability, (4) resist loss (hydrophilicity/hydrophobicity; selection of alkali-soluble groups), (5) adhesion in unexposed areas to substrates, and (6) dry-etching resistance.

Examples of such comonomers include compounds having one addition-polymerizable unsaturated bond which are selected from acrylic esters, methacrylic esters, acrylamide and analogues thereof, methacrylamide and analogues thereof, allyl compounds, vinyl ethers, vinyl esters, and the like.

Specific examples thereof include: acrylic esters such as alkyl acrylates wherein the alkyl group preferably has 1 to 10 carbon atoms (e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate);

methacrylic esters such as alkyl methacrylates wherein the alkyl group preferably has 1 to 10 carbon atoms (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate);

acrylamide and analogues thereof such as N-alkylacrylamides (examples of the alkyl group include those having 1 to 10 carbon atoms, such as methyl, ethyl, propyl, butyl, t-butyl, heptyl, octyl, cyclohexyl, and hydroxyethyl), N,N-dialkylacrylamides (examples of each alkyl group include those having 1 to 10 carbon atoms, such as methyl, ethyl, butyl, isobutyl, ethylhexyl, and cyclohexyl), N-hydroxyethyl-N-methylacrylamide, and N-2-acetamidoethyl-N-acetylacrylamide;

methacrylamide and analogues thereof such as N-alkylmethacrylamides (examples of the alkyl group include those having 1 to 10 carbon atoms, such as methyl, ethyl, t-butyl, ethylhexyl, hydroxyethyl, and cyclohexyl), N,N-dialkylmethacrylamides (examples of each alkyl group include ethyl, propyl, and butyl), and N-hydroxyethyl-N-methylmethacrylamide;

allyl compounds such as allyl esters (e.g., allyl acetate, allyl caproate, allyl caprylate, allyl laurate, allyl palmitate, allyl stearate, allyl benzoate, allyl acetoacetate, and allyl lactate) and allyloxyethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, and vinyl cyclohexylcarboxylate;

dialkyl itaconates (e.g., dimethyl itaconate, diethyl itaconate, and dibutyl itaconate); dialkyl fumarates (e.g., dibutyl fumarate) and monoalkyl fumarates; and acrylic acid, methacrylic acid, crotonic acid, itaconic acid, maleic anhydride, maleimide, acrylonitrile, methacrylonitrile, maleonitrile, and the like.

Besides the compounds enumerated above, other addition-polymerizable unsaturated compounds may be used as long as they are copolymerizable with the various repeating units described above.

In the acid-decomposable resin, the molar proportion of repeating units of each kind is suitably determined so as to regulate not only the dry-etching resistance of the resist, developability thereof with standard developing solutions, adhesion thereof to substrates, and resist profile but also properties generally required of resists, such as resolution, heat resistance, and sensitivity.

The content of repeating units each having an alkali-soluble group protected by a partial structure represented by any of general formulae (pI) to (pVI) in the acid-decomposable resin is generally from 30 to 70 mol %, preferably from 35 to 65 mol %, more preferably from 40 to 60 mol %, based on all repeating monomer units.

The content of repeating units each having an acid-decomposable group other than the alkali-soluble groups protected by partial structures represented by general formulae (pI) to (pVI) in the acid-decomposable resin is generally 70 mol % or lower, preferably from 5 to 65 mol %, more preferably from 10 to 60 mol %, based on all repeating monomer units.

The content of carboxyl groups, which impart adhesiveness, in the resin is generally 2.0 meq/g or lower, preferably 1.8 meq/g or lower, more preferably 1.5 meq/g or lower.

Furthermore, the content of repeating units derived from the aforementioned optional comonomers in the resin also can be suitably determined according to the desired resist performances. In general, however, the content of these optional repeating units is preferably 99 mol % or lower, more preferably 90 mol % or lower, most preferably 80 mol % or lower, based on all essential repeating units.

The molecular weight of the acid-decomposable resin described above is preferably from 1,000 to 1,000,000, more preferably from 1,500 to 500,000, even more preferably from 2,000 to 200,000, most preferably from 2,500 to 100,000, in terms of weight-average molecular weight ($M_w$; calculated for standard polystyrene). The higher the molecular weight of the resin, the more the heat resistance and other properties improve but the more the developability and other properties decrease. The molecular weight of the resin is regulated to a value in the preferred range so as to balance these properties.

The acid-decomposable resin for use in the present invention can be synthesized by an ordinary method (e.g., radical polymerization).

In the positive photoresist composition of the second aspect according to the present invention, the content of the acid-decomposable resin is preferably from 40 to 99.99 wt %, more preferably from 50 to 99.97 wt %, based on all solid components in the resist composition.

The fluorine and/or silicon surfactant which may be contained in the positive photoresist composition according to the second aspect of the present invention will be explained below.

The positive photoresist composition of the present invention may contain one or more of a fluorine surfactant, a silicon surfactant, and a surfactant containing both fluorine atoms and silicon atoms.

When the positive photoresist composition of the present invention contains the above-described acid-decomposable resin in combination with at least one of these surfactants, not only a resist pattern reduced in development defect occurrence and scum generation is obtained through exposure with a light source emitting a light having a wavelength of 250 nm or shorter, especially 220 nm or shorter, but also the resist has excellent line width reproducibility.

Examples of those surfactants are given in, e.g., U.S. Pat. Nos. 5,405,720, 5,360,692, 5,529,881, 5,296,330, 5,436, 098, 5,576,143, 5,294,511, and 5,824,451,JP-A-62-36663, JP-A-61-226746, JP-A-61-226745, JP-A-62-170950, JP-A-63-34540, JP-A-7-230165, JP-A-8-62834, JP-A-9-54432, and JP-A-9-5988. It is also possible to use the following commercial surfactants as they are.

Examples of the commercial surfactants usable in the present invention include fluorine or silicon surfactants such as F-Top EF301 and EF303 (manufactured by New Akita Chemical Company), Fluorad FC430 and FC431 (manufactured by Sumitomo 3M Ltd.), Megafac F171, F173, F176, F189, and RO8 (manufactured by Dainippon Ink & Chemicals, Inc.), and Surflon S-382, SC101, SC102, SC103, SC104, SC105, and SC106 (manufactured by Asahi Glass Co., Ltd.). Polysiloxane polymer KP-341 (manufactured by Shin-Etsu Chemical Co., Ltd.) also is usable as a silicon surfactant.

The incorporation amount of these surfactants is generally from 0.001 to 2 wt %, preferably from 0.01 to 1 wt %, based on the solid components in the composition of the present invention.

These surfactants may be used alone or in combination of two or more thereof.

[1] The compound decomposing by the action of an acid to generate a sulfonic acid (hereinafter referred to also as sulfonic-acid-generating compound), which is used in the composition according to the second aspect of the present invention, will be explained below.

The sulfonic-acid-generating compound in the present invention is stable in the absence of an acid but, by the action of the acid generated by the photo-acid generator upon exposure, decomposes to yield a sulfonic acid. The acid yielded by the sulfonic-acid-generating compound preferably has a high acid strength. Specifically, it has a dissociation constant ($pK_a$) of preferably 3 or lower, more preferably 2 or lower.

Preferred examples of the acid generated by the sulfonic-acid-generating compound are sulfonic acids having an alkyl, cycloalkyl, aryl, or aralkyl group. Preferred examples of the sulfonic-acid-generating compound include compounds represented by the following general formulae (1) to (5).

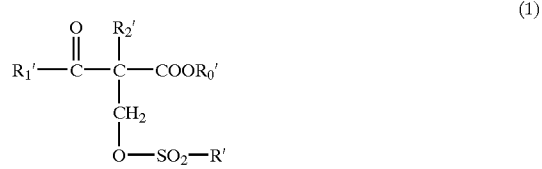

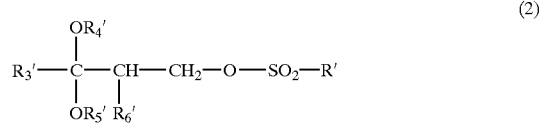

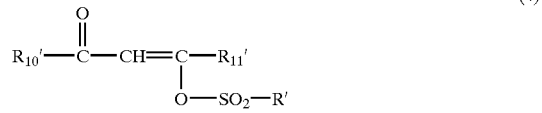

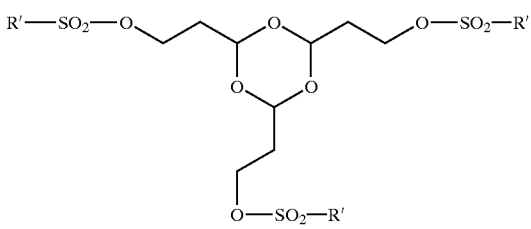

(5)

In general formulae (1) to (5),

R' represents an alkyl group, a cycloalkyl group, an aryl group, or an aralkyl group;

$R'_0$ represents such a group that —$COOR'_0$ is a group which decomposes by the action of an acid;

$R'_1$ represents an alkyl group, a cycloalkyl group, an aryl group, an aralkyl group, an alkoxy group, or an aryloxy group;

$R'_2$ represents an alkyl group or an aralkyl group;

$R'_3$ represents an alkyl group, a cycloalkyl group, an aryl group, or an aralkyl group;

$R'_4$ and $R'_5$ each independently represents an alkyl group, provided that they may be bonded to each other to form a ring;

$R'_6$ represents a hydrogen atom or an alkyl group;

$R'_7$ represents a hydrogen atom, an alkyl group, a cycloalkyl group, an aryl group, or an aralkyl group;

$R'_8$ represents an alkyl group, a cycloalkyl group, an aryl group, or an aralkyl group;

$R'_9$ represents a hydrogen atom, an alkyl group, a cycloalkyl group, an aryl group, or an aralkyl group, provided that $R'_9$ may be bonded to $R'_7$ to form a ring;

$R'_{10}$ represents an alkyl group, a cycloalkyl group, an alkoxy group, an aryl group, an aralkyl group, an aryloxy group, or an alkenyloxy group; and $R'_{11}$ represents an alkyl group, a cycloalkyl group, an alkoxy group, an aryl group, an aralkyl group, an aryloxy group, or an alkenyl group, provided that $R'_{10}$ and $R'_{11}$ may be bonded to each other to form a ring.

Examples of the alkyl groups in formulae (1) to (5) include alkyl groups having 1 to 8 carbon atoms, such as methyl, ethyl, propyl, isopropyl, butyl, and octyl.

Examples of the cycloalkyl groups include those having 4 to 10 carbon atoms, such as cyclopropyl, cyclopentyl, cyclohexyl, cycloheptyl, adamantyl, bornyl, isobornyl, tricyclodecanyl, dicyclopentenyl, norbornane-epoxy, menthyl, isomenthyl, neomenthyl, and tetracyclododecanyl.

Examples of the aryl groups include those having 6 to 14 carbon atoms, such as phenyl, naphthyl, and tolyl.

Examples of the aralkyl groups include those having 7 to 20 carbon atoms, such as benzyl, phenethyl, and naphthylethyl.

Examples of the alkoxy groups include those having 1 to 8 carbon atoms, such as methoxy, ethoxy, propoxy, and butoxy.

Examples of the alkenyl group include those having 2 to 6 carbon atoms, such as vinyl, propenyl, allyl, butenyl, pentenyl, hexenyl, and cyclohexenyl.

Examples of the aryloxy groups include those having 6 to 14 carbon atoms, such as phenoxy and naphthoxy.

Examples of the alkenyloxy group include those having 2 to 8 carbon atoms, such as vinyloxy and allyloxy.

The substituents described above may further have one or more substituents. Examples of these substituents include halogen atoms such as chlorine, bromine, and fluorine atoms, —CN, —OH, alkyl groups having 1 to 4 carbon atoms, cycloalkyl groups having 3 to 8 carbon atoms, alkoxy groups having 1 to 4 carbon atoms, acylamino groups such as acetylamino, aralkyl groups such as benzyl and phenethyl, aryloxyalkyl groups such as phenoxyethyl, alkoxycarbonyl groups having 2 to 5 carbon atoms, and acyloxy groups having 2 to 5 carbon atoms. The substituents should not be construed as being limited to these examples.

Examples of the ring containing $R'_4$ and $R'_5$ bonded to each other include a 1,3-dioxolane ring and a 1,3-dioxane ring.

Examples of the ring containing $R'_7$ and $R'_9$ bonded to each other include a cyclopentyl ring and a cyclohexyl ring.

Examples of the ring containing $R'_{10}$ and $R'_{11}$ bonded to each other include a 3-oxocyclohexenyl ring and a 3-oxoindenyl ring which each may contain an oxygen atom in the ring.

Examples of the acid-decomposable group include those in which $R'_0$ is a tertiary alkyl group such as t-butyl or t-amyl, isobornyl, a 1-alkoxyethyl group such as 1-ethoxyethyl, 1-butoxyethyl, 1-isobutoxyethyl, or 1-cyclohexyloxyethyl, an alkoxymethyl group such as 1-methoxymethyl or 1-ethoxymethyl, tetrahydropyranyl, tetrahydrofuranyl, a trialkylsilyl group, or 3-oxocyclohexyl.

Preferred examples of R', $R'_0$, and $R'_1$ to $R'_{11}$ are as follows.

R': methyl, ethyl, propyl, butyl, octyl, trifluoromethyl, nonafluorobutyl, heptadecafluorooctyl, 2,2,2-trifluoroethyl, phenyl, pentafluorophenyl, methoxyphenyl, toluyl, mesityl, fluorophenyl, naphthyl, cyclohexyl, and camphor groups.

$R'_0$: t-butyl, methoxymethyl, ethoxymethyl, 1-ethoxyethyl, and tetrahydropyranyl.

$R'_1$: methyl, ethyl, propyl, cyclopropyl, cyclopentyl, cyclohexyl, phenyl, naphthyl, benzyl, phenethyl, methoxy, ethoxy, propoxy, phenoxy, and naphthoxy.

$R'_2$: methyl, ethyl, propyl, butyl, and benzyl.

$R'_3$: methyl, ethyl, propyl, cyclopropyl, cyclopentyl, cyclohexyl, phenyl, naphthyl, benzyl, phenethyl, and naphthylmethyl.

$R'_4$, $R'_5$: methyl, ethyl, and propyl; and ethylene and propylene in the case where $R'_4$ and $R'_5$ are bonded to each other.

$R'_6$: hydrogen atom, methyl, and ethyl.

$R'_7$, $R'_9$: hydrogen atom, methyl, ethyl, propyl, butyl, pentyl, cyclopropyl, cyclopentyl, cyclohexyl, phenyl, naphthyl, benzyl, and phenethyl; and cyclopentyl and cyclohexyl as examples of the ring containing $R'_7$ and $R'_9$ bonded to each other.

$R'_8$: methyl, ethyl, isopropyl, t-butyl, neopentyl, cyclohexyl, phenyl, and benzyl.

$R'_{10}$: methyl, ethyl, propyl, isopropyl, butyl, isobutyl, cyclopropyl, cyclopentyl, cyclohexyl, methoxy, ethoxy, phenyl, naphthyl, benzyl, phenoxy, naphthoxy, vinyloxy, and methylvinyloxy; and optionally oxygen-containing 3-oxocyclohexenyl and 3-oxoindenyl as examples of the ring containing $R'_{10}$ and $R'_{11}$ bonded to each other.

$R'_{11}$: methyl, ethyl, propyl, isopropyl, butyl, isobutyl, cyclopropyl, cyclopentyl, cyclohexyl, methoxy, ethoxy, phenyl, naphthyl, benzyl, phenoxy, naphthoxy, vinyl, and allyl; and optionally oxygen-containing 3-oxocyclohexenyl and 3-oxoindenyl as examples of the ring containing $R'_{11}$ and $R'_{10}$ bonded to each other.

Specific examples of the compounds represented by general formulae (1) to (5) are shown below. However, the contents of the present invention should not be construed as being limited by these examples.

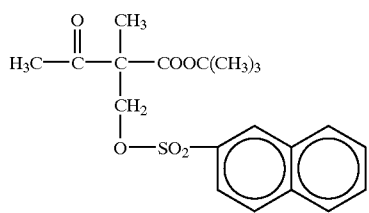 (1-1)
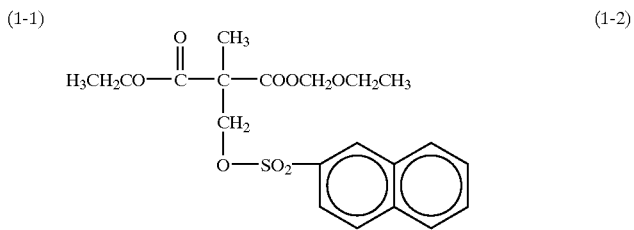 (1-2)
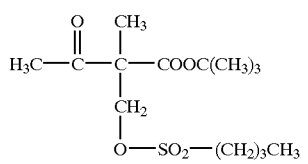 (1-3)
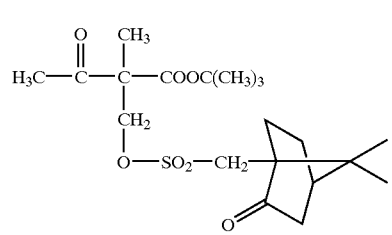 (1-4)
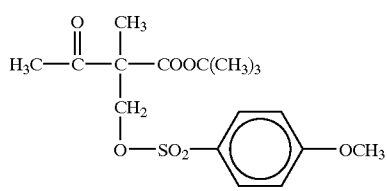 (1-5)
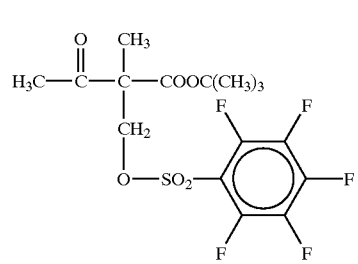 (1-6)
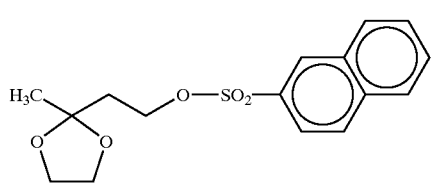 (2-1)
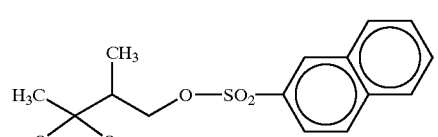 (2-2)
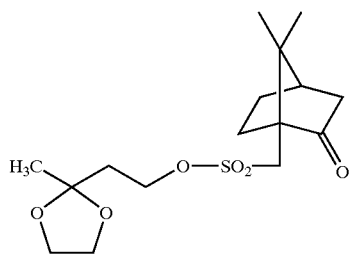 (2-3)
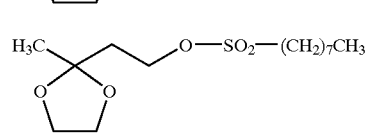 (2-4)
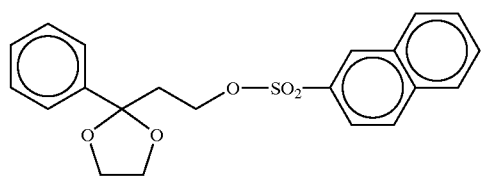 (2-5)
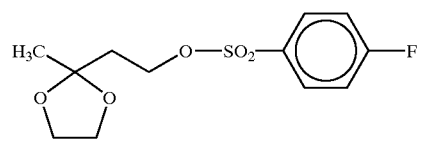 (2-6)
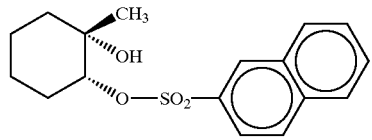 (3-1)
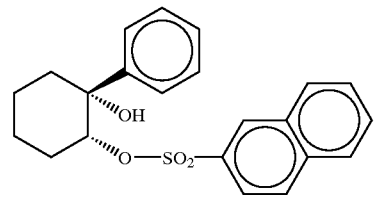 (3-2)

-continued
(3-3)
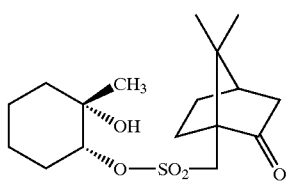
(3-4)
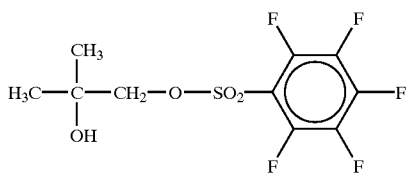
(3-5)
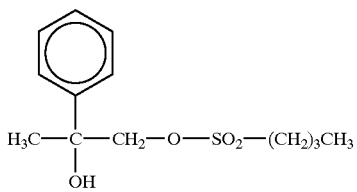
(3-6)
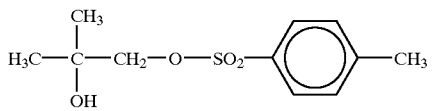
(4-1)
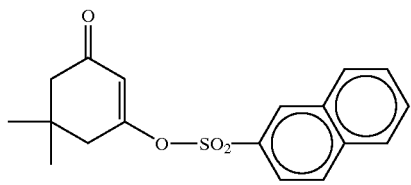
(4-2)
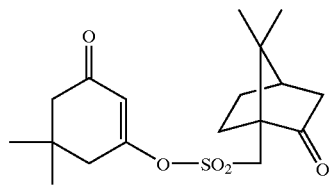
(4-3)
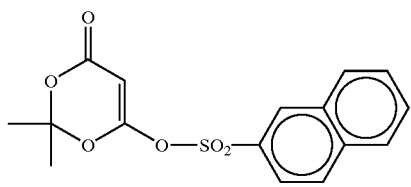
(4-4)
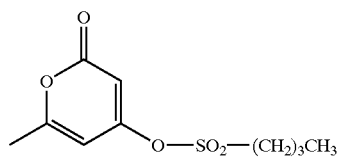
(4-5)
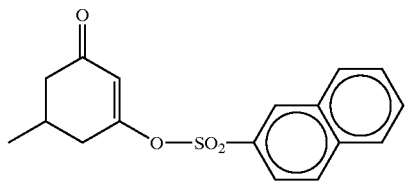
(4-6)
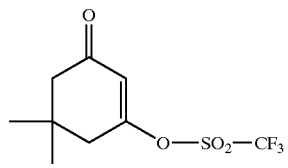
(4-7)
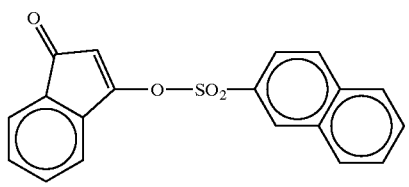
(5-1)
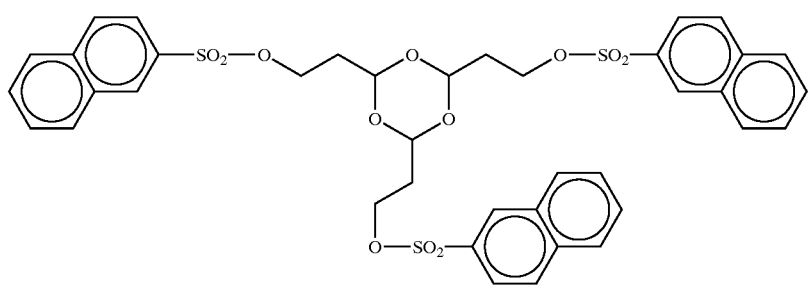

-continued

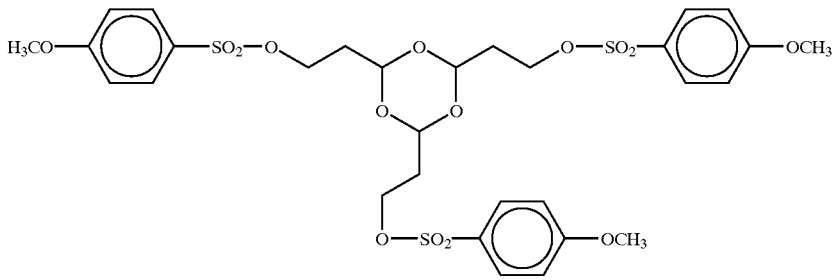
(5-2)

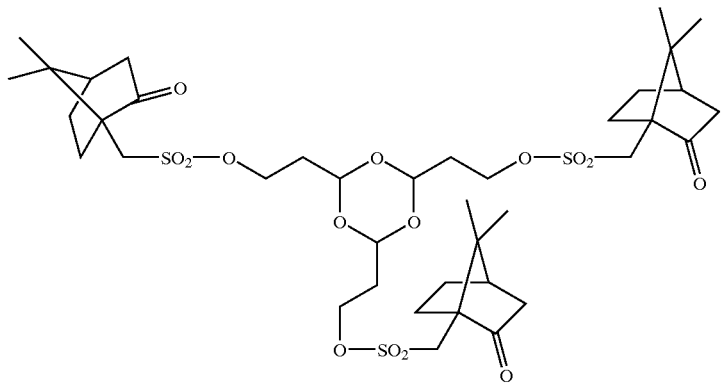
(5-3)

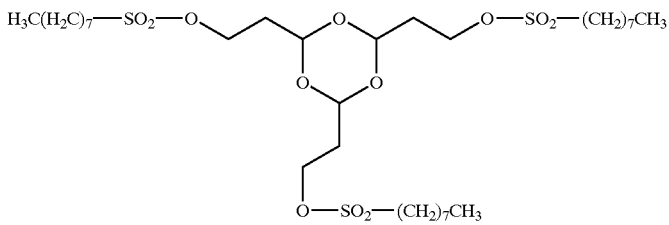
(5-4)

Especially preferred examples of the sulfonic-acid-generating compound for use in the present invention are the compounds represented by general formula (4).

The addition amount of the sulfonic-acid-generating compound in the composition of the present invention is preferably from 0.01 to 10 wt %, more preferably from 0.05 to 5 wt %, based on all solid components of the composition.

[2] The compound which generates an acid upon irradiation with actinic rays or a radiation (photo-acid generator), which is used in the compositions according to the first and second aspects of the present invention, will be explained below.

The photo-acid generator for use in the present invention is a compound which generates an acid upon irradiation with actinic rays or a radiation.

Examples of the compound for use in the present invention which decomposes and generates an acid upon irradiation with actinic rays or a radiation include photoinitiators for cationic photopolymerization, photoinitiators for radical photopolymerization, photodecolorants for dyes, optical color changers, and compounds which generate an acid by the action of known lights used for microresists (e.g., ultraviolet rays having wavelengths of from 400 to 200 nm and far ultraviolet rays, especially preferably g-line, h-line, i-line, and KrF excimer laser light) or of ArF excimer laser light, electron beams, X-rays, molecular beams, or ion beams. These photo-acid generators may be suitably used alone or as a mixture of two or more thereof.

Other examples of the compound for use in the present invention which generates an acid upon irradiation with actinic rays or a radiation include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, Reissue 27,992, and JP-A-3-140,140; the phosphonium salts described in, e.g., D. C. Necker et al., *Macromolecules*, 17, 2468 (1984), C. S. Wen et al., *Teh, Proc. Conf. Rad. Curing ASIA*, p.478 Tokyo, October (1988), and U.S. Pat. Nos. 4,069,055 and 4,069,056; the iodonium salts described in, e.g., J. V. Crivello et al., *Macromorecules*, 10 (6), 1307 (1977), *Chem. & Eng. News*, November 28, p.31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromorecules*, 14 (5), 1141 (1981), J. V. Crivello et al., *J. Polymer Sci., Polymer Chem. Ed.*, 17, 2877 (1979), European Patents 370,693, 161,811, 410,201, 339,049, 233,567, 297,443, and 297,442, U.S. Pat. Nos. 3,902,114, 4,933,377, 4,760,013, 4,734,444, and 2,833,827, German Patents 2,904, 626, 3,604,580, and 3,604,581, JP-A-7-28237, and JP-A-8-27102; the selenonium salts described in, e.g., J. V. Crivello et al., *Macromorecules*, 10 (6), 1307 (1977) and J. V. Crivello et. al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p.478 Tokyo, October (1988). Examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; the photo-acid generators having an o-nitrobenzyl type protective group described in, e.g., S. Hayase et al., *J. Polymer Sci.*, 25, 753 (1987), E. Reichmanis et al., *J. Pholymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichman et al., *J. Electrochem. Soc., Solid State Sci. Technol.*, 130 (6), F. M. Houlihan et al., *Macromolecules*, 21, 2001 (1988), European Patents 0,290, 750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates and the like described in, e.g., M. Tunooka et al., *Polymer Preprints*, Japan, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints*, Japan, 37 (3), European Patents 0,199, 672, 84,515, 044,115, 618,564, and 0,101,122, U.S. Pat. Nos. 4,371,605 and 4,431,774, JP-A-64-18143, JP-A-2-245756, and JP-A-3-140109; the disulfone compounds described in, e.g., JP-A-61-166544 and JP-A-2-71270; and the diazoketosulfone and diazodisulfone compounds described in, e.g., JP-A-3-103854, JP-A-3-103856, and JP-A-4-210960.

Furthermore, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712.

Among the compounds enumerated above which generate an acid upon irradiation with actinic rays or a radiation, especially effective compounds are explained below.

(1) Trihalomethyl-substituted oxazole derivatives represented by the following general formula (PAG1) and trihalomethyl-substituted s-triazine derivatives represented by the following general formula (PAG2).

(PAG1)

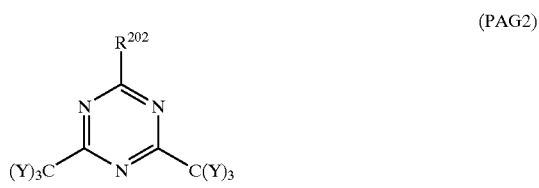

(PAG2)

In the above formulae, $R^{201}$ represents a substituted or unsubstituted aryl or alkenyl group; $R^{202}$ represents a substituted or unsubstituted aryl, alkenyl, or alkyl group or $-C(Y)_3$; and Y represents a chlorine or bromine atom.

Specific examples thereof are given below, but the compounds represented by general formula (PAG1) or (PAG2) should not be construed as being limited thereto.

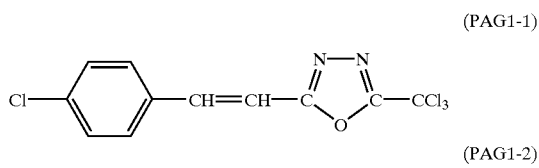

(PAG1-1)

(PAG1-2)

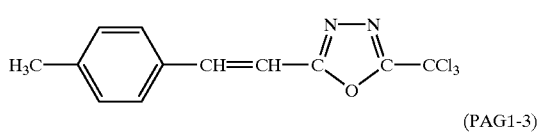

(PAG1-3)

(PAG1-4)

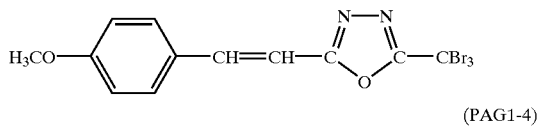

(PAG1-5)

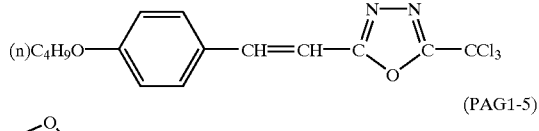

(PAG1-6)

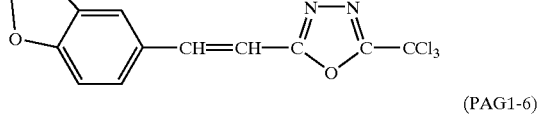

(PAG1-7)

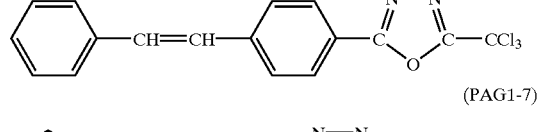

(PAG1-8)

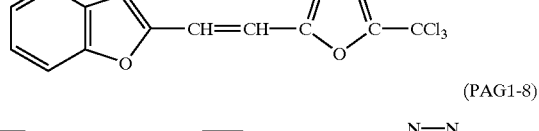

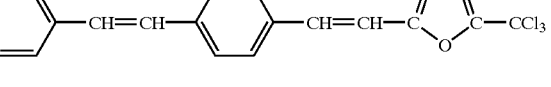

-continued
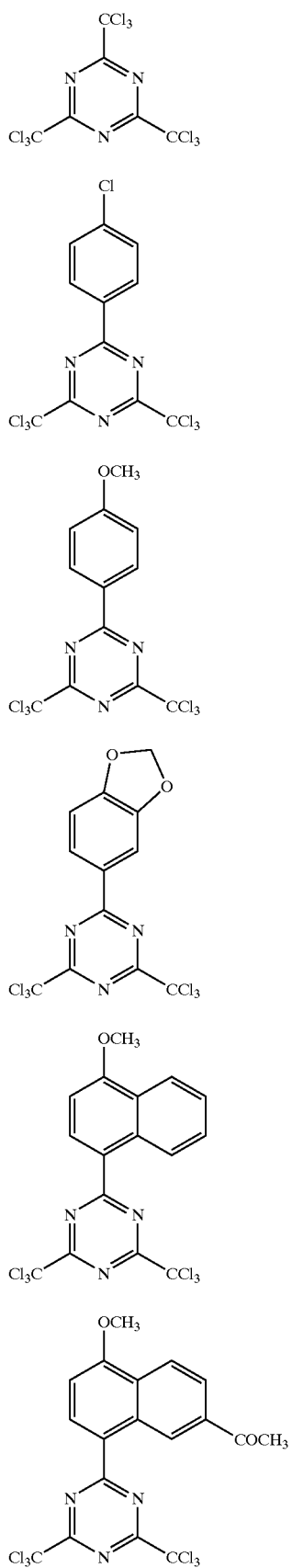
(PAG2-1)
(PAG2-2)
(PAG2-3)
(PAG2-4)
(PAG2-5)
(PAG2-6)
-continued
(PAG2-7)
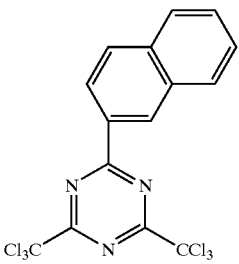
(PAG2-8)
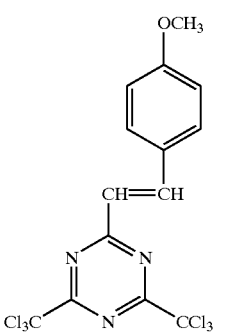
(PAG2-9)
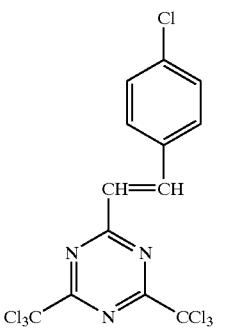
(PAG2-10)
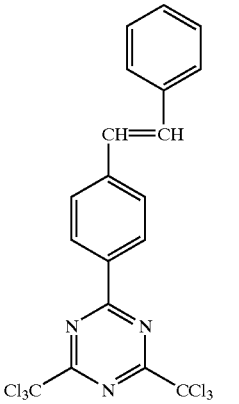
(2) Iodonium salts represented by the following general formula (PAG3) and sulfonium salts represented by the following general formula (PAG4).
(PAG3)
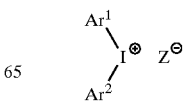

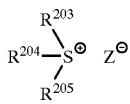
(PAG4)

In the above formulae, Ar1 and Ar2 each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative of either. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion. Examples thereof include perfluoroalkanesulfonate anions, pentafluorobenzenesulfonate anions, sulfonate anions of fused aromatics such as a naphthalene-1-sulfonate anion, anthraquinonesulfonate anions, and dyes containing a sulfonate group. Specific examples thereof include $BF_4^-$, $AsF_6^-$, $PF_6^-$, $SbF_6^-$, $SiF_6^{2-}$, $ClO_4^-$, and $CF_3SO_3^-$. However, $Z^-$ is not limited to these.

Two of $R^{203}$, $R^{204}$, and $R^{205}$ may be bonded to each other through a single bond or substituent thereof. $Ar^1$ and $Ar^2$ may be bonded to each other likewise.

Specific examples of the compounds represented by general formulae (PAG3) and (PAG4) are given below, but the compounds should not be construed as being limited thereto.

(PAG3-1)
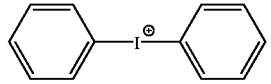

(PAG3-2)
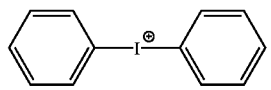

(PAG3-3)
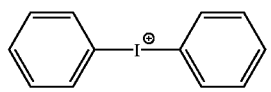

(PAG3-4)
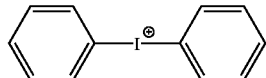

(PAG3-5)
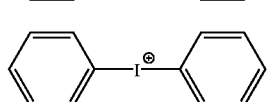

(PAG3-6)

(PAG3-7)
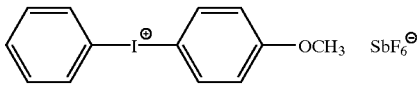

(PAG3-8)
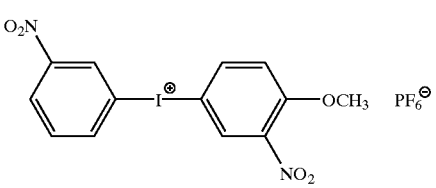

(PAG3-9)

(PAG3-10)
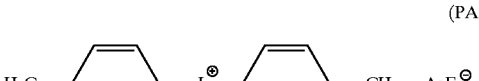

(PAG3-11)
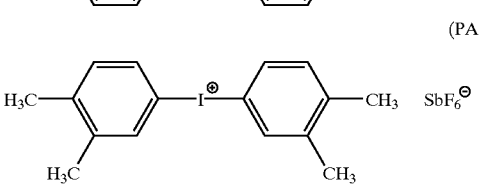

(PAG3-12)
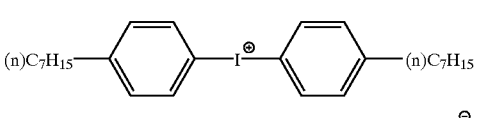

(PAG3-13)
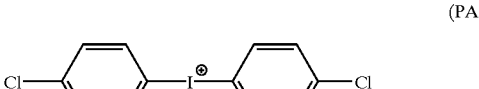

(PAG3-14)

(PAG3-15)
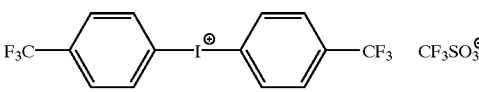

(PAG3-16)
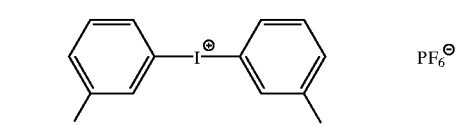

(PAG3-17)
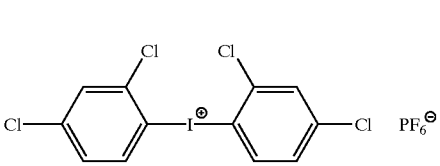

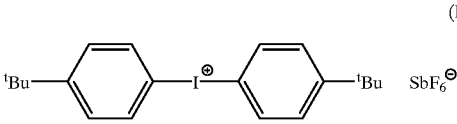

-continued (PAG3-18)
(PAG3-19)
(PAG3-20)
(PAG3-21)
(PAG3-22)
(PAG3-23)
(PAG3-24)
(PAG3-25)
(PAG3-26)
(PAG3-27)
(PAG3-28)
(PAG3-29)
(PAG4-1)
(PAG4-2)
(PAG4-3)

-continued
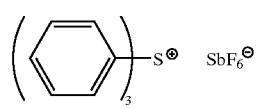 (PAG4-4)
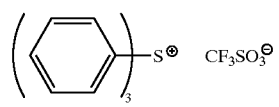 (PAG4-5)
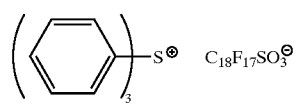 (PAG4-6)
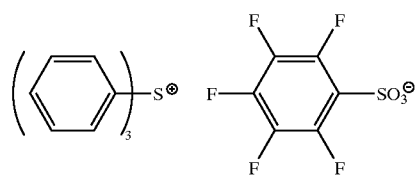 (PAG4-7)
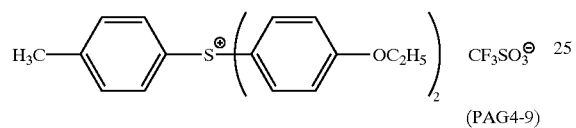 (PAG4-8)
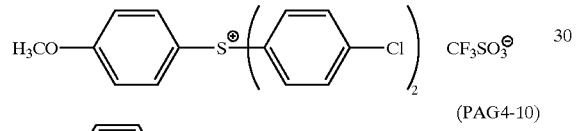 (PAG4-9)
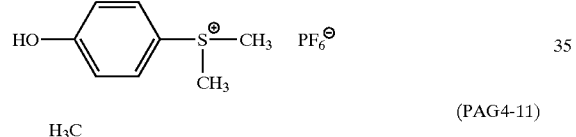 (PAG4-10)
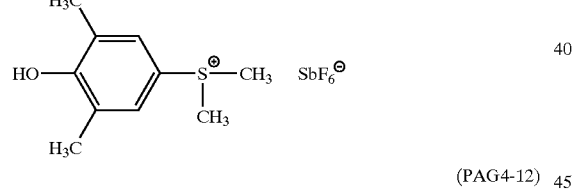 (PAG4-11)
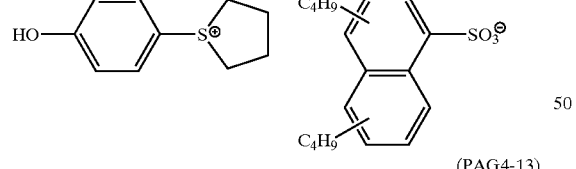 (PAG4-12)
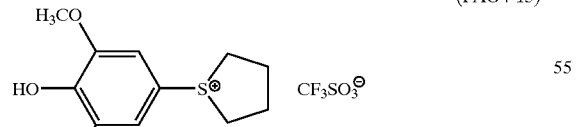 (PAG4-13)
 (PAG4-14)
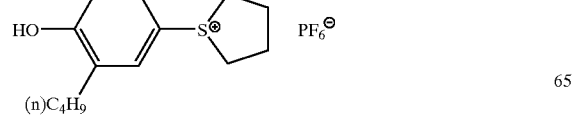
-continued
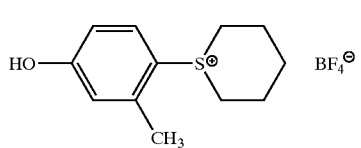 (PAG4-15)
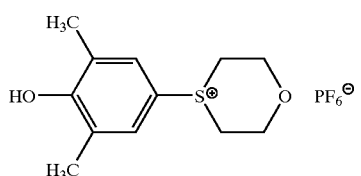 (PAG4-16)
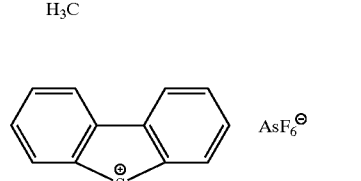 (PAG4-17)
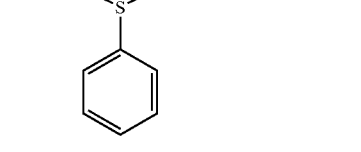 (PAG4-18)
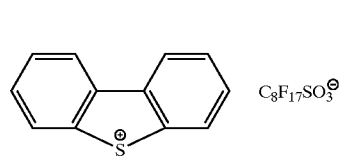 (PAG4-19)
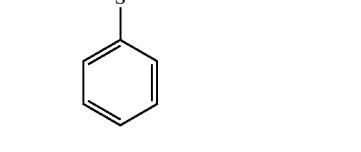 (PAG4-20)
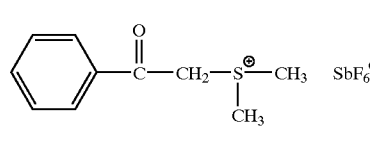 (PAG4-21)
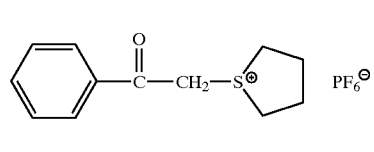 (PAG4-22)
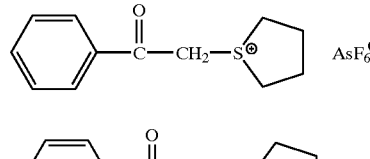 (PAG4-23)
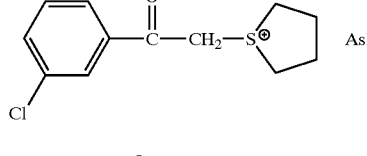
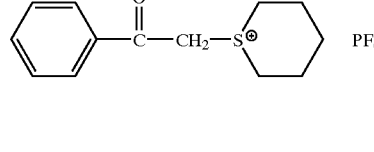

(PAG4-24)
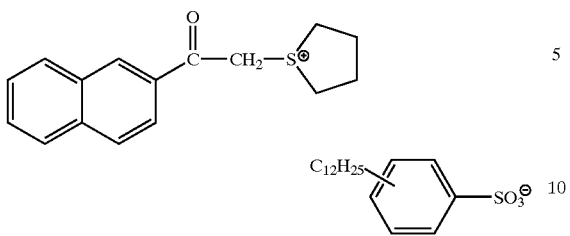
(PAG4-25)
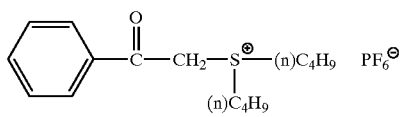
(PAG4-26)
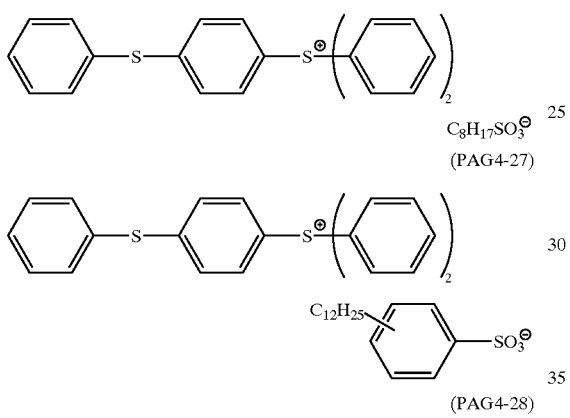
(PAG4-27)
(PAG4-28)
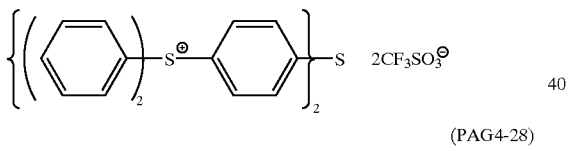
(PAG4-28)
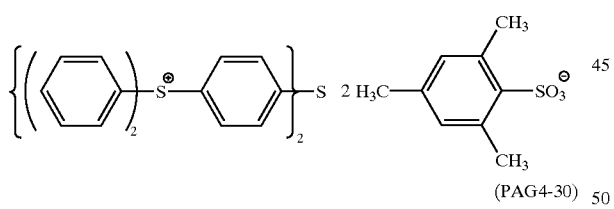
(PAG4-30)
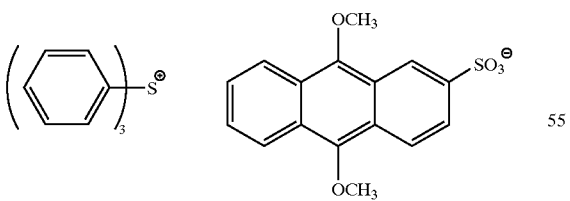
(PAG4-31)
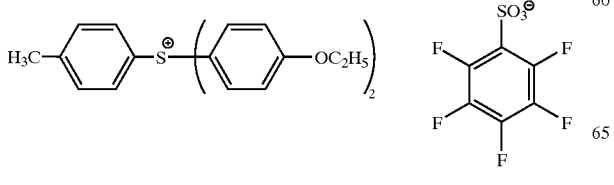
(PAG4-32)
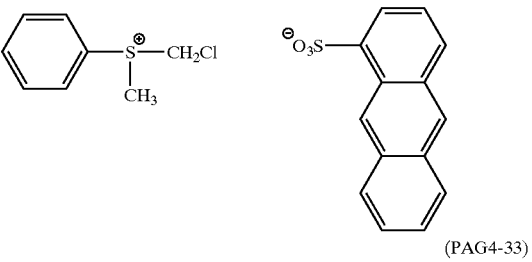
(PAG4-33)
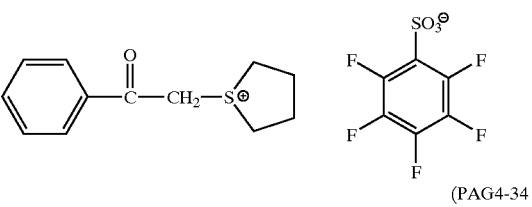
(PAG4-34)
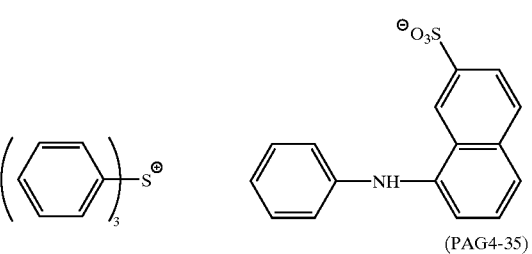
(PAG4-35)
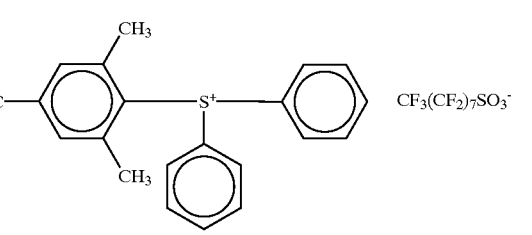
(PAG4-36)
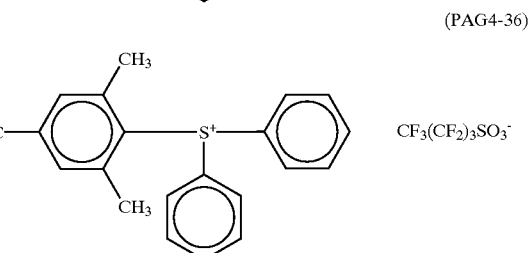
(PAG4-37)
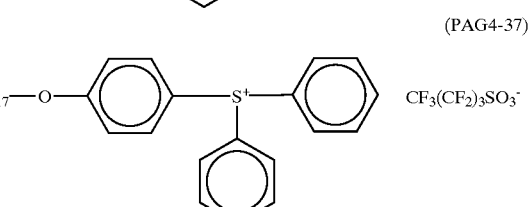
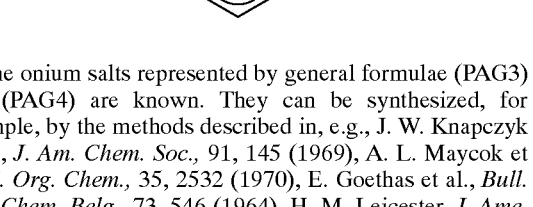
The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

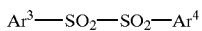
(PAG5)

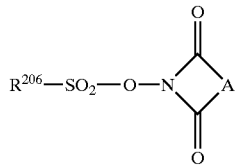
(PAG6)

In the above formulae, $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene, or arylene group.

Specific examples thereof are given below, but the compounds represented by general formula (PAG5) or (PAG6) should not be construed as being limited thereto.

(PAG5-1)
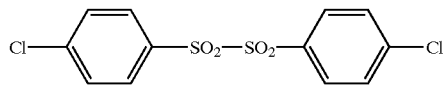

(PAG5-2)
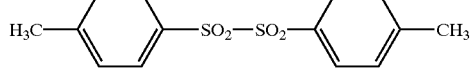

(PAG5-3)
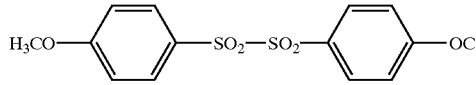

(PAG5-4)
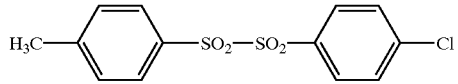

(PAG5-5)
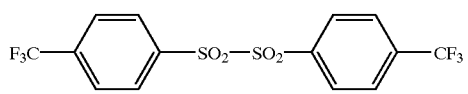

(PAG5-6)
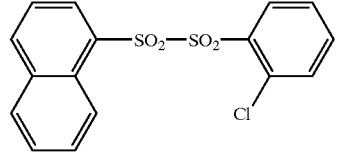

(PAG5-7)
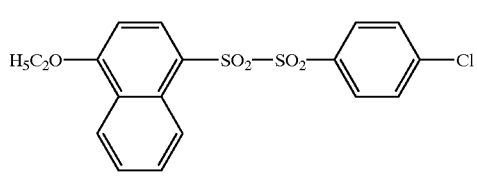

(PAG5-8)
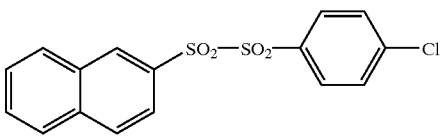

(PAG5-9)
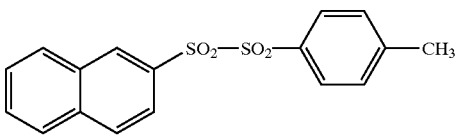

(PAG5-10)
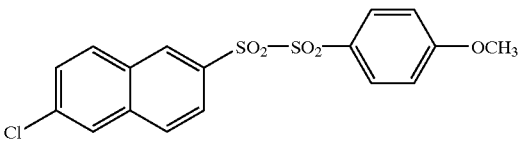

(PAG5-11)
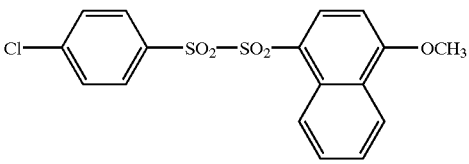

(PAG5-12)
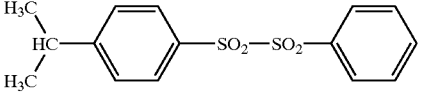

(PAG5-13)
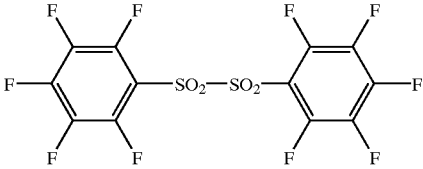

(PAG5-14)
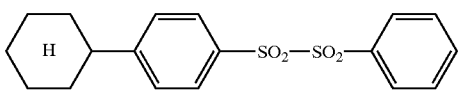

(PAG5-15)
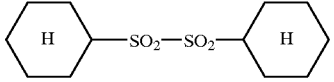

(PAG6-1)
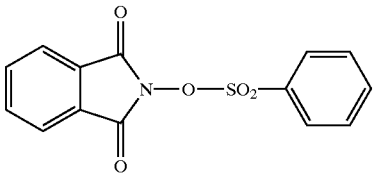

(PAG6-2)
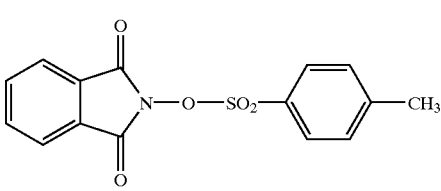

(PAG6-3)
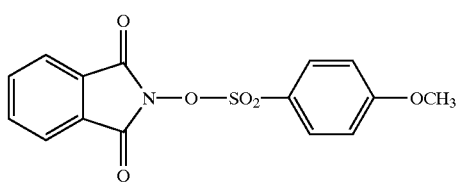
(PAG6-4)
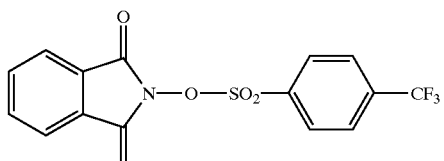
(PAG6-5)
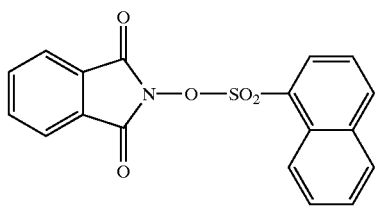
(PAG6-6)
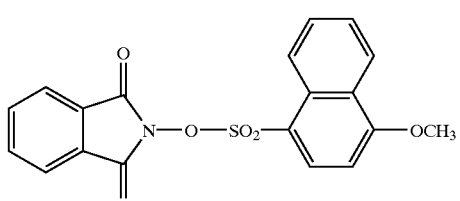
(PAG6-7)
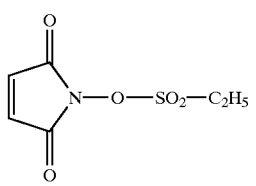
(PAG6-8)
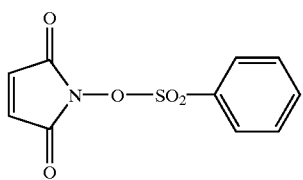
(PAG6-9)
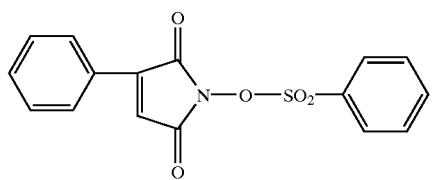
(PAG6-10)
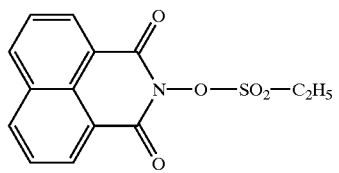
(PAG6-11)
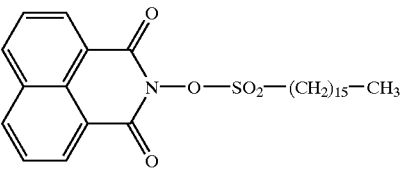
(PAG6-12)
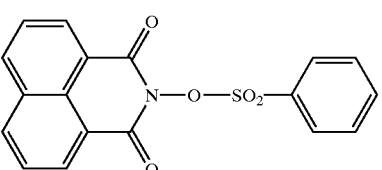
(PAG6-13)
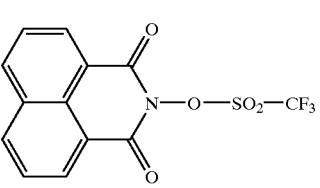
(PAG6-14)
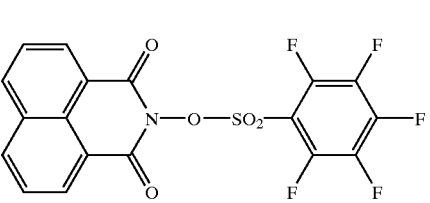
(PAG6-15)
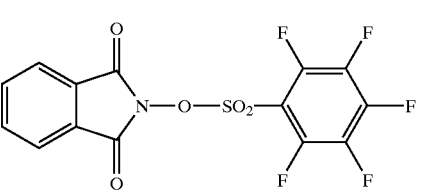
(PAG6-16)
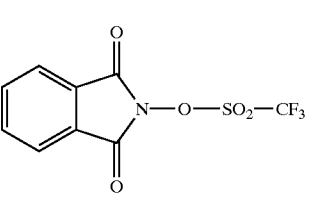
PAG6-17)
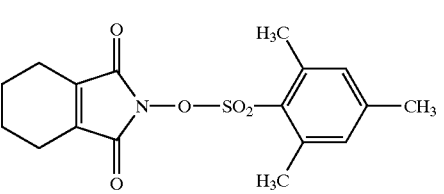
(PAG6-18)
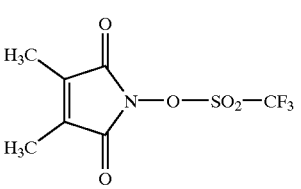

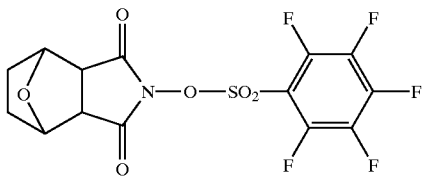
(PAG6-19)

In the resist composition according to the first aspect of the present invention, these compounds which decompose and generate an acid upon irradiation with actinic rays or a radiation are used in an addition amount of generally from 0.001 to 20 wt %, preferably from 0.01 to 10 wt %, more preferably from 0.1 to 5 wt %, based on the total amount of the resist composition (excluding the solvent). If the addition amount of the compounds which decompose and generate an acid upon irradiation with actinic rays or a radiation is smaller than 0.001 wt %, the result is too low sensitivity. On the other hand, addition amounts thereof larger than 40 wt % are also undesirable in that the resist shows too intense light absorption, resulting in an impaired profile and a narrowed margin for processing (especially baking).

In the resist composition according to the second aspect of the present invention, those compounds which decompose and generate an acid upon irradiation with actinic rays or a radiation are used in an addition amount of generally from 0.001 to 40 wt %, preferably from 0.01 to 20 wt %, more preferably from 0.1 to 5 wt %, based on the total amount of the resist composition (excluding the solvent). If the addition amount of the compounds which decompose and generate an acid upon irradiation with actinic rays or a radiation is smaller than 0.001 wt %, the result is too low sensitivity. On the other hand, addition amounts thereof larger than 40 wt % are also undesirable in that the resist shows too intense light absorption, resulting in an impaired profile and a narrowed margin for processing (especially baking).

The positive resist compositions of the first and second aspects according to the present invention may optionally further contain other ingredients such as acid-decomposable dissolution inhibitive compounds, dyes, plasticizers, surfactants, photosensitizers, organic basic compounds, and compounds which accelerate dissolution in a developing solution.

For application to a substrate, the positive resist compositions of the present invention are used in the form of a solution in a solvent in which the ingredients described above dissolve. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture of two or more thereof.

More preferred of these solvents are 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone, and tetrahydrofuran.

Surfactants can be added to the solvent. Examples of the surfactants include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants such as F-Top EF301, EF303, and EF352 (manufactured by New Akita Chemical Company), Megafac F171 and F173 (manufactured by Dainippon Ink & Chemicals, Inc.), Fluorad FC430 and FC431 (manufactured by Sumitomo 3M Ltd.), and Asahi Guard AG710 and Surflon S-382, SC101, SC102, SC103, SC104, SC105, and SC106 (manufactured by Asahi Glass Co., Ltd.); organosiloxane polymer KP341 (manufactured by Shin-Etsu Chemical Co., Ltd.); and acrylic or methacrylic (co) polymers Polyflow No. 75 and No. 95 (manufactured by Kyoeisha Chemical Co., Ltd.). The incorporation amount of these surfactants is generally 2 parts by weight or smaller, preferably 1 part by weight or smaller, per 100 parts by weight of the solid components of each resist composition of the present invention.

These surfactants may be added alone or in combination of two or more thereof.

The positive resist compositions of the present invention described above are applied to a substrate to form a thin film. The thickness of this coating film is preferably from 0.4 to 1.5 μm.

A satisfactory resist pattern can be obtained by applying each resist composition described above on a substrate such as those for use in the production of precision integrated-circuit elements (e.g., silicon/silicon dioxide coating) by an appropriate coating means, e.g., a spinner or coater, exposing the coating to light through a given mask, and then baking and developing the coating. Preferred examples of the exposure light include lights having a wavelength of from 150 to 250 nm. Specific examples thereof include KrF excimer laser light (248 nm), ArF excimer laser light (193 nm), $F_2$ excimer laser light (157 nm), X-rays, and electron beams. The post-exposure bake is conducted at a temperature of preferably from 80 to 180° C., more preferably from 85 to 160° C., most preferably from 90 to 150° C.

As a developing solution, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The alkaline aqueous solution for use as a developing solution may contain an appropriate amount of an alcohol and a surfactant.

The present invention will be explained below in more detail by reference to Examples, but the invention should not be construed as being limited thereto.

Synthesis of Photo-acid Generator (PAG 4-35)

In 800 mL of mesitylene was dissolved 50 g of diphenyl sulfoxide. Thereto was added 200 g of aluminum chloride. This mixture was stirred at 80° C. for 24 hours. After completion of the reaction, the reaction mixture was gradually poured on 2 L of ice. Thereto was added 400 mL of concentrated hydrochloric acid. This mixture was heated at 70° C. for 10 minutes. The resultant reaction mixture was cooled to room temperature, washed with ethyl acetate, and then filtered. A solution of 200 g of ammonium iodide in 400 mL of distilled water was added to the filtrate. The particles thus precipitated were taken out by filtration, washed with water and ethyl acetate, and then dried to obtain 72 g of a sulfonium iodide.

In 300 mL of methanol was dissolved 50 g of the sulfonium iodide obtained above. Thereto was added 31 g of silver oxide. This mixture was stirred for 4 hours. The resultant reaction mixture was filtered and then subjected to salt exchange with potassium heptadecafluorooctanesulfonate to recover 40 g of the target compound (PAG 4-35).

Synthesis of Monomers (1) Synthesis of Monomer (1)

In 100 mL of 1,3-dioxolane were dissolved 121 g of 1-methoxy-2-propanol and 182 g of styrenesulfonyl chloride. Thereto was dropwise added 142 g of pyridine over 2 hours with cooling on an ice bath. After completion of the addition, the ice bath was removed and the reaction mixture was stirred for 6 hours. The resultant reaction mixture was poured into 2 L of ice water to conduct crystallization, followed by extraction with ethyl acetate. The solvent was distilled off at a reduced pressure and the resultant oily residue was purified by silica gel column chromatography to obtain 103 g of monomer (1) as the target compound.

(2) Synthesis of Monomer (2)

The same procedure as in Synthesis Example (1) was conducted, except that tetrahydropyranol was used in place of the 1-methoxy-2-propanol. Thus, monomer (2) was synthesized.

(3) Synthesis of Monomer (5)

The same procedure as in Synthesis Example (1) was conducted, except that menthol was used in place of the 1-methoxy-2-propanol. Thus, monomer (5) was synthesized.

(4) Synthesis of Monomer (15)

The same procedure as in Synthesis Example (1) was conducted, except that the sulfonyl chloride of 2-acrylamido-2-methylpropanesulfonic acid (AMPS) was used in place of the styrenesulfonyl chloride. Thus, monomer (15) was synthesized.

(5) Synthesis of Monomer (20)

The same procedure as in Synthesis Example (1) was conducted, except that the sulfonyl chloride of AMPS and 2-phenyl-2,2-dimethylethanol were used in place of the styrenesulfonyl chloride and the 1-methoxy-2-propanol, respectively. Thus, monomer (20) was synthesized.

(6) Synthesis of Monomer (21)

The same procedure as in Synthesis Example (1) was conducted, except that the acid chloride of 3-sulfopropyl methacrylate was used in place of the styrenesulfonyl chloride. Thus, monomer (21) was synthesized.

(7) Synthesis of Monomer (24)

The same procedure as in Synthesis Example (6) was conducted, except that cyclohexanol was used in place of the 1-methoxy-2-propanol. Thus, monomer (24) was synthesized.

(8) Synthesis of Monomer (28)

The same procedure as in Synthesis Example (6) was conducted, except that neopentyl alcohol was used in place of the 1-methoxy-2-propanol. Thus, monomer (28) was synthesized.

(9) Synthesis of Monomer (29)

The same procedure as in Synthesis Example (6) was conducted, except that 2-phenyl-2,2-dimethylethanol was used in place of the 1-methoxy-2-propanol. Thus, monomer (29) was synthesized.

(10) Synthesis of Monomer (30)

The same procedure as in Synthesis Example (6) was conducted, except that 2-chlorohexanol was used in place of the 1-methoxy-2-propanol. Thus, monomer (30) was synthesized.

(11) Synthesis of Monomer (13)

Into 100 mL of THF was dispersed 8.5 g of sodium hydride. While this dispersion was kept being cooled at 0° C., 32 g of t-butyl acetoacetate was added dropwise thereto over 1 hour in a nitrogen stream. After completion of the addition, the mixture was stirred for 30 minutes and 40 g of methyl iodide was added dropwise thereto over 1 hour. After, completion of the addition, the mixture was heated to 20° C. over 2 hours and then stirred for 3 hours. After completion of the reaction, 100 mL of an aqueous sodium bicarbonate solution was added dropwise to the reaction mixture, and the resultant mixture was stirred for 1 hour and then extracted with ethyl acetate. The ethyl acetate layer was concentrated to recover t-butyl 2-methylacetoacetate.

The t-butyl 2-methylacetoacetate obtained above was dispersed as it was into a mixture of 30 g of 37% aqueous. formaldehyde solution and 10 mL of 1,3-dioxolane. In a nitrogen stream, the resultant mixture was cooled to 10° C. and 14 g of potassium carbonate was then added thereto in four portions. This mixture was stirred for 5 hours while keeping the reaction temperature at 10 to 20° C. After completion of the reaction, the reaction mixture was extracted with ethyl acetate/water. The ethyl acetate layer was concentrated and the reaction product obtained was purified by silica gel column chromatography to recover 27 g of t-butyl 2-hydroxymethyl-2-methylacetoacetate.

In 1,3-dioxolane were dissolved 11 g of the t-butyl 2-hydroxymethyl-2-methylacetoacetate and 11 g of pyridine. While this solution was kept being cooled at 0° C. in a nitrogen stream, 15 g of styrenesulfonyl chloride was added dropwise thereto over 30 minutes. After completion of the addition, the reaction mixture was stirred for 10 hours and then extracted with ethyl acetate/water. The reaction product obtained was purified by silica gel column chromatography to obtain 13 g of monomer (13) as the target compound.

(12) Synthesis of Monomer (31)

The t-butyl 2-hydroxymethyl-2-methylacetoacetate obtained in the above-described synthesis of monomer (13) was used to synthesize monomer (31) in the same manner as in the synthesis of monomer (13), except that 3-chlorosulfopropyl methacrylate was used in place of styrenesulfonyl chloride.

(13) Synthesis of Monomer (37)

1-Phenyl-1-cyclohexene was oxidized with osmium oxide in an ordinary way to obtain 1-phenyl-1,2-cis-dihydroxycyclohexane. Subsequently, this 1-phenyl-1,2-cis-dihydroxycyclohexane was dissolved in 1.2 equivalents of pyridine. While this solution was kept being cooled at 0° C. on an ice bath, 1.1 equivalent of styrenesulfonyl chloride was added dropwise thereto over 30 minutes. After completion of the addition, the mixture was stirred for 15 hours while keeping the reaction temperature at 0 to 10° C. After completion of the reaction, the reaction mixture was extracted with ethyl acetate and water. The ethyl acetate layer was concentrated and the reaction product obtained was purified by silica gel column chromatography to obtain monomer (37) as the target compound.

(14) Synthesis of Monomer (39)

1-Methyl-1-cyclohexene was oxidized with osmium oxide in an ordinary way to obtain 1-methyl-1,2-cis-dihydroxycyclohexane. Subsequently, this 1-methyl-1,2-cis-dihydroxycyclohexane was dissolved in 1.2 equivalents of pyridine. While this solution was kept being cooled at 0° C. on an ice bath, 1.1 equivalent of 3-chlorosulfopropyl methacrylate was added dropwise thereto over 30 minutes. After completion of the addition, the mixture was stirred for 15 hours while keeping the reaction temperature at 0 to 10° C. After completion of the reaction, the reaction mixture was extracted with ethyl acetate and water. The ethyl acetate layer was concentrated and the reaction product obtained was purified by silica gel column chromatography to obtain monomer (39) as the target compound.

(Resin Syntheses 1)

(1) Synthesis of Resin (i) Shown Above

Into a vessel were introduced t-butoxystyrene and monomer (1) described above in a ratio of 15/1. The monomer mixture was dissolved in an N,N-dimethylacetamide/tetrahydrofuran=2/8 mixed solvent to prepare 100 mL of a solution having a solid concentration of 20%. To this solution was added V-65, manufactured by Wako Pure Chemical Industries, Ltd., in an amount of 1 mol %. In a nitrogen atmosphere, this mixture was added dropwise over 2 hours to 10 mL of tetrahydrofuran heated at 60° C. After completion of the addition, the reaction mixture was heated with stirring for 6 hours. After completion of the reaction, the reaction mixture was cooled to room temperature and then poured into 3 L of methanol to conduct crystallization. The white particles thus precipitated were recovered.

Subsequently, the white particles obtained were hydrolyzed under acidic conditions to eliminate part of the protecting t-butoxy groups. Thus, resin (i) was obtained as the target compound. $^{13}C$ NMR spectrometry revealed that this polymer had a proportion among monomer units of 25/69/6. The polymer had a weight-average molecular weight, as measured by GPC and calculated for standard polystyrene, of 8,100.

(2) Syntheses of Resins (ii) to (xxviii) Shown Above

Resins (ii) to (xxviii) which each had the monomer unit proportions and weight-average molecular weight shown in Table 1 given below were synthesized by conducting the same procedure as in the synthesis of resin (i). In the table, the repeating units 1 to 3 for each resin respectively correspond to the left, middle, and right repeating units, except the unit represented by general formula (I), in the above-described structural formula representing resin examples.

TABLE 1

| Resin | Proportions of repeating units (mol %) | | | | Weight-average molecular weight |
|---|---|---|---|---|---|
| | General formula (I) | Repeating unit 1 | Repeating unit 2 | Repeating unit 3 | |
| (ii) | 6 | 24 | 70 | | 8700 |
| (iii) | 7 | 22 | 71 | | 9600 |
| (iv) | 4 | 24 | 72 | | 8200 |
| (v) | 5 | 21 | 74 | | 8400 |
| (vi) | 8 | 19 | 73 | | 7500 |
| (vii) | 9 | 20 | 51 | 20 | 8300 |
| (viii) | 8 | 22 | 70 | | 8100 |
| (ix) | 10 | 18 | 72 | | 7600 |
| (x) | 4 | 19 | 77 | | 8400 |
| (xi) | 8 | 24 | 68 | | 7700 |
| (xii) | 9 | 25 | 66 | | 7600 |
| (xiii) | 7 | 61 | 32 | | 7100 |
| (xiv) | 8 | 22 | 55 | 15 | 8600 |

TABLE 1-continued

| Resin | Proportions of repeating units (mol %) | | | | Weight-average molecular weight |
|---|---|---|---|---|---|
| | General formula (I) | Repeating unit 1 | Repeating unit 2 | Repeating unit 3 | |
| (xv) | 6 | 10 | 20 | 64 | 5900 |
| (xvi) | 9 | 70 | 21 | | 10900 |
| (xvii) | 6 | 25 | 69 | | 8700 |
| (xviii) | 5 | 60 | 20 | 15 | 8900 |
| (xix) | 7 | 21 | 72 | | 9200 |
| (xx) | 8 | 67 | 25 | | 9100 |
| (xxi) | 4 | 24 | 72 | | 8400 |
| (xxii) | 3 | 21 | 76 | | 9400 |
| (xxiii) | 2 | 25 | 73 | | 8300 |
| (xxiv) | 5 | 21 | 74 | | 8700 |
| (xxv) | 5 | 23 | 62 | 10 | 8500 |
| (xxvi) | 3 | 20 | 77 | | 8800 |
| (xxvii) | 4 | 25 | 51 | 20 | 8900 |
| (xxviii) | 3 | 67 | 30 | | 11400 |

(Resin Syntheses 2)

(1) Synthesis of Resin (I)

Into a vessel were introduced 1-adamantyl acrylate, 3-oxocyclohexyl methacrylate, and monomer (21) described above in a ratio of 48/47/5. The monomer mixture was dissolved in an N,N-dimethylacetamide/tetrahydrofuran=5/5 mixed solvent to prepare 100 mL of a solution having a solid concentration of 20%. To this solution were added V-65, manufactured by Wako Pure Chemical Industries, Ltd., and mercaptoethanol in amounts of 3 mol % and 6 mol %, respectively. In a nitrogen atmosphere, this mixture was added dropwise over 3 hours to 10 mL of tetrahydrofuran heated at 60° C. After completion of the addition, the reaction mixture was heated with stirring for 6 hours. After completion of the reaction, the reaction mixture was cooled to room temperature and then poured into 3 L of methanol to conduct crystallization. The white particles thus precipitated were recovered.

$^{13}C$ NMR spectrometry revealed that this resin (I) thus obtained had a proportion among monomer units of 48/47/5. The polymer had a weight-average molecular weight, as measured by gel permeating chromatography (GPC) and calculated for standard polystyrene, of 8,600.

(2) Syntheses of Resins (II) to (XVI)

Resins (II) to (XVI) which each had the structure shown below and had the monomer unit proportions and weight-average molecular weight shown in Table 2 given below were synthesized by conducting the same procedure as in the synthesis of resin (I). In the table, the repeating units 1 and 2 for each resin respectively correspond to the left and right repeating units, except the unit represented by general formula (I), in the following structural formula representing the resin.

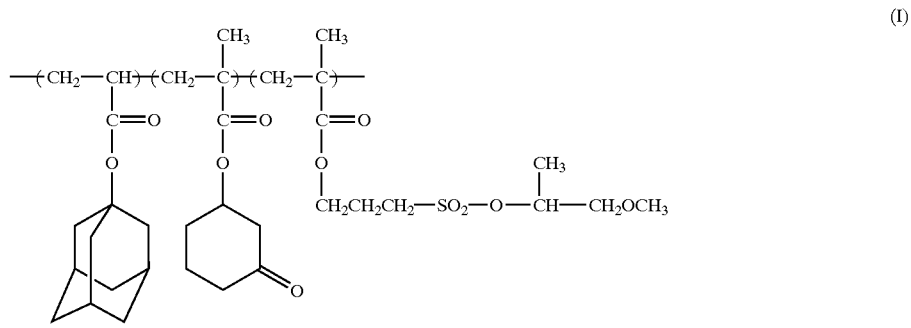
(I)
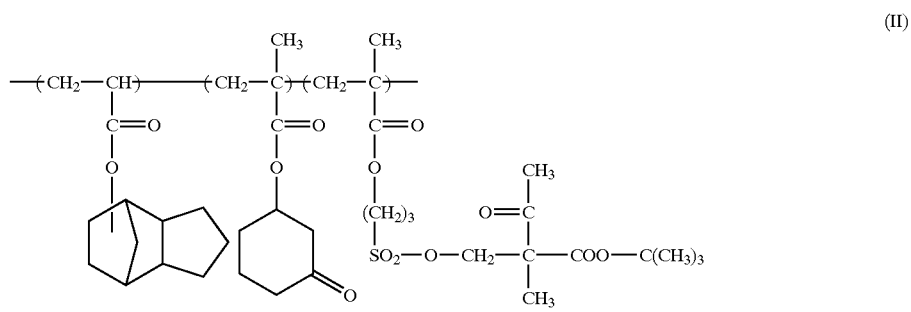
(II)
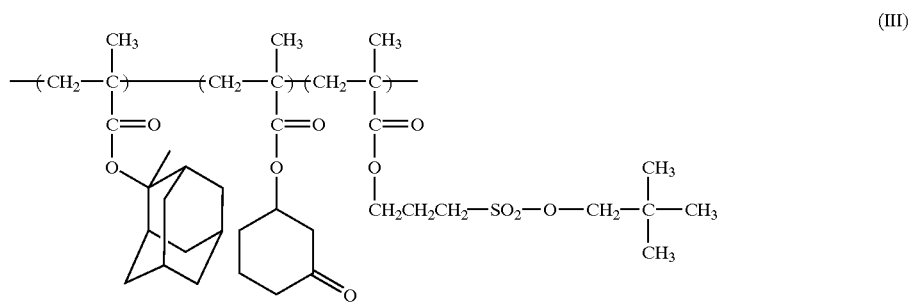
(III)
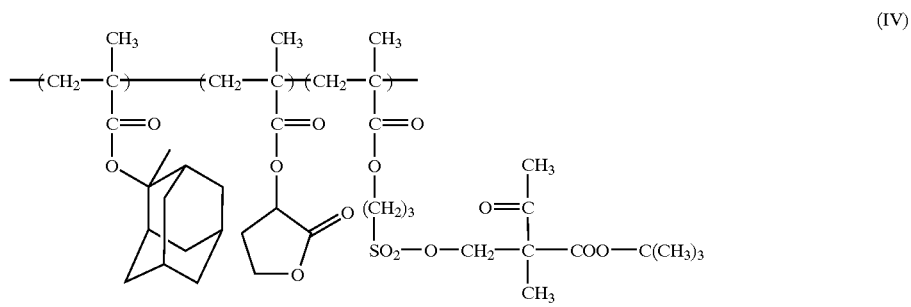
(IV)
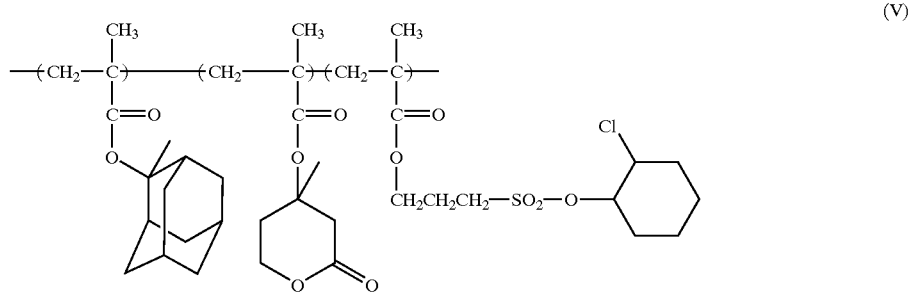
(V)

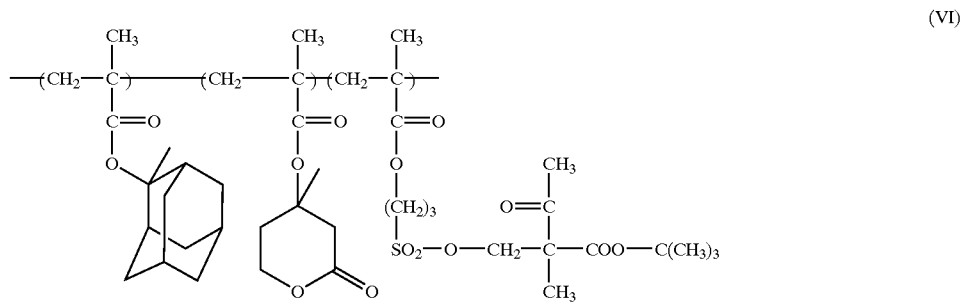
(VI)
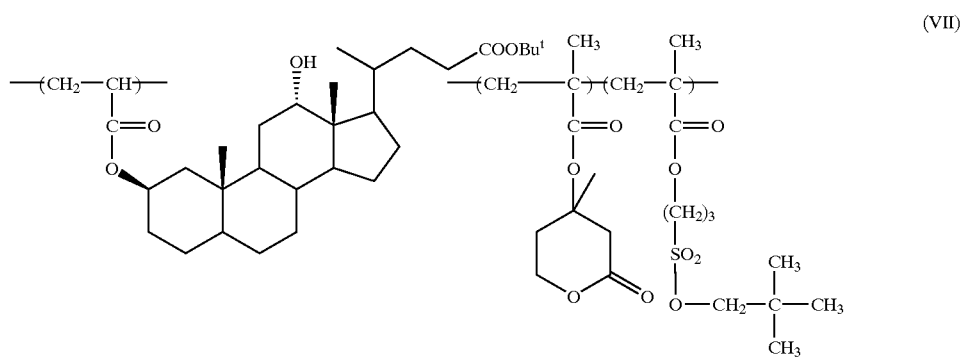
(VII)
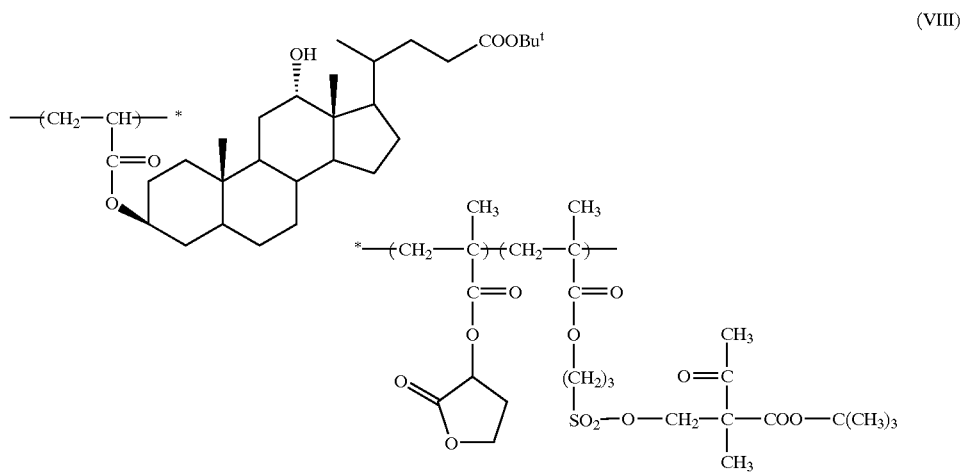
(VIII)
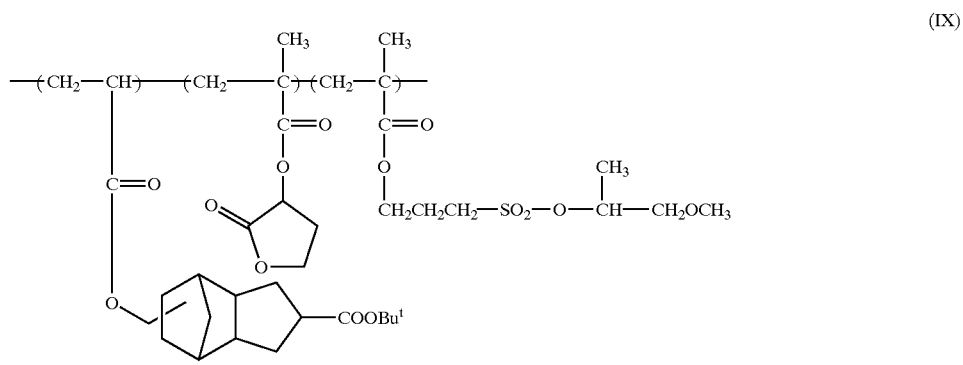
(IX)

-continued
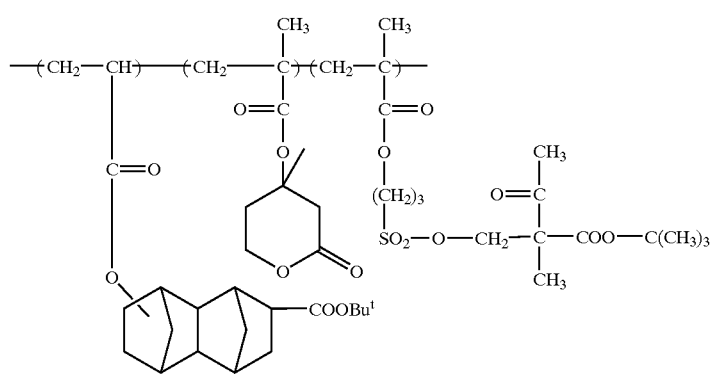
(X)
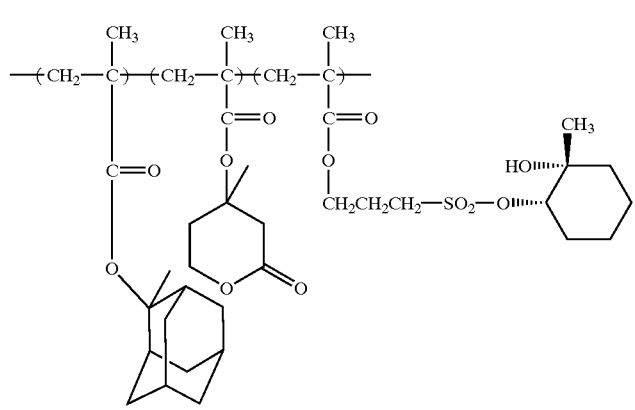
(XI)
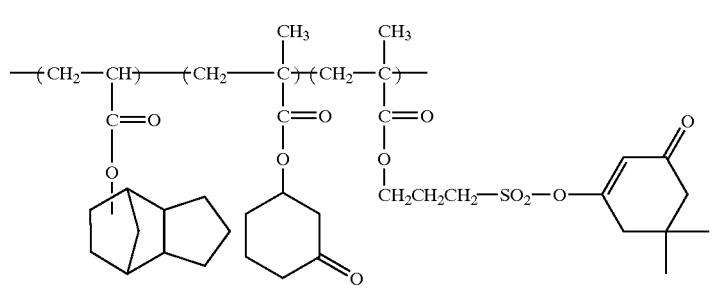
(XII)
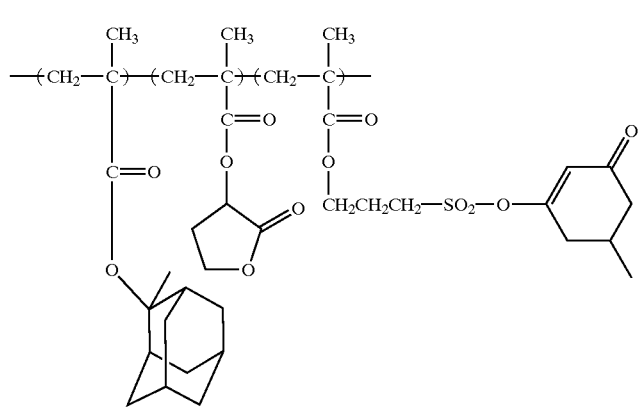
(XIII)

-continued

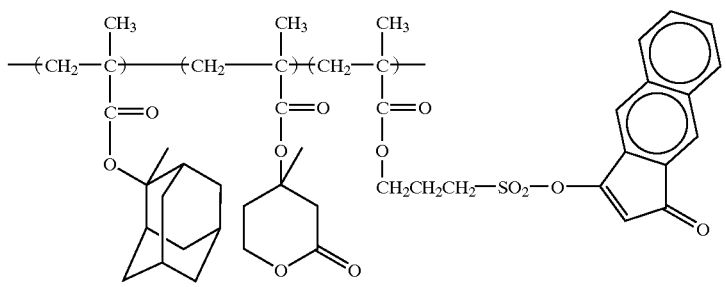
(XIV)

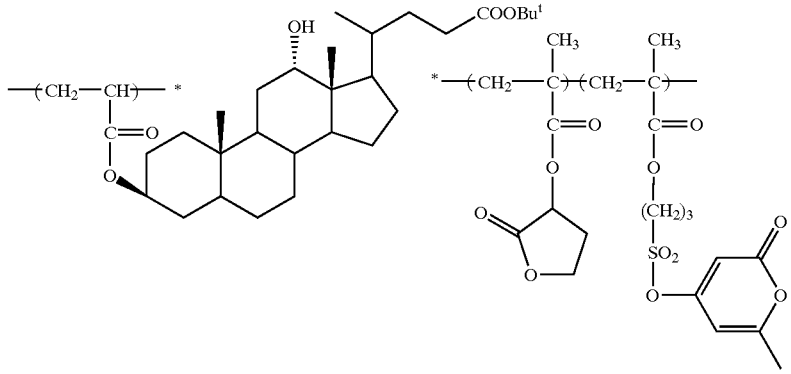
(XV)

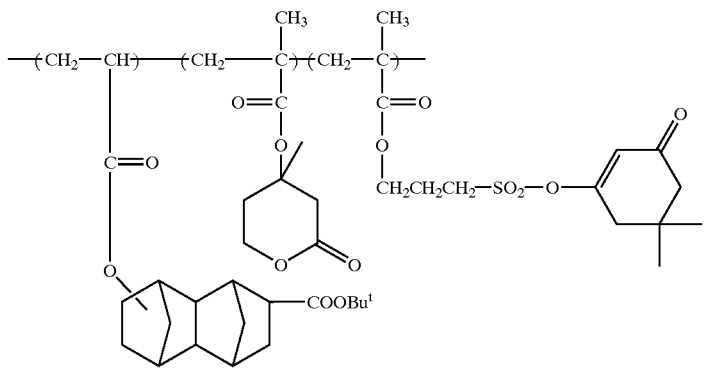
(XVI)

TABLE 2

| Resin | Proportions of repeating units (mol %) General formula (I) | Repeating unit 1 | Repeating unit 2 | Weight-average molecular weight |
|---|---|---|---|---|
| (II) | 8 | 49 | 43 | 7300 |
| (III) | 6 | 48 | 46 | 7200 |
| (IV) | 7 | 50 | 43 | 7700 |
| (V) | 4 | 49 | 47 | 6800 |
| (VI) | 5 | 48 | 47 | 6900 |
| (VII) | 6 | 42 | 52 | 9400 |
| (VIII) | 5 | 41 | 54 | 10100 |
| (IX) | 4 | 52 | 44 | 10700 |
| (X) | 5 | 48 | 47 | 9600 |
| (XI) | 6 | 47 | 47 | 8100 |
| (XII) | 2 | 47 | 51 | 7200 |
| (XIII) | 2 | 48 | 50 | 7600 |
| (XIV) | 3 | 53 | 44 | 7400 |
| (XV) | 3 | 42 | 55 | 10500 |
| (XVI) | 3 | 43 | 54 | 9900 |

EXAMPLES 1 TO 28 AND COMPARATIVE EXAMPLE 1

Preparation and Evaluation of Photosensitive Compositions

To 2 g of each of the resins shown in Tables 3 and 4 were added 0.04 g of photo-acid generator (PAG 3-1) described above and 0.02 g of 4-dimethylaminopyridine. Each mixture was dissolved in 9.5 g of propylene glycol monomethyl ether acetate, and the resultant solution was filtered through a 0.2-μm filter. Thus, positive resist compositions were prepared.

TABLE 3

| | Resin | Defocus latitude depended on line pitch | Sensitivity |
|---|---|---|---|
| Example 1 | i | 1.0 μm | 1.0 |
| Example 2 | ii | 1.0 μm | 0.8 |
| Example 3 | iii | 1.1 μm | 0.6 |

TABLE 3-continued

|  | Resin | Defocus latitude depended on line pitch | Sensitivity |
| --- | --- | --- | --- |
| Example 4 | iv | 1.0 μm | 0.7 |
| Example 5 | v | 1.0 μm | 0.8 |
| Example 6 | vi | 1.0 μm | 0.9 |
| Example 7 | vii | 1.1 μm | 0.7 |
| Example 8 | viii | 1.1 μm | 0.7 |
| Example 9 | ix | 1.0 μm | 1.0 |
| Example 10 | x | 1.0 μm | 1.0 |
| Example 11 | xi | 0.9 μm | 1.1 |

TABLE 4

|  | Resin | Defocus latitude depended on line pitch | Sensitivity |
| --- | --- | --- | --- |
| Example 12 | xii | 0.9 μm | 1.1 |
| Example 13 | xiii | 0.9 μm | 1.0 |
| Example 14 | xiv | 1.0 μm | 0.9 |
| Example 15 | xv | 0.9 μm | 1.0 |
| Example 16 | xvi | 1.1 μm | 0.8 |
| Example 17 | xvii | 1.0 μm | 0.9 |
| Example 18 | xviii | 0.9 μm | 0.9 |
| Example 19 | xix | 1.0 μm | 0.7 |
| Example 20 | xx | 1.0 μm | 0.7 |
| Example 21 | xxi | 1.0 μm | 0.9 |
| Example 22 | xxii | 1.1 μm | 0.7 |
| Example 23 | xxiii | 1.0 μm | 0.7 |
| Example 24 | xxiv | 1.0 μm | 0.7 |
| Example 25 | xxv | 1.1 μm | 0.7 |
| Example 26 | xxvi | 1.0 μm | 0.8 |
| Example 27 | xxvii | 1.0 μm | 0.8 |
| Example 28 | xxviii | 1.1 μm | 0.8 |
| Comparative Example 1 | R1 | 0.5 μm | 2.5 |

Evaluation Test

These resist compositions each was applied to a silicon wafer with a spin coater, and the coating was dried at 90° C. for 90 seconds with a vacuum suction type hot plate to obtain a resist film having a thickness of 0.83 μm.

These resist films were exposed to light using a 248-nm KrF excimer laser stepper (NA=0.42). Immediately after the exposure, the resist films each was heated with a 110° C. vacuum suction type hot plate for 60 seconds, subsequently immersed for 60 seconds in a 2.38% aqueous solution of tetramethylammonium hydroxide (TMAH), rinsed with water for 30 seconds, and then dried. The thus-obtained resist patterns on silicon wafers were examined for profile.

These resist patterns were evaluated for defocus latitude depended on line pitch, sensitivity, and development residue by the following methods.

Defocus Latitude Depended on Line Pitch

In each of a line-and-space pattern (a pattern having densely disposed lines) and an isolated-line pattern (a pattern having thinly disposed lines) each having a line width of 0.25 μm, the focus latitude overlap range having a tolerance of 0.25 μm±10% was determined. The larger the range, the better the defocus latitude depended on line pitch.

Sensitivity

Sensitivity was expressed in terms of exposure amount necessary for reproducing a pattern having a line width of 0.25 μm, and values of such sensitivity are given as relative values, with the sensitivity value for Example 1 being 1.

The results of these evaluations are shown in Tables 3 and 4.

In Comparative Example 1, a positive resist composition was prepared and evaluated in the same manner as in Example 1, except that resin R1, which is the above-described resin (i) containing no repeating units having a group represented by general formula (I) and had a monomer unit ratio of 21:79 and a weight-average molecular weight of 8,800, was synthesized in the same manner as in the synthesis of resin (i).

As apparent from the results given in Tables 3 and 4, the resist composition of the Comparative Example was insufficient in both defocus latitude depended on line pitch and sensitivity. In contrast, the positive resist compositions according to the present invention were on a satisfactory level with respect to each of these performances. Furthermore, the patterns formed in the evaluation of defocus latitude depended on line pitch were examined with a scanning electron microscope for a development residue. As a result, each of the patterns formed from the positive resist compositions of the present invention did not have a development residue at all, whereas a development residue was observed on the pattern formed from the composition of the Comparative Example. Namely, the resist compositions of the invention were suitable for use in lithography using far ultraviolet rays including KrF excimer laser light.

EXAMPLES 29 TO 44 AND COMPARATIVE EXAMPLE 2

To 1.4 g of each of the resins shown in Table 5 synthesized in Synthesis Examples given above were added 0.18 g of a photo-acid generator and 10 mg of 1,5-diazabicyclo[4.3.0]-5-nonene (DBN). Each mixture was dissolved in propylene glycol monoethyl ether acetate in a solid concentration of 14 wt %. These solutions were filtered through a 0.1-μm microfilter to prepare positive resist compositions of Examples 29 to 44.

In Comparative Example 2, a positive resist composition was prepared in the same manner as in Examples 29 to 44, except that the following resin R2 was used together with a photo-acid generator.

Resin R2

Resin R2 was synthesized according to the synthesis method described in JP-A-9-90637, page (18), Example 13. Namely, a (±)-mevalonolactone methacrylate/2-methyl-2-adamantyl methacrylate copolymer was synthesized in the following manner.

Into a sufficiently dried, 100-mL eggplant type flask containing a Teflon™-coated stirrer bar were introduced 4.96 g (25 mmol) of (±)-mevalonolactone methacrylate, 5.87 g (25 mmol) of 2-methyl-2-adamantyl methacrylate, 16.7 mL of dioxane, and 1.23 g (9 mmol) of azobisisobutyronitrile (AIBN). The contents were stirred in a nitrogen atmosphere at 80° C. for 8 hours. The reaction mixture was diluted with tetrahydrofuran (THF) and then dropped into 1 L of methanol containing a small amount of hydroquinone. The resultant precipitate was taken out by filtration with a glass filter and dried at 0.1 mmHg and 45° C. for 16 hours. The white powder obtained was dissolved in THF and the same precipitation/drying operation as described above was repeatedly conducted twice to obtain the target copolymer as a white powder. Yield=7.44 g (68.7%). The copolymer obtained had a lactone/adamantyl copolymerization ratio of 46.5/53.5, a weight-average molecular weight (calculated for standard polystyrene) of 14,000, and a dispersion degree of 2.0.

TABLE 5

|  | Resin | Photo-acid generator | Defocus latitude depended on line pitch | Sensitivity |
|---|---|---|---|---|
| Example 29 | I | PAG-1 | 0.8 μm | 1.0 |
| Example 30 | II | PAG-2 | 0.8 μm | 1.0 |
| Example 31 | III | PAG-1 | 1.1 μm | 0.9 |
| Example 32 | IV | PAG-1 | 1.1 μm | 0.7 |
| Example 33 | V | PAG-1 | 1.2 μm | 0.9 |
| Example 34 | VI | PAG-1 | 1.2 μm | 0.6 |
| Example 35 | VII | PAG-2 | 0.9 μm | 0.9 |
| Example 36 | VIII | PAG-2 | 0.9 μm | 0.8 |
| Example 37 | IX | PAG-2 | 0.9 μm | 0.9 |
| Example 38 | X | PAG-1 | 0.9 μm | 0.8 |
| Example 39 | XI | PAG-1 | 1.1 μm | 0.7 |
| Example 40 | XII | PAG-1 | 0.8 μm | 1.0 |
| Example 41 | XIII | PAG-2 | 1.1 μm | 0.7 |
| Example 42 | XIV | PAG-1 | 1.2 μm | 0.9 |
| Example 43 | XV | PAG-1 | 0.9 μm | 0.8 |
| Example 44 | XVI | PAG-2 | 0.9 μm | 0.8 |
| Comparative Example 2 | R2 | PAG-1 | 0.2 μm | 2.3 |

In Table 5, PAG-1 represents triphenylsulfonium triflate and PAG-2 represents (PAG 4-35) synthesized above.

Evaluation Test

Each of the positive photoresist compositions obtained was applied to a silicon wafer with a spin coater, and the coating was dried at 130° C. for 90 seconds to form a positive photoresist film having a thickness of about 0.5 μm. These photoresist films were exposed with an ArF excimer laser (exposed using a stepper having a wavelength of 193 nm and an NA of 0.55). After the exposure, the resist films were heated at 130° C. for 90 seconds, developed with a 2.38% aqueous solution of tetramethylammonium hydroxide, and then rinsed with distilled water to obtain resist pattern profiles.

These resist patterns were evaluated for defocus latitude depended on line pitch and for sensitivity by the following methods. The results of these evaluations are shown in Table 5.

Defocus Latitude Depended on Line Pitch

In each of a line-and-space pattern (a pattern having densely disposed lines) and an isolated-line pattern (a pattern having thinly disposed lines) each having a line width of 0.22 μm, the focus latitude overlap range having a tolerance of 0.22 μm±10% was determined. The larger the range, the better the defocus latitude depended on line pitch.

Sensitivity

The exposure amount necessary for reproducing a pattern having a line width of 0.22 μm was measured, and the sensitivity was evaluated in terms of relative value, with the sensitivity value for Example 29 being 1.

As apparent from the results given in Table 5, the positive resist compositions according to the present invention were on a satisfactory level with respect to each of the performances. Furthermore, the patterns formed in the evaluation of defocus latitude depended on line pitch were examined with a scanning electron microscope for a development residue. As a result, each of the patterns formed from the positive resist compositions of the present invention did not have a development residue at all, whereas a development residue was observed on the pattern formed from the composition of the Comparative Example. Namely, the resist compositions of the invention were suitable for use in lithography using far ultraviolet rays including ArF excimer laser light.

As demonstrated above, the present invention can provide a positive photoresist composition excellent in defocus latitude depended on line pitch and in sensitivity and free from the generation of a development residue.

The present invention will be further explained below in more detail by reference to Examples, but the invention should not be construed as being limited thereto.

Synthesis of Resin (1)

Into a vessel were introduced 2-butyl-2-adamantyl methacrylate and mevalonolactone methacrylate in a ratio of 45/55. The monomer mixture was dissolved in tetrahydrofuran to prepare 100 mL of a solution having a solid concentration of 20%. To this solution were added V-65, manufactured by Wako Pure Chemical Industries, Ltd., and mercaptoethanol in amounts of 2 mol % and 4 mol %, respectively. In a nitrogen atmosphere, this mixture was added dropwise over 2 hours to 10 mL of tetrahydrofuran heated at 60° C. After completion of the addition, the reaction mixture was heated with stirring for 6 hours. After completion of the reaction, the reaction mixture was cooled to room temperature and then poured into 3 L of methanol to conduct crystallization. The white particles thus precipitated were recovered.

$^{13}C$ NMR spectrometry revealed that this resin (1) thus obtained had a proportion among monomer units of 46/54. The polymer had a weight-average molecular weight, as measured by GPC and calculated for standard polystyrene, of 9,800.

Other resins were synthesized likewise.

Syntheses of Resins (2) to (7)

Resins (2) to (7) which each had the structure shown below and had the monomer unit molar proportions and weight-average molecular weight shown in Table 6 given below were synthesized by conducting the same procedure as in the synthesis of resin (1)

TABLE 6

| Resin | Alicyclic monomer (mol %) | Acid-decomposable monomer (mol %) | Carboxylic acid monomer (mol %) | Molecular weight |
|---|---|---|---|---|
| (2) | 45 | 43 | 12 | 10300 |
| (3) | 43 | 42 | 15 | 9600 |
| (4) | 43 | 43 | 14 | 11200 |
| (5) | 44 | 44 | 12 | 10700 |
| (6) | 45 | 55 |  | 8900 |
| (7) | 42 | 44 | 14 | 10400 |

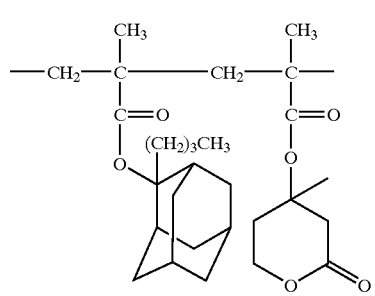

(1)

-continued (2)
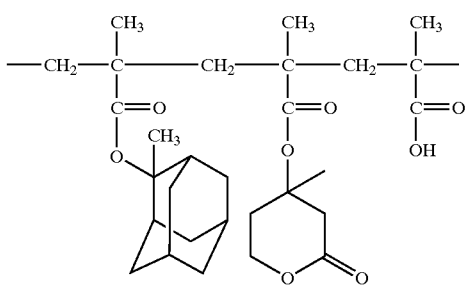

(3)
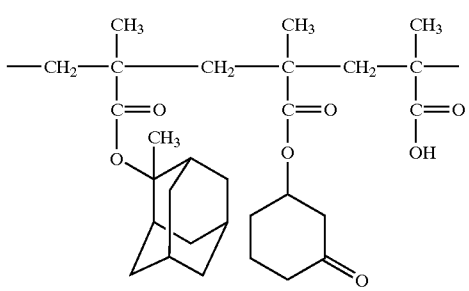

(4)
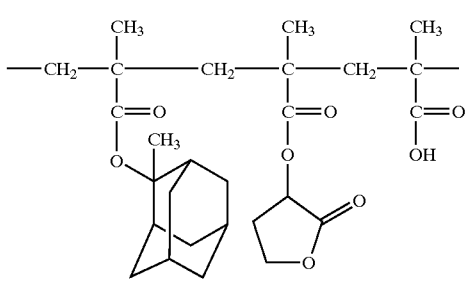

(5)
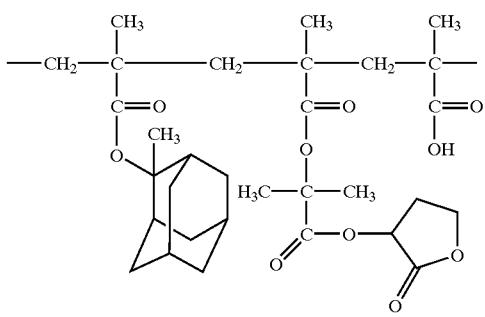

(6)
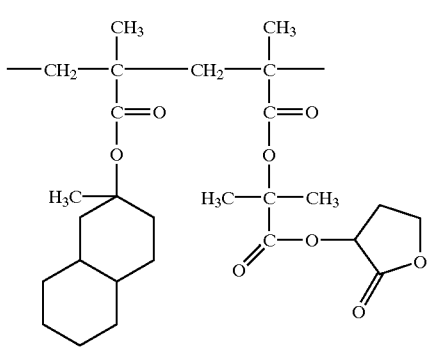

-continued (7)
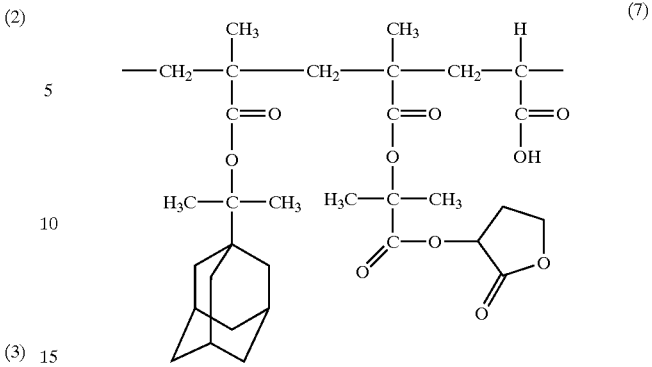

Syntheses of Sulfonic-acid-generating Compounds

Compound (1-1)

In tetrahydrofuran was dissolved 32 g of t-butyl acetoacetate. This solution was cooled to 0° C. in a nitrogen stream. Subsequently, 1.2 equivalents of sodium hydride was added thereto and 40 g of methyl iodide was further added dropwise. After completion of the addition, the reaction mixture was warmed to room temperature and then stirred for 3 hours. After completion of the reaction, the resultant reaction mixture was poured into distilled water and extracted with ethyl acetate. The ethyl acetate layer containing the desired reaction product was concentrated.

The compound obtained above was mixed in an amount of 17 g with 13 g of 37% aqueous formaldehyde solution and 6 mL of dioxane, and this mixture was stirred. Thereto was gradually added 7 g of potassium carbonate while keeping the reaction temperature at 10 to 20° C. After completion of the potassium carbonate addition, the reaction mixture was stirred for 8 hours while maintaining the reaction temperature. After completion of the reaction, an aqueous solution of sodium bicarbonate was added dropwise to the reaction mixture. A mixture containing the desired reaction product was extracted with ethyl acetate and the mixture obtained was purified by silica gel column chromatography to recover 20 g of the desired reaction product (methylol compound).

Finally, 8 g of 2-naphthalenesulfonyl chloride and 6 g of the methylol compound obtained above were dissolved in THF. In a nitrogen stream, the solution was cooled to 0° C. and 5 g of pyridine was added dropwise thereto. After completion of the addition, the reaction mixture was warmed to room temperature and then stirred for 10 hours. After completion of the reaction, the reaction mixture was neutralized and extracted with ethyl acetate/water. The reaction product contained in the resultant organic layer was purified by silica gel column chromatography to obtain 8 g of compound (1-1) as the target compound.

Compound (1-6)

The same procedure as the above was conducted, except that pentafluorobenzenesulfonyl chloride was used in place of naphthalenesulfonyl chloride. Thus, compound (1-6) was synthesized.

Compound (2-3)

Ethyl acetoacetate was converted to a cyclic ketal with ethylene glycol in an ordinary way. The ketal was reduced with lithium hydride to obtain the ketal of acetoethanol. This ketal and camphorsulfonyl chloride were dissolved in THF. In a nitrogen stream, the solution was cooled to 0° C. and an excess of pyridine was added dropwise thereto. After completion of the addition, the reaction mixture was warmed to room temperature and then stirred for 10 hours. After completion of the reaction, the reaction mixture was neutralized and extracted with ethyl acetate/water. The reaction product contained in the resultant organic layer was purified by silica gel column chromatography to obtain compound (2-3) as the target compound.

Compound (3-2)

Phenylcyclohexene was oxidized in the presence of osmium oxide to synthesize a cis-diol, which was dissolved in THF together with 2-naphthalenesulfonyl chloride. In a nitrogen stream, the solution was cooled to 0° C. and an excess of pyridine was added dropwise thereto. After completion of the addition, the reaction mixture was warmed to room temperature and then stirred for 10 hours. After completion of the reaction, the reaction mixture was neutralized and extracted with ethyl acetate/water. The reaction product contained in the resultant organic layer was purified by silica gel column chromatography to obtain compound (3-2) as the target compound.

Compound (4-1)

Dimedone and 1.2 equivalents of naphthalenesulfonyl chloride pyridine were dissolved in acetonitrile. In a nitrogen stream, the solution was cooled to 0° C. and 2 equivalents of pyridine was added dropwise thereto. After completion of the addition, the reaction mixture was warmed to room temperature and then stirred for 8 hours. After completion of the reaction, the reaction mixture was neutralized and extracted with ethyl acetate/water. The reaction product contained in the resultant organic layer was purified by silica gel column chromatography to obtain compound (4-1) as the target compound.

Compound (4-3)

The same procedure as in the synthesis of compound (4-1) was conducted, except that Meldrum's acid was used in place of dimedone. Thus, compound (4-3) was synthesized.

Compound (5-2)

Compound (5-2) was synthesized according to the method described in *Journal of Photopolymer Science and Technologies*, Vol.11, No.3 (1998) pp.505–6.

To 1.4 g of each of the resins shown in Table 7 synthesized in Synthesis Examples given above were added 0.18 g of a photo-acid generator, 10 mg of 1,5-diazabicyclo[4.3.0]-5-nonene (DBN), a surfactant shown in Table 7 (in an amount of 1 wt % based on all solid components of the composition), and a sulfonic-acid-generating compound shown in Table 7 (in an amount of 2 wt % based on all solid components of the composition). Each mixture was dissolved in propylene glycol monoethyl ether acetate in a solid concentration of 14 wt %. These solutions were filtered through a 0.1-μm microfilter to prepare positive photoresist composition solutions of Examples 45 to 54.

In Table 7, PAG-1 represents triphenylsulfonium triflate, PAG-2 represents (PAG 4-35) synthesized above, and resin R3 is a resin having the following structure.

Resin R3

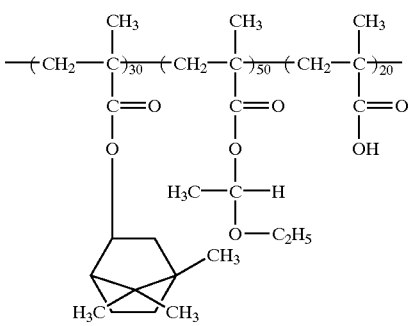

Mw: 11200

Furthermore, the surfactants used are as follows. W-1: Megafac F176 (fluorine; manufactured by Dainippon Ink & Chemicals, Inc.)
W-2: Megafac R08 (fluorinated silicon; manufactured by Dainippon Ink & Chemicals, Inc.)
W-3: Polysiloxane polymer KP-341 (manufactured by Shin-Etsu Chemical Co., Ltd.)
W-4: Polyoxyethylene nonylphenyl ether Evaluation Tests Each of the positive photoresist composition solutions obtained was applied to a silicon wafer with a spin coater and dried at 120° C. for 90 seconds to form a positive photoresist film having a thickness of about 0.5 μm. The resist film was exposed to ArF excimer laser light (193 nm). After the exposure, each resist film was heated at 120° C. for 90 seconds, subsequently developed with a 2.38% aqueous solution of tetramethylammonium hydroxide, and then rinsed with distilled water to obtain resist pattern profiles.

Number of Development Defects

Each resist film having a thickness of 0.5 μm deposited on a 6-inch bare silicon substrate was dried with a vacuum suction type hot plate at 120° C. for 60 seconds. This dried resist film was exposed through a test mask bearing a 0.35 μm contact hole pattern (hole/duty ratio=1/3) by means of Nikon Stepper NSR-1505EX, and then heated at 120° C. for 90 seconds. Subsequently, the exposed resist film was subjected to 60-second puddle development with a 2.38% aqueous TMAH (tetramethylammonium hydroxide) solution, rinsed with pure water for 30 seconds, and then dried with a spin dryer. Each sample thus obtained was examined with KLA-2112, manufactured by KLA Tencol K. K., to count the number of development defects. The primary data obtained are taken as the number of development defects.

Generation of Development Residue (Scum)

Resist patterns having a line width of 0.22 μm were evaluated for a development residue. The patterns on which no residue was observed are indicated by "A", while those on which a residue was observed in a considerable amount are indicated by "B".

Line Width Reproducibility

Line width reproducibility (line width variation) is expressed in terms of the variation from a target line width which was determined in the following manner. A resist pattern profile was repeatedly formed five times by the above method, with the target line width being 0.20 μm. The line width of each of these profiles was measured with a scanning electron microscope. The line width variation for each profile was calculated from the found line width value thereof, and the total of the five line width variations thus obtained was taken as the line width reproducibility.

Line width variation=|(found line width value)−(target line width)|×100/(target line width)

The results of the above evaluations are shown in Table

TABLE 7

| | Acid-decom-posable resin | Pho-to-acid gen-er-ator | Sulfonic-acid-gener-ating compound | Sur-fac-tant | Number of de-velop-ment defects | Scum | Line width varia-tion (%) |
|---|---|---|---|---|---|---|---|
| Example 45 | (1) | 1 | (1-1) | — | 40 | A | 40 |
| Example 46 | (2) | 2 | (2-3) | — | 40 | A | 35 |
| Example 47 | (3) | 1 | (3-2) | — | 40 | A | 40 |
| Example 48 | (4) | 2 | (4-1) | — | 15 | A | 20 |
| Example 49 | (2) | 2 | (2-3) | W-4 | 40 | A | 25 |
| Example 50 | (5) | 1 | (5-2) | W-1 | 40 | A | 15 |
| Example 51 | (6) | 1 | (1-6) | W-2 | 30 | A | 15 |
| Example 52 | (7) | 1 | (4-3) | W-3 | 10 | A | 5 |
| Example 53 | (4) | 1 | (4-1) | W-1 | 10 | A | 5 |
| Example 54 | (1) | 1 | (1-1) | W-3 | 30 | A | 15 |
| Compara-tive Example 3 | R3 | 1 | (3-2) | — | 15000 | B | 120 |

As apparent from the results given in Table 7, the resist composition of the Comparative Example was insufficient in the number of development defects and scum generation. In contrast, the positive photoresist compositions according to the present invention were on a satisfactory level with respect to the prevention of development defect occurrence and scum generation. Namely, the resist compositions of the invention were suitable for use in lithography using far ultraviolet rays including ArF excimer laser light. Furthermore, the resist compositions of the invention which contained a specific surfactant were excellent not only in freedom from development defects but in line width reproducibility.

As demonstrated above, the present invention can provide a positive photoresist composition which is sufficiently suitable for exposure to light having a wavelength especially in the range of from 170 to 220 nm, is effective in preventing the occurrence of development defects or the generation of a scum and capable of giving a satisfactory resist pattern profile, and has excellent line width reproducibility.

While the invention has been described in detail and with reference to specific embodiments thereof, it will be apparent to one skilled in the art that various changes and modifications can be made therein without departing from the spirit and scope thereof.

What is claimed is:

1. A positive photoresist composition for far ultraviolet exposure which comprises (1) a compound which generates an acid upon irradiation with actinic rays or a radiation, (2) a resin which contains alkali-soluble groups protected by partial structures containing an alicyclic hydrocarbon and represented by at least one of the following general formulae (pI) to (pVI) and which decomposes by the action of an acid to have enhanced solubility in an alkali, and (3) a compound which decomposes by the action of an acid to generate a sulfonic acid:

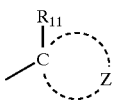

(pI)

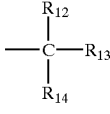

(pII)

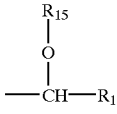

(pIII)

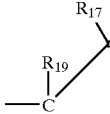

(pIV)

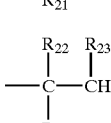

(pV)

(pVI)

wherein $R_{11}$ represents a methyl, ethyl, n-propyl, isopropyl, n-butyl, isobutyl, or sec-butyl group; Z represents a group of atoms necessary for forming an alicyclic hydrocarbon group in cooperation with the carbon atom;

$R_{12}$ to $R_{16}$ each independently represents a linear or branched alkyl group having 1 to 4 carbon atoms or an alicyclic hydrocarbon group, provided that at least one of $R_{12}$ to $R_{14}$ or either of $R_{15}$ and $R_{16}$ represents an alicyclic hydrocarbon group;

$R_{17}$ to $R_{21}$ each independently represents a hydrogen atom, a linear or branched alkyl group having 1 to 4 carbon atoms, or an alicyclic hydrocarbon group, provided that at least one of $R_{17}$ to $R_{21}$ represents an alicyclic hydrocarbon group and either of $R_{19}$ and $R_{21}$ represents a linear or branched alkyl group having 1 to 4 carbon atoms or an alicyclic hydrocarbon group; and $R_{22}$ to $R_{25}$ each independently represents a linear or branched alkyl group having 1 to 4 carbon atoms or an alicyclic hydrocarbon group, provided that at least one of $R_{22}$ to $R_{25}$ represents an alicyclic hydrocarbon group.

2. The positive photoresist composition for far ultraviolet exposure of claim 1, which contains a fluorine and/or silicon surfactant.

3. The positive photoresist composition for far ultraviolet exposure of claim 1, wherein repeating units containing an alkali-soluble group protected by partial structure containing an alicyclic hydrocarbon and represented by at least one of formulae (pI) to (pVI) are those represented by formula (pA):

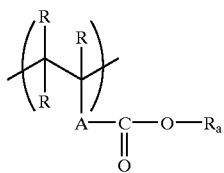
(pA)

wherein R's may be the same or different and each represents a hydrogen atom, a halogen atom, or an optionally substituted, linear or branched alkyl group having 1 to 4 carbon atoms; A represents one member or a combination of two or more members selected from the group consisting of a single bond, an alkylene group, a substituted alkylene group, an ether group, a thioether group, a carbonyl group, an ester group, an amide group, a sulfonamide group, a urethane group, and a urea group; and $R_a$ represents a group represented by any of general formulae (pI) to (pVI).

4. The positive photoresist composition for far ultraviolet exposure of claim 1, wherein the compound which decomposes by the action of an acid to generate a sulfonic acid is represented by any one of formulae (1) to (5):

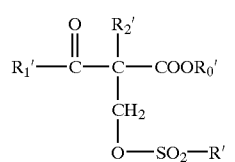
(1)

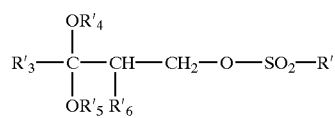
(2)

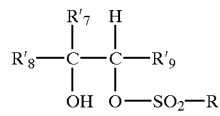
(3)

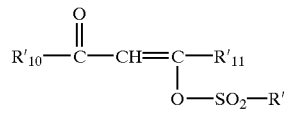
(4)

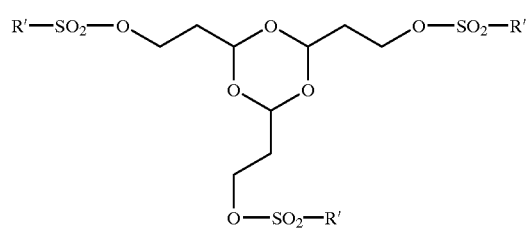
(5)

wherein

R' represents an alkyl group, a cycloalkyl group, an aryl group, or an aralkyl group;

$R'_0$ represents such a group that —$COOR_0$ is a group which decomposes by the action of an acid;

$R'_1$ represents an alkyl group, a cycloalkyl group, an aryl group, an aralkyl group, an alkoxy group, or an aryloxy group;

$R'_2$ represents an alkyl group or an aralkyl group;

$R'_3$ represents an alkyl group, a cycloalkyl group, an aryl group, or an aralkyl group;

$R'_4$ and $R'_5$ each independently represents an alkyl group, provided that they may be bonded to each other to form a ring;

$R'_6$ represents a hydrogen atom or an alkyl group;

$R'_7$ represents a hydrogen atom, an alkyl group, a cycloalkyl group, an aryl group , or aralkyl group;

$R'_8$ represents an alkyl group, a cycloalkyl group, an aryl group, or an aralkyl group;

$R'_9$ represent a hydrogen atom, an alkyl group, a cycloalkyl group, an aryl group, or an aralkyl group, provided that $R'_9$ may be bonded to $R'_7$ to form a ring;

$R'_{10}$ represents an alkyl group, a cycloalkyl group, an alkoxy group, an aryl group, an aralkyl group, an aryloxy group, or an alkenyloxy group; and $R'_{11}$ represents an alkyl group, a cycloalkyl group, an alkoxy group, an aryl group, an aralkyl group, an aryloxy group, or an alkenyl group, provided that $R'_{10}$ and $R'_{11}$ may be bonded to each other to form a ring.

5. The positive photoresist composition as in claim 1, wherein the sulfonic-acid-generating compound is represented by formula (4):

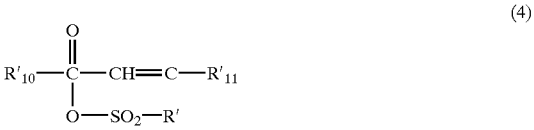
(4)

wherein R' represents a group selected from the group consisting of an alkyl group, a cycloalkyl group, an aryl group and an aralkyl group; $R'_{10}$ represents a group selected from the group consisting of an alkyl group, a cycloalkyl group, an alkoxy group, an aryl group, an aralkyl group, an aryloxy group and an alkenyloxy group; and $R'_{11}$ represents a group selected from the group consisting of an alkyl group, a cycloalkyl group, an alkoxy group, an aryl group, an aralkyl group, an aryloxy group and an alkenyl group, provided that $R'_{10}$ and $R'_{11}$ may be bonded to each other to form ring.

* * * * *